(12) United States Patent
Maki et al.

(10) Patent No.: US 7,457,182 B2
(45) Date of Patent: Nov. 25, 2008

(54) SEMICONDUCTOR MEMORY INCLUDING SELF-TIMING CIRCUIT

(75) Inventors: Yasuhiko Maki, Sagamihara (JP); Toshiyuki Uetake, Inagi (JP)

(73) Assignee: Fujitsu Limited, Kawasaki (JP)

( * ) Notice: Subject to any disclaimer, the term of this patent is extended or adjusted under 35 U.S.C. 154(b) by 204 days.

(21) Appl. No.: 11/438,447

(22) Filed: May 23, 2006

(65) Prior Publication Data

US 2006/0239094 A1 Oct. 26, 2006

Related U.S. Application Data

(63) Continuation of application No. PCT/JP03/15318, filed on Nov. 28, 2003.

(51) Int. Cl.
*G11C 7/02* (2006.01)
(52) U.S. Cl. .................. 365/210.1; 365/233.1
(58) Field of Classification Search ............. 365/210.1, 365/233.1, 194, 196
See application file for complete search history.

(56) References Cited

U.S. PATENT DOCUMENTS

| 5,596,539 | A | * | 1/1997 | Passow et al. ............ 365/210.1 |
| 5,999,482 | A | * | 12/1999 | Kornachuk et al. ....... 365/233.1 |
| 6,181,626 | B1 | * | 1/2001 | Brown ..................... 365/210.1 |
| 6,201,757 | B1 | * | 3/2001 | Ward et al. ............. 365/230.05 |
| 6,646,938 | B2 | | 11/2003 | Kodama |
| 6,690,608 | B2 | | 2/2004 | Nii et al. |
| 2003/0021144 | A1 | | 1/2003 | Kodama |
| 2003/0202412 | A1 | | 10/2003 | Nii et al. |

FOREIGN PATENT DOCUMENTS

| JP | 2003-36678 A | 2/2003 |
| JP | 2003-100083 A | 4/2003 |
| JP | 2003-323792 A | 11/2003 |

* cited by examiner

*Primary Examiner*—Vu A Le
(74) *Attorney, Agent, or Firm*—Arent Fox LLP

(57) ABSTRACT

A semiconductor memory including a sense amplifier circuit for reading the data stored in memory cells and particularly to a semiconductor memory including a self-timing circuit for improving margin for reading data by controlling activation timing of the sense amplifier drive signal in accordance with characteristics of internal memory cells.

32 Claims, 31 Drawing Sheets

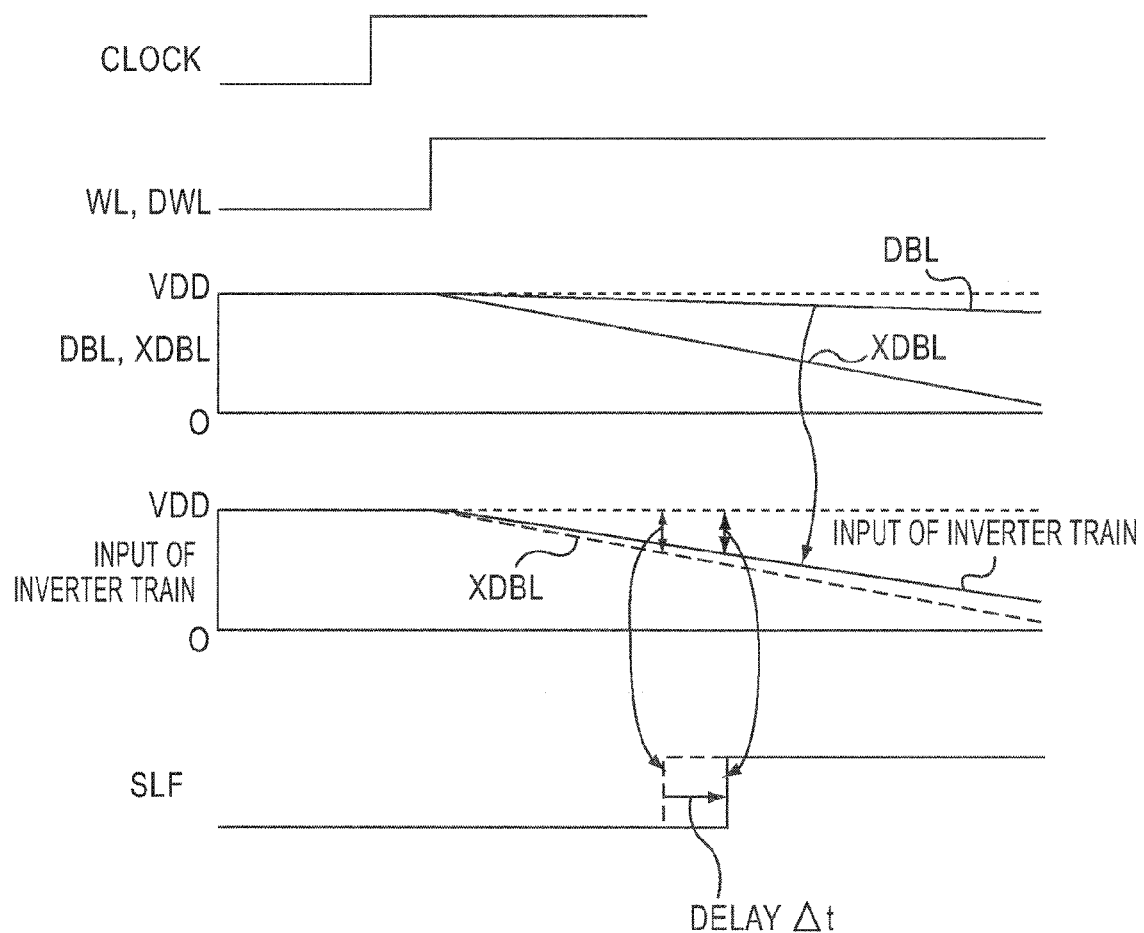

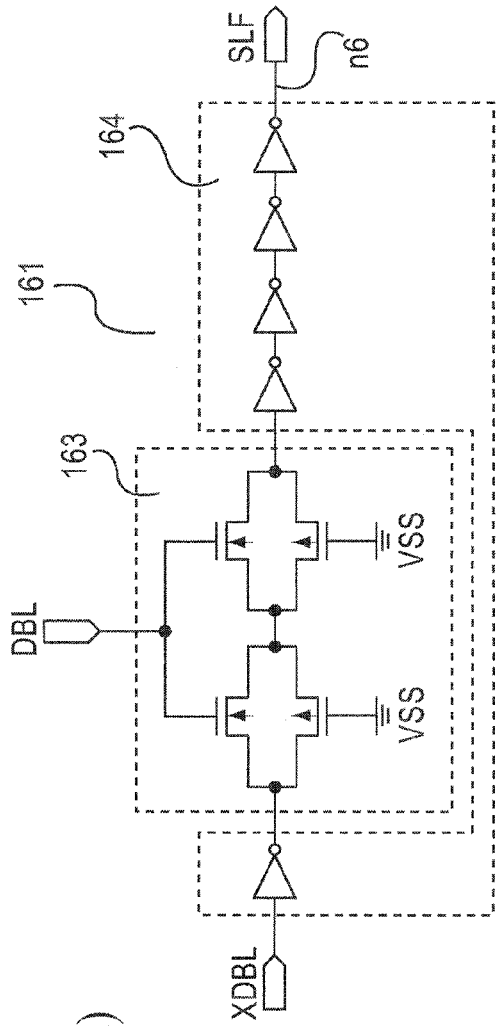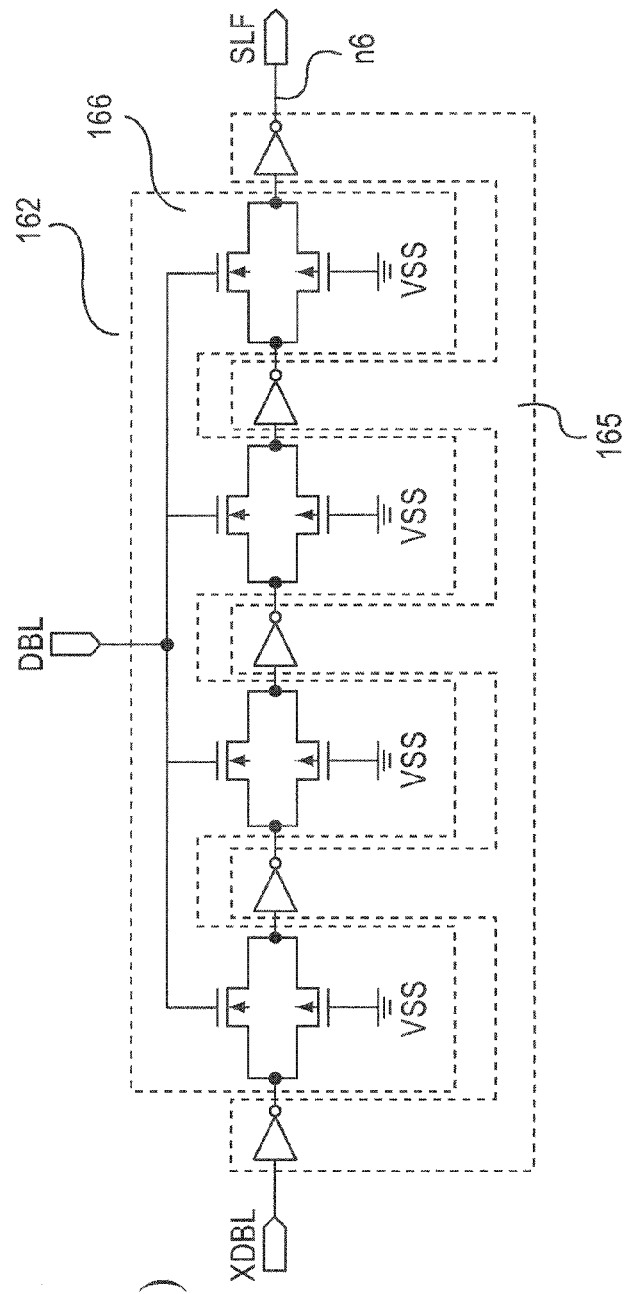
FIG.17(a)
FIG.17(b)

SEMICONDUCTOR MEMORY INCLUDING SELF-TIMING CIRCUIT

CROSS-REFERENCE TO RELATED APPLICATION

This nonprovisional application is a continuation application of and claims the benefit of International Application Number PCT/JP2003/015318, filed Nov. 28, 2003. The disclosure of the prior application is hereby incorporated herein in its entirety by reference.

TECHNICAL FIELD

The present invention relates to a semiconductor memory including a sense amplifier circuit for reading the date stored in memory cells and particularly to a semiconductor memory including a self-timing circuit for improving margin for reading data by controlling activation timing of the sense amplifier drive signal in accordance with characteristics of internal memory cells.

BACKGROUND OF THE INVENTION

In general, a static RAM (Static RAM, hereinafter referred to as SRAM) has a memory cell array wherein memory cells cross-connecting a pair of inverters is arranged in the form of a matrix. In each memory cell, the mutual connecting points of inverter pair are connected with bit line pair via a pair of transfer transistors and the gates of transfer transistor pair are connected with the word lines. The bit line is connected with sense amplifier circuits.

In the read operation of SRAM, the clock signal and address signal are supplied first from an external circuit and the corresponding word line is selected by decoding the address signal in synchronization with the clock signal. When the word line is selected, the corresponding transfer transistor pair is turned ON and thereby the inverter pair of the corresponding memory cells is connected with the bit line pair. The bit line pair is driven with the data stored in the inverter pair of memory cells. A potential difference of driven bit line pair is amplified with a sense amplifier circuit responding to the sense amplifier drive signal and thereby the stored data of memory cells are read out. As a sense amplifier drive signal generating circuit for driving the sense amplifier circuit in the read operation explained above, a generating circuit using the self-timing circuit has been known (for example, refer to the patent document 1).

FIG. 1 is a schematic diagram of a circuit configuration of SRAM provided with the self-timing circuit of the related art.

The existing self-timing circuit 11 comprises at least one dummy memory cell SDMC for self-timing, a dummy word line DWL for selecting dummy memory cells, dummy line pair DBL, XDBL for detecting the data stored in the dummy memory cell, and a timing control circuit 12 for generating the self-timing signal SLF on the basis of the potentials of dummy bit line pair DBL, XDBL. The dummy memory cell SDMC for self-timing includes, like the ordinary memory cell MC in the memory cell array, inverter pair and transfer gate pair.

Moreover, the dummy memory cell SDMC for self-timing is sequentially arranged from the position furthest from the timing control circuit 12 on the dummy bit line pair DBL, XDBL. In view of setting a load resulting from wiring capacitance of the dummy word line DWL and dummy bit line pair DBL, XDBL equal to that of the word line WL and bit line pair BL, XBL within the memory cell array MCA, a plurality of dummy memory cells for load LDMCs are provided respectively to the dummy word line DWL and dummy bit line pair DBL, XDBL.

Operations of the existing self-timing circuit 11 will be explained with reference to FIG. 2. As illustrated in FIG. 2, the dummy word line DWL is selected in synchronization with selection of the predetermined word line WL within the memory cell array MCA. Selection of the dummy word line DWL causes the transfer gate pair of the dummy memory cell SDMC for self-timing to turn ON, and the inverter pair of the dummy memory cell SDMC for self-timing is connected with the dummy bit line pair DBL, XDBL. Thereby, dummy bit line pair DBL, XDBL driven by above process generates the predetermined potential difference.

The timing control circuit 12 detects a potential of any one of the dummy bit line pair DBL, XDBL (XDBL in the figure) and activates the self-timing signal SLF when the potential of the dummy bit line (XDBL) as the detection object becomes smaller than the predetermined value. The self-timing signal SLF is supplied to a control circuit 13 and is then delayed for the specified time with a delay circuit 14 provided within the control circuit 13. The control circuit 13 supplies an output signal of the delay circuit 14 to a sense amplifier circuit 14 as the sense amplifier drive signal SA. The sense amplifier circuit 14 amplifies, responding to the sense amplifier drive signal SA supplied, a potential difference of the selected bit line pair BL, XBL usually driven with the memory cell MC in order to read the data stored.

In this timing, driving capability for the dummy bit line pair DBL, XDBL is adjusted through load adjustment of the dummy memory cell for load LDMC and amount of delay with the delay circuit 14 is also adjusted, in view of adjusting the activation timing of the sense amplifier drive signal SA to the optimum timing.

Here, even if the driving capability of ordinary memory cell MC within the memory cell array MCA is fluctuated due to fluctuation in manufacture, driving capability of the dummy memory cell SDMC is also fluctuated because the manufacturing process is identical. Namely, when driving capability of the ordinary memory cell MC is fluctuated in the direction to become fast, driving capability of the dummy memory cell SDMC also fluctuates in the direction to become fast. In the sense amplifier drive signal generating circuit utilizing the self-timing circuit 11 of FIG. 1, the activation timing of the sense amplifier drive signal SA is determined on the basis of the potential of the dummy bit line pair DBL, XDBL driven with the dummy memory cell SDMC. Accordingly, the activation timing of the sense amplifier drive signal SA can be adjusted automatically to the optimum timing in accordance with fluctuation in manufacture of the driving capability of the ordinary memory cell MC.

Meanwhile, a gate potential is set to always turn off the transfer transistor pair in the dummy memory cell for load LDMC connected to the dummy bit line pair DBL, XDBL. Therefore, the dummy memory cell for load LDMC only adds primarily the wiring capacitance similar to that of the memory array MCA to the dummy bit line pair DBL, XDBL and does not drive the dummy bit line pair DBL, XDBL.

However, in recent years, a semiconductor integrated circuit is more and more developed in its fine structure and therefore it is impossible to neglect a leak current $I_{leak}$ under the condition that the transfer transistor in the memory cell is turned off. Therefore, the dummy bit line pair DBL, XDBL of the dummy memory cell for load LDMC is driven with the off leak current $I_{leak}$ in the actual SRAM.

When the dummy bit line (XDBL) as the detection object of the timing control circuit 12 is driven with the off leak currents $I_{leak}$ not only of the dummy memory cell for self-timing SDMC but also of the dummy memory cell for load LDMC, lowering rate of the potential of the dummy bit line (XDBL) as the detection object becomes fast as much as the drive with the off leak current $I_{leak}$. Thereby, activation timing of the self-timing signal SLF becomes faster than the primarily timing. Accordingly, the sense amplifier drive signal SA is also activated faster than the primary timing corresponding to above event. As a result, the data stored in the ordinary memory cell MC is likely read erroneously in the sense amplifier circuit 14.

On the other hand, the dummy bit line of the dummy bit line pair DBL, XDBL which is lowered in the direction to L level with the off leak current $I_{leak}$ in the dummy memory cell for load LDMC is determined depending on the data stored in the dummy memory cell for load LDMC. The data stored in the dummy memory cell for lad LDMC is determined freely when the power of SRAM is turned on when the connecting node of the inverter pair is in the floating state and is not identified, unlike the dummy memory cell for self-timing SDMC.

Here, the technology is known (for example, refer to the patent document 1), in which the stored data of dummy memory cell for self-timing SDMC and the dummy memory cell for load LDMC connected to the dummy bit line pair DBL, XDBL are set to become the data inverted with each other in the self-timing circuit 11, in order to minimize, considering the process explained above, influence of drive with the off leak current $I_{leak}$ of the dummy memory cell for load LDMC to the dummy bit line (XDBL) as the detection object of the timing control circuit 12.

FIG. 3 illustrates an example of the setting pattern of the stored data of dummy memory cell for self-timing SDMC and dummy memory cell for load LDMC connected to the dummy bit line pair DBL, XDBL. As illustrated in FIG. 3, potentials of the connecting nodes n1, n2 of the inverter pair INV1, INV2 are set, on the contrary, in the fixed patterns with each other between the dummy memory cell for self-timing SDMC and dummy memory cell for load LDMC.

In the configuration explained above, a potential of the dummy bit line XDBL is lowered to the L level only with the dummy memory cell for self-timing SDMC and meanwhile the dummy bit line DBL is driven with the off leak current of all dummy memory cells for load LDMC. Since the self-timing signal SLF is generated on the basis of the potential of the dummy bit line XDBL, it can be prevented that the activation timing of the sense amplifier drive signal SLF becomes faster than the primary timing due to the influence of drive with the off leak current $I_{leak}$.

However, the self-timing circuit 11 illustrated in FIG. 3 also originates a problem, when the SRAM is placed in the higher temperature due to change in ambient temperature, that the off leak current $I_{leak}$ increases and thereby erroneous read likely occurs in the sense amplifier circuit 14.

FIG. 4 is a diagram for explaining the problem explained above. It is considered here that the data stored in the non-selected memory cell in the bit line pair BL, XBL connected to the selected memory cell is completely inverted from the data stored in the selected memory cell in the memory cell MCA.

As illustrated in FIG. 4, when the off leak current $I_{leak}$ increases, one bit line (BL, in the figure) is lowered to a large extent in the direction of L level with the inverter pair of the selected memory cell and the other bit line (XBL, in the figure) is also lowered in the direction of L level with the off lead current $I_{leak}$ of the non-selected memory cell. Accordingly, potential of the bit line XBL is reduced as the time passes. Accordingly, in the case explained above, the timing wherein a potential difference of the bit line pair BL, XBL becomes equal to the predetermined potential difference is delayed most.

On the other hand, in the self-timing circuit 11 illustrated in FIG. 3, the self-timing signal SLF is activated when only the potential of dummy bit line XDBL is detected after the stored data of the dummy memory cells SDMC, LDMC are set to minimize influence of drive with the off leak current $I_{leak}$ for the dummy bit line XBL as the detection object. Therefore, the activation timing of the self-timing signal SLF is not almost influenced by amplitude of the off leak current $I_{leak}$. Namely, the sense amplifier drive signal SA is activated in almost in the same timing without relation to the off leak current $I_{leak}$.

Therefore, when the off leak current $I_{leak}$ increases, the activation timing of the sense amplifier drive signal SA becomes faster than the timing where the predetermined potential difference is generated in the bit line pair BL, XBL and thereby erroneous read of stored data is likely generated. Therefore, a first object of the present invention is to provide a semiconductor memory which can prevent erroneous read of the stored data of the ordinary memory cell MC even when the off leak current $I_{leak}$ increases.

Moreover, FIG. 5 illustrates an example of layout of the dummy memory cells SDMC, LDMC in the self-timing circuit of the related art of FIG. 1. As illustrated in FIG. 5, the dummy memory cell of the related art is formed in the layout including a unit of the part formed of the inverter pair and transfer transistor pair.

The dummy memory cell of the related art is formed in the layout that the ordinary layout unit 51 formed of the inverters 53, 54 and transfer transistor pair 57 and the symmetrical layout unit 52 formed of the inverters 55, 56 and transfer transistor pair 58 related in the point symmetry or line symmetry to above ordinary layout unit 51 are alternately allocated along the dummy bit line pair DBL, XDBL.

As the dummy memory cell for self-timing SDMC, a plurality of dummy memory cells, for example, are sequentially designated from the furthest position of the timing control circuit 12 on the dummy bit line. In FIG. 5, the gates of the transfer transistor pair 57, 58 of the dummy memory cell for self-timing SDMC1, 2 are connected to the common dummy word, line DWL not illustrated and the gates of the transfer transistor pair of the dummy memory cells for lead LDMC1, 2 are connected to the ground VSS.

In FIG. 5, the write region indicates impurity diffusing layer on a semiconductor wafer and the hatched region indicates gate polysilicon layer formed on the semiconductor wafer. The broken line indicates a local wiring within the memory cell and a thick line indicates a dummy bit line pair DBL, XDBL. A circular mark indicates a contact with the dummy bit line. Moreover, as is understood from FIG. 5, layouts of two inverters forming an inverter pair are not in the line-symmetrical relationship.

Here, an example of layout of the dummy memory cell of FIG. 5 includes a problem that erroneous read of the data stored in the memory cell MC is likely generated when positional displacement is generated between the impurity diffusing layer and gate polysilicon layer in the photoetching process or the like in the manufacturing process.

As is illustrated in FIG. 6, the actual finished area includes the round area at the corners of the impurity diffusing layer and gate polysilicon layer. Therefore, if positional displacement occurs as explained above, for example when the gate polysilicon layer is deviated totally in the left lower direction (refer to FIG. 6) for the impurity diffusing layer, a certain difference is generated in the driving capability of each inverter forming an inverter pair in the ordinary layout unit 51 and symmetrical layout unit 52.

In more detail, inverter characteristics change as explained below due to the positional displacement in the left lower direction in the ordinary layout unit 51. Namely, in the inverter 54 located in the left side, channel length becomes short in the upper side transistor, while in the transistor located in the lower side, channel length becomes long, resulting in narrower channel width. However, in the inverter 53 located in the right side, channel length becomes long in the upper side transistor and channel width becomes wide in the lower side transistor.

On the other hand, in the symmetrical layout unit 52, inverter characteristics change as explained below due to the displacement in the left lower direction. Namely, in the inverter 56 located in the left side, channel width becomes narrow in the upper side transistor and channel length becomes short in the lower side transistor. Meanwhile, in the inverter 55 located in the right side, channel length becomes short in the upper side transistor and channel width becomes wide, while in the lower side transistor, channel length becomes long.

As explained above, driving capability is different with each other among the four inverters 53 to 56 forming the inverter pair of the ordinary layout unit 51 and symmetrical layout unit 52. As a result, a certain difference is generated in the driving capability, in accordance with the positional displacement, between the dummy memory cell SDMC1 including the ordinary layout unit 51 and the dummy memory cell SDMC2 including the symmetrical layout unit 52.

Corresponding to such difference, driving capability for the dummy bit line XDBL as the detection object of the timing control circuit 12 also changes in accordance with positional displacement. Accordingly, activation timing of the self-timing signal SLF changes in accordance with positional displacement and it likely becomes faster than the primary timing.

On the other hand, the memory cell MC in the memory cell array MCA has the layout similar to the layout example of the dummy memory cells SDMC, LDMC in FIG. 5 for each bit line pair BL, XBL. Therefore, when positional displacement occurs and the memory cell MC selected during the read operation includes the layout unit having smaller driving capability among the ordinary layout unit 51 and symmetrical layout unit 52, the timing for generating the predetermined potential difference in the bit line pair BL, XBL likely becomes slower than the primary timing.

Therefore, the activation timing of the sense amplifier drive signal SA becomes faster, in accordance with the positional displacement, than the timing for generating the predetermined potential difference in the bit line pair BL, XBL and thereby erroneous read of stored data is likely generated. Accordingly, the second object of the present invention is to provide a semiconductor memory to prevent erroneous read of the data stored in the ordinary memory cell MC even when the interlayer positional displacement occurs in the manufacturing processes.

As explained above, the principal object of the present invention is to provide a semiconductor memory which can surely prevent erroneous read of the data stored in the ordinary memory cell MC without relation to various factors for changing device characteristics such as temperature change and fluctuation in manufacturing processes.

(Patent document 1)
JP-A No. 2003-36678

DISCLOSURE OF THE INVENTION

According to the first aspect of the present invention to achieve the objects explained above, a semiconductor memory is characterized in comprising a memory cell array including a plurality of word lines, a plurality of bit lines, a plurality of memory cells allocated at the crossing positions of a plurality of word lines and a plurality of bit lines and a self-timing circuit allocated at the area near the memory cell array to generate the self-timing signal for determining operation timing of an internal circuit when data is read from the memory cell, wherein the self-timing circuit is characterized in further comprising a dummy word line selected responding to selection of the word line, a first dummy memory cell for self-timing connected to the dummy word line to be set to the first state in the stored data, a first dummy bit line including non-selected dummy memory cell for load set to the second state opposed to the first state in the stored data, a second dummy memory cell for self-timing connected to the dummy word line and set to the third state in the stored data, a second dummy bit line including the second dummy memory cell for load set to the non-selected state and to the fourth state identical to the third state in the stored data, and a timing control circuit for inputting the first dummy bit line and second dummy bit line and outputting the self-timing signal by delaying the same signal as much as the period corresponding to difference in the changing rate of the potentials of the first and second dummy bit lines.

Moreover, according to the second aspect of the present invention, a semiconductor memory is characterized in comprising a memory cell array including a plurality of word lines, a plurality of bit lines, and a plurality of memory cells allocated at the crossing positions of a plurality of word lines and a plurality of bit lines, and a self-timing circuit allocated at the area near the memory cell array to generate the self-timing signal for determining operation timing of an internal circuit when data is read from the memory cell, wherein the self-timing circuit is characterized in further comprising a dummy word line selected responding to selection of the word line, a first dummy memory cell for self-timing connected to the dummy word line and set to the first state in the stored data, a dummy bit line pair including the dummy memory cell for load set to non-selected state and set to the second state opposing to the first state in the stored data, and a timing control circuit for inputting the dummy bit line pair and outputting the self-timing signal on the basis of potential change of the other dummy bit line of the dummy bit line pair by delaying such self-timing signal as much as the period corresponding to potential of one dummy bit line of the dummy bit line pair.

According to the first and second aspects of the present invention, the semiconductor memory of the present invention is capable of preventing that activation timing of the sense amplifier drive signal SA becomes faster than the timing for generating the predetermined potential difference to the bit line pair BL, XBL of the ordinary memory cell MC and is also preventing erroneous read of the stored data, because the activation timing of the sense amplifier drive signal SA can be delayed as much as the period corresponding to amount of the off leak current $I_{leak}$ even when the off leak current $I_{leak}$ increases due to the reason such as change of ambient temperature or the like.

Moreover, according to the third aspect of the present invention, a semiconductor memory is characterized in comprising a memory cell array including a plurality of word lines, a plurality of bit lines, and a plurality of memory cells allocated at the crossing positions of a plurality of the word lines and a plurality of the bit lines and a self-timing circuit allocated at the area near the memory cell array to generate the self-timing signal for determining operation timing of an internal circuit when data is read from the memory cells, wherein the self-timing circuit is characterized in further comprising dummy word lines selected responding to selection of the word lines, the first dummy bit lines continuously allocating a plurality of first dummy cells for self-timing which are connected to the dummy word lines and usually formed of layout units, the second dummy bit lines continuously allocating a plurality of second dummy memory cells for self-timing which are connected to the dummy word lines and usually formed of symmetrical layout units in point symmetrical or line symmetrical relationship with the layout units, and a timing control circuit for inputting the first dummy bit lines and second dummy bit lines and outputting the self-timing signal on the basis of change in potential of the dummy bit lines showing slower changing rate of potential among the first and second dummy bit lines.

According to the third aspect of the present invention explained above, even if positional displacement occurs between impurity diffusing layer and polysilicon layer due to the reason such as fluctuation in manufacture in the semiconductor memory of the present invention, activation timing of the sense amplifier drive signal SA can be properly adjusted in accordance with the positional displacement. Therefore, erroneous read of stored data can be prevented by preventing that the activation timing of the sense amplifier drive signal SA becomes earlier than the timing of generation of the predetermined potential difference in the bit line pair BL, XBL of the ordinary memory cell MC.

Accordingly, the semiconductor memory of the present invention is capable of surely preventing erroneous read of the stored data of the ordinary memory cell MC, not depending on variation factors of various, device characteristics such as temperature change and fluctuation in manufacture.

BRIEF DESCRIPTION OF DRAWINGS

FIG. 16 is a diagram for explaining the timing control circuit of the fourth embodiment.

FIG. 17 is a diagram for explaining a fifth embodiment.

BEST MODE FOR EMBODYING THE INVENTION

The preferred embodiments of the present invention will be explained below with reference to the accompanying drawings. However, these embodiments do not restrict the technical scope of the present invention and the technical scope of the present invention relates to the scope of claims and the equivalent thereof.

Figure 6:
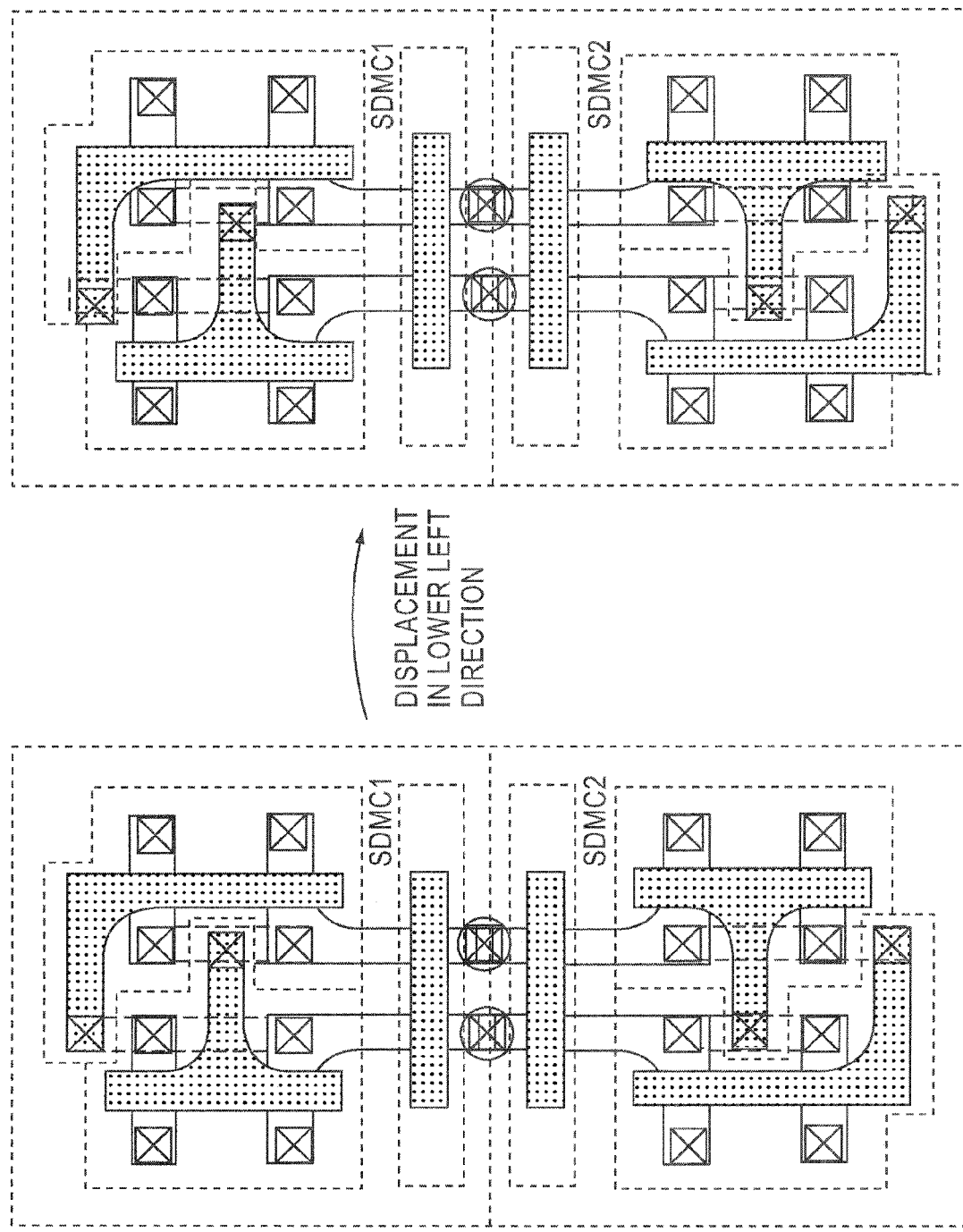
FIG. 6 is a diagram showing a layout in which the gate polysilicon layer is deviated as a whole in the lower left direction in the figure for the impurity diffusing layer in the existing layout example.
Figure 7:
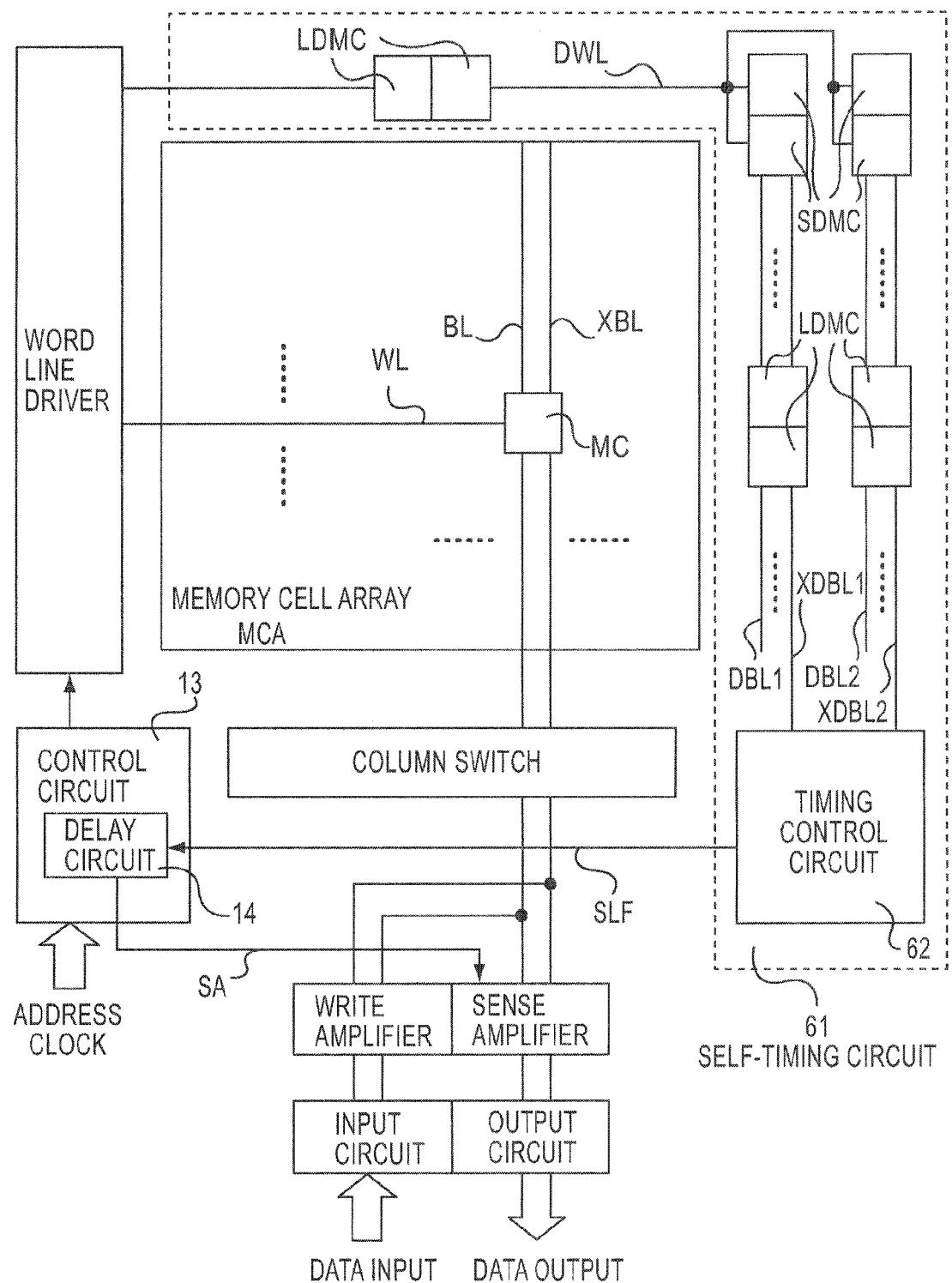
FIG. 7 is a schematic configuration diagram showing a first embodiment.

FIG. 7 is a schematic configuration diagram showing a first embodiment of the present invention. An SRAM illustrated in FIG. 7 includes a self-timing circuit as a sense amplifier drive signal generating circuit for driving a sense amplifier circuit. A circuit configuration of SRAM illustrated in FIG. 6 is different from the existing circuit configuration illustrated in FIG. 1 in the point that a self-timing circuit 11 is replaced with a self-timing circuit 61 and other configuration is identical.

The self-timing circuit 61 in FIG. 7 includes two pairs of dummy bit line pair DBL1, XDBL1 and DBL2, XDBL2. Each dummy bit pair includes, like the self-timing circuit 11 of FIG. 1, at least one dummy memory cell for self-timing SDMC and a plurality of dummy memory cells for load LDMC.

Patterns of data stored in the dummy memory cell for self-timing SDMC and the dummy memory cell for load LDMC are different with each other among the dummy bit line pairs DBL1, XDBL1 and DBL2 and XDBL2. In each dummy bit line pair, a plurality of dummy memory cells are sequentially designated, for example, as the dummy memory cells SDMC for self-timing from the furthest position of the timing control circuit 62 on the dummy bit line.

The dummy bit line XDBL1 of the first dummy bit line pair DBL1, XDBL1 is connected as the dummy bit line of the detection object to the timing control circuit 62. The dummy bit line pair XDBL2 of the second dummy bit line pair DBL2, XDBL2 is connected as the dummy bit line of the detection object to the timing circuit 62. The timing control circuit 62 inputs the dummy bit lines XDBL1, XDBL2 and outputs the self-timing signal SLF on the basis of potential detection result of the dummy bit lines XDBL1, XDBL2.

Each dummy memory cell SDMC for self-timing of the dummy bit line pairs DBL1, XDBL1, and DBL2, XDBL2 is connected to the common word dummy word line DWL. With selection of the dummy word line DWL, all dummy memory cells for self-timing SDMC are selected simultaneously.

Figure 8:
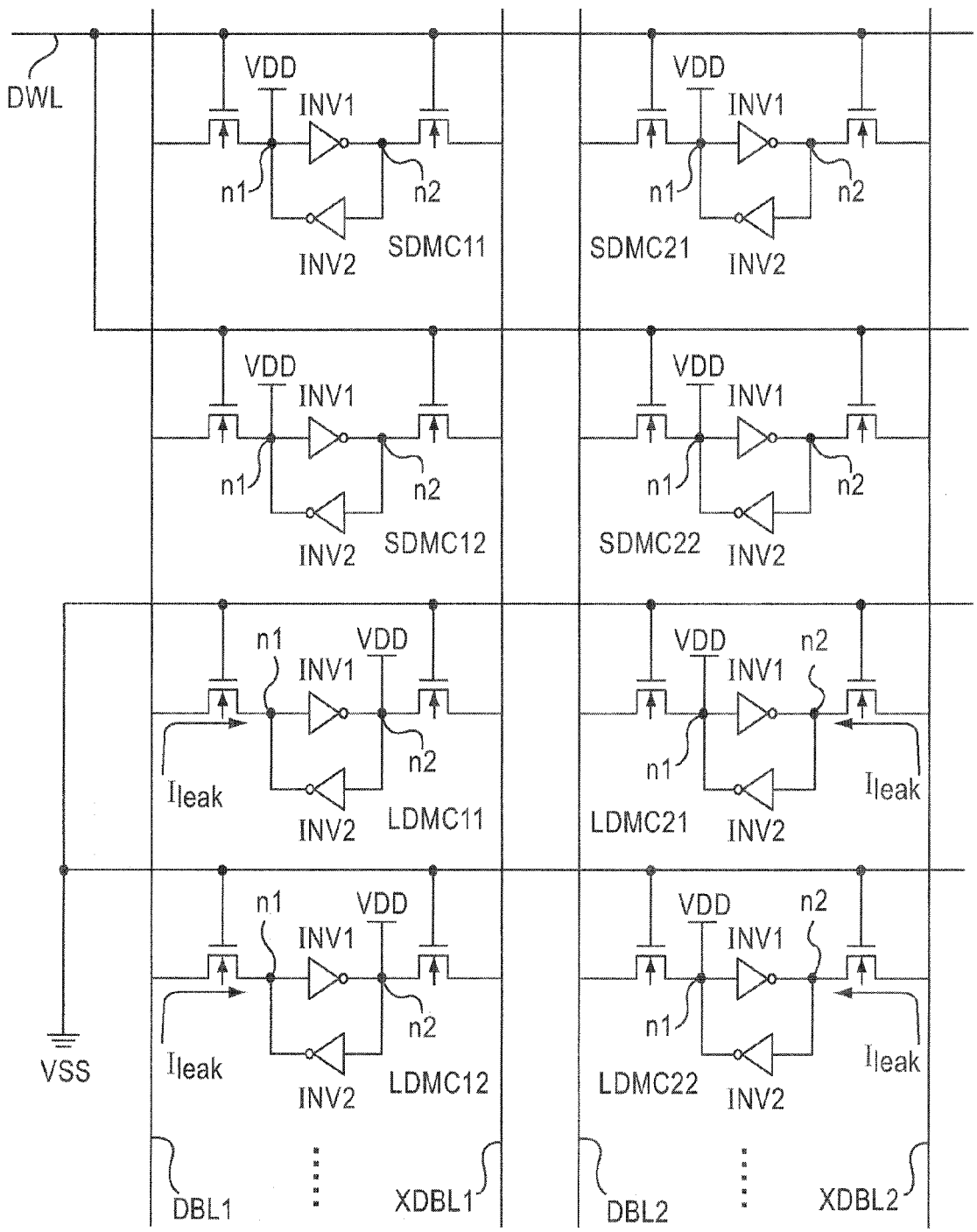
FIG. 8 is a diagram showing a setting pattern of the stored data of dummy memory cell for timing and dummy memory cell for load in each dummy bit pair in the self-timing circuit of the first embodiment.

FIG. 8 is a diagram showing a setting pattern of stored data of the dummy memory cell for timing SDMC and dummy memory cell for load LDMC in the dummy bit line pairs DBL1, XDBL1 and DBL2, XDBL2 in the self-timing circuit 61.

Figure 3:
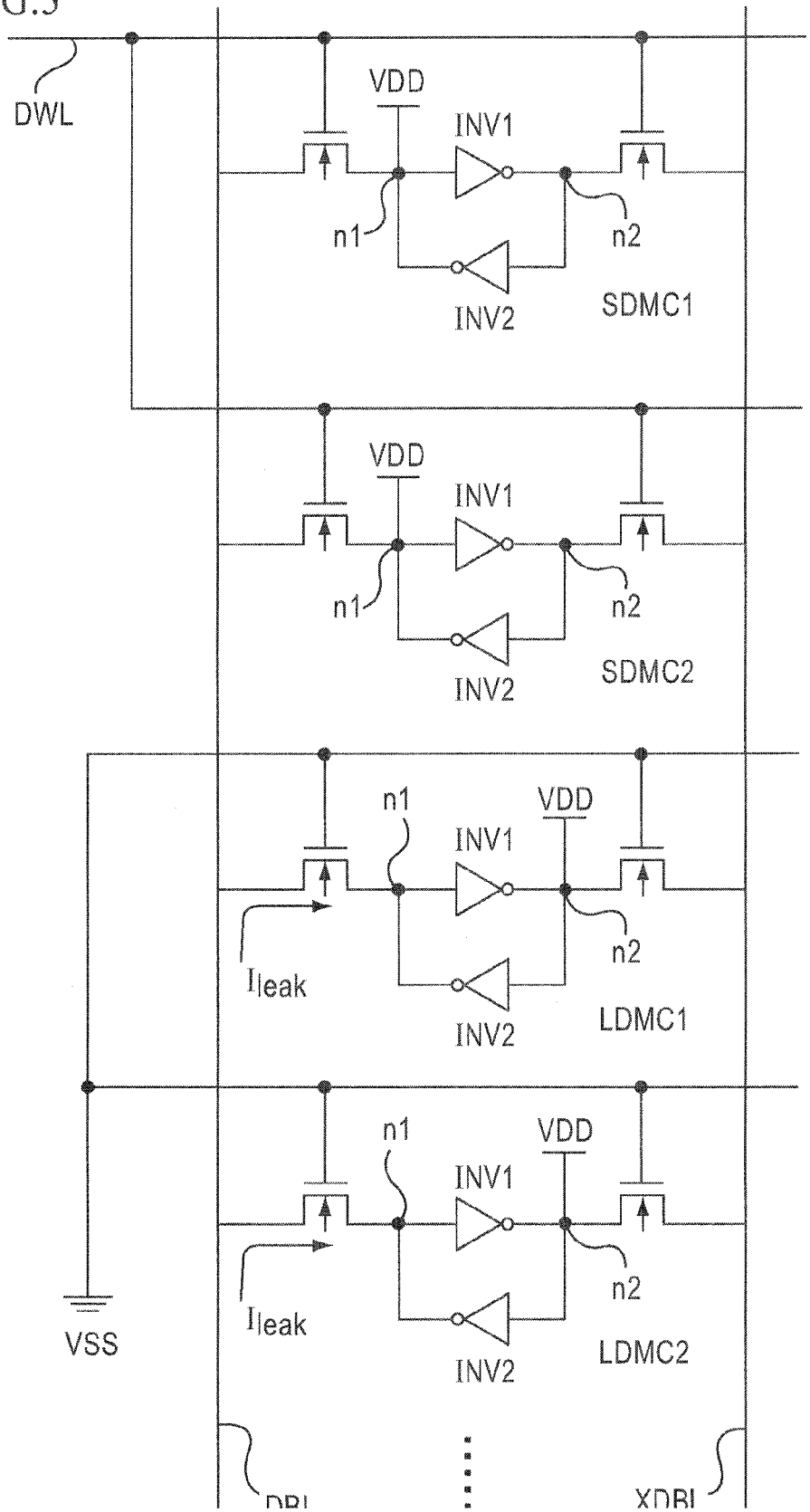
FIG. 3 is a diagram showing an example of setting pattern of the stored data of dummy memory cell for self-timing and dummy memory cell for load connected to dummy bit pair of the existing self-timing circuit.
Figure 4:
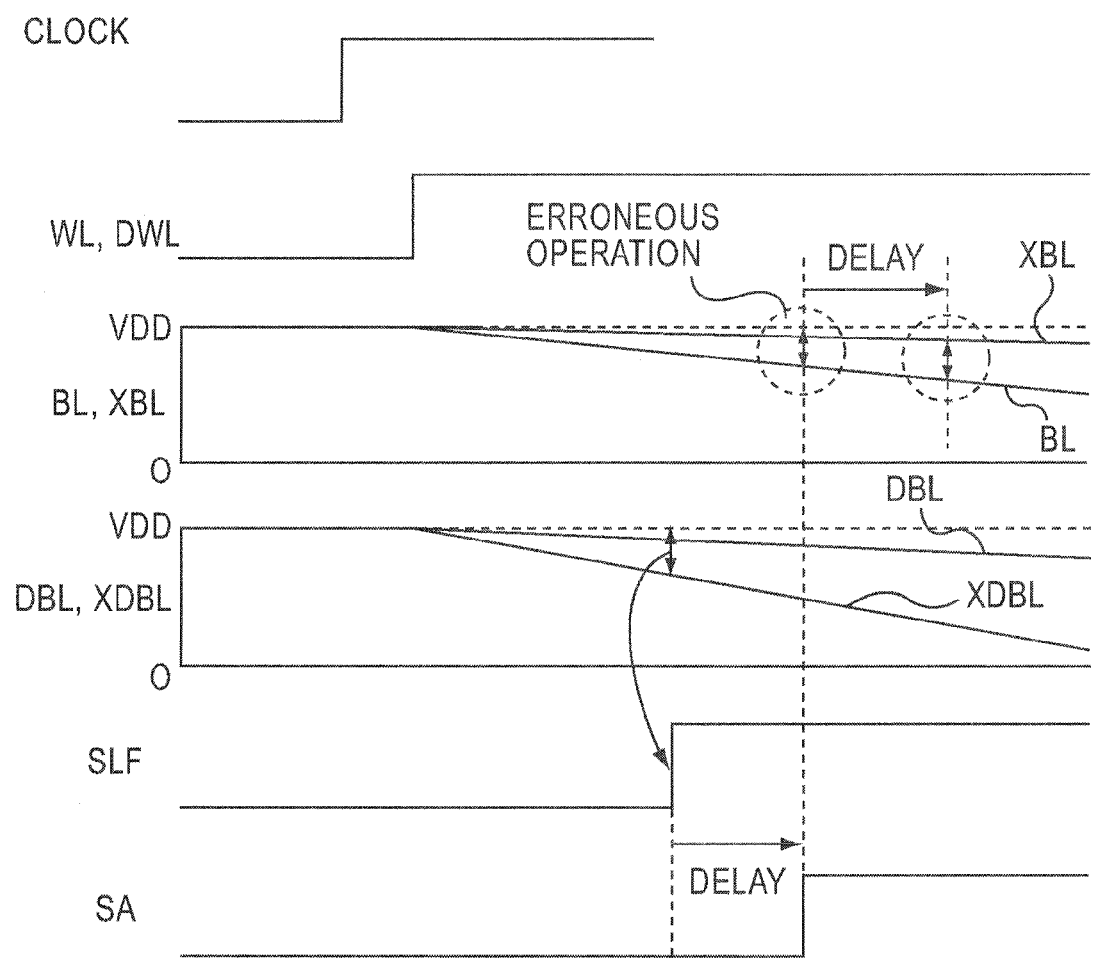
FIG. 4 is a diagram for explaining problems of SRAM provided with the existing self-timing circuit.

As illustrated in FIG. 8, the setting pattern of the stored data in the first dummy bit line pair DBL1, XDBL1 is identical to the existing setting pattern illustrated in FIG. 3. That is, in this setting pattern the potentials of connecting nodes n1, n2 of inverter pair InV1, INV2 are inversely fixed with each other between the dummy memory cell for self-timing SDMC and dummy memory cell for load LDMC. The setting pattern of the first dummy bit line pair DBL1, XDBL1 is determined to minimize influence of drive by the off leak current $I_{leak}$ of the dummy memory cell for load LDMC for the dummy bit line XDBL1 as the detection object of the timing control circuit 62 and to drive the dummy bit line XDBL1 only with the dummy memory cell for self-timing SDMC.

Meanwhile, the setting pattern of the stored data in the second dummy bit line pair DBL2, XDBL2 is identical to the pattern to fix the potentials of connecting nodes n1, n2 of the inverter pair INV1, INV2 to the identical potential between the dummy memory cell for self-timing SDMC and dummy memory cell for load LDMC. The setting pattern of the second dummy bit line pair DBL2, XDBL2 is determined to maximize influence of drive with the off leak current $I_{leak}$ of the dummy memory cell for load LDMC to the dummy bit line XDBL2 as the detection object and to drive the dummy bit line XDBL2 with the dummy memory cell for self-timing SDMC and the off leak current $I_{leak}$ of all dummy memory cells for load LDMC.

Accordingly, difference in driving capability between the dummy bit lines XDBL1, XDBL2 is resulting from drive of the dummy memory cell for load LDMC with the off leak current $I_{leak}$. Difference in times until potentials of the dummy bit lines XDBL1, XDBL2 become equal to the predetermined value after the dummy word line DWL is selected changes depending on amount of current of the off leak current $I_{leak}$ of the dummy memory cell for load LDMC.

Figure 9:
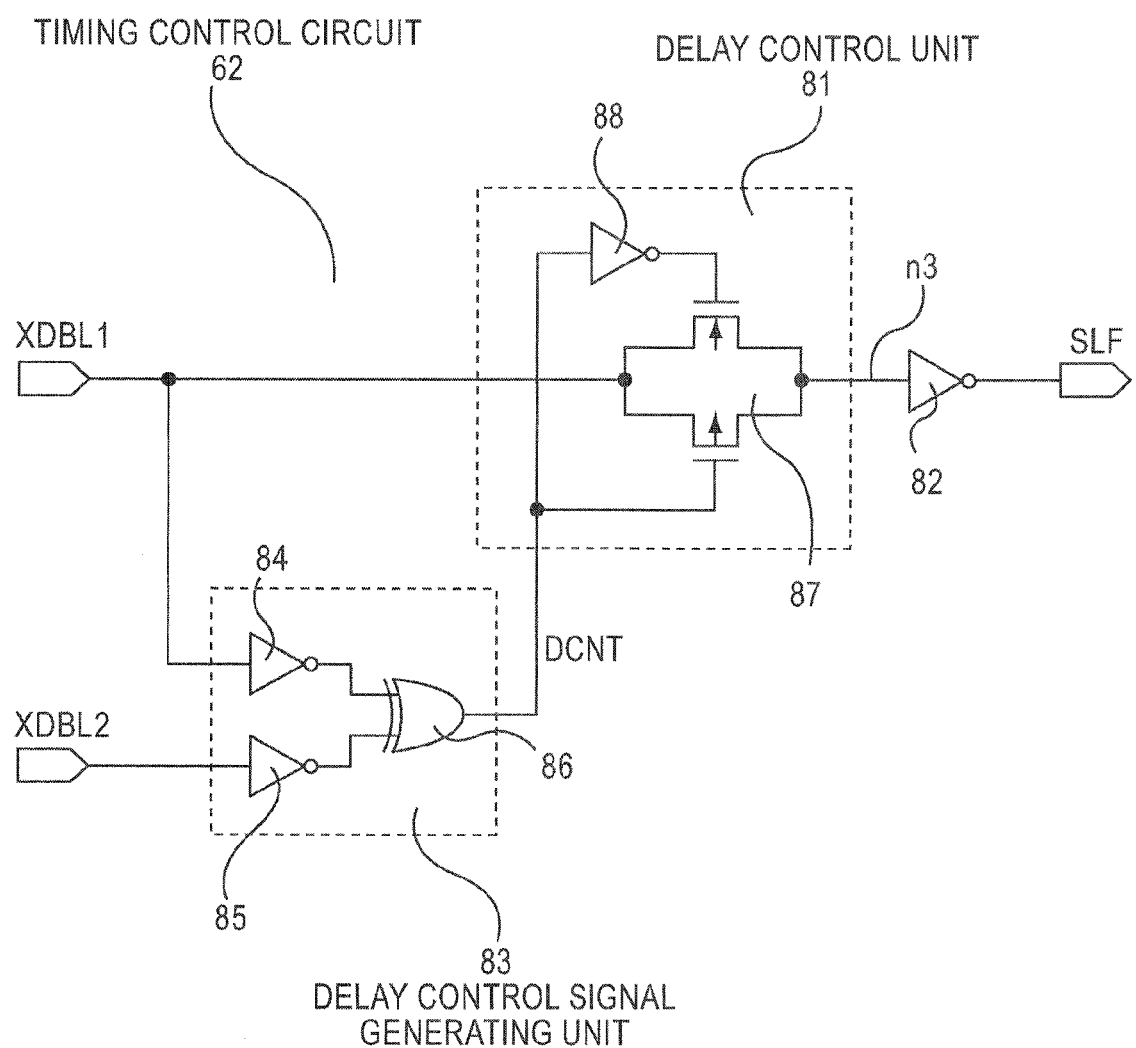
FIG. 9 is a schematic diagram showing a circuit configuration of a timing control circuit of the first embodiment.

FIG. 9 is a schematic diagram showing a circuit configuration of the timing control circuit 62. As illustrated in FIG. 9, the timing control circuit 62 includes a delay control unit 81, an inverter 82 and a delay control signal generating unit 83.

The delay control signal generating unit 83 includes an inverter 64, an inverter 85 and an EXOR circuit 86. The inverters 84, 85 have the identical threshold value voltage. The inverter 84 inputs the dummy bit line XDBL1 and outputs the H level signal to the EXOR circuit 86 responding to that the potential of the dummy bit line XDBL1 becomes smaller than the predetermined threshold value voltage. The inverter 85 inputs the dummy bit line XDBL2 and outputs the H level signal to the EXOR circuit 86 responding to that the potential of the dummy bit line XDBL2 becomes smaller than the threshold value explained above. The EXOR circuit 86 inputs an output signal of the inverters 84, 85 and generates the delay control signal DCNT by obtaining the exclusive OR of two output signals.

The delay control unit 81 includes a transfer switch 87 and an inverter 88. The transfer switch 87 is formed of a PMOS transistor and an NMOS transistor with the sources and drains thereof connected with each other to connect the dummy bit line XDBL1 and an input node of the inverter 82. The delay control signal DCNT is supplied in direct to the gate of the PMOS transistor from the delay control signal generating unit 83, while the delay control signal DCNT to the gate of the NMOS transistor via the inverter 88. The delay control unit 81 inputs the dummy bit line XDBL1 and the delay control signal DCNT and outputs a potential of the dummy bit line XDBL1 to the input node of the inverter 82 by delaying the same potential for the predetermined period on the basis of the delay control signal DCNT.

The inverter 82 inputs an output signal from the delay control unit 81 and activates the self-timing signal SLF responding to that a potential of the output signal becomes smaller than the predetermined value.

Operations of the timing control circuit 62 will be explained below with reference to FIG. 10. When the predetermined word line WL in the memory cell array MCA is selected and the dummy work line DWL is selected responding to such selection, potentials of the dummy bit lines XDBL1, XDBL2 are respectively lowered to the L level from the pre-charge level (H level).

Here, as explained above, difference resulting from drive with the off leak current $I_{leak}$ of the dummy memory cell for load LDMC lies between the driving capabilities for the dummy bit lines XDBL1, XDBL2 and lowering rate of potential of the dummy bit line XDBL2 becomes higher in the degree corresponding to amount of the off leak current $I_{leak}$ than that of the dummy bit line XDBL1.

Therefore, the timing in which an output signal of the inverter 85 becomes H level becomes earlier than the timing t2 in which an output signal of the inverter 84 becomes H level in the degree corresponding to amount of off leak current $I_{leak}$. Accordingly, the delay control signal DCNT generated by the EXOR circuit 86 includes the H level period Δt depending on amount of off leak current $I_{leak}$. The H level period Δt becomes longer as the amount of off leak current $I_{leak}$ increases.

The transfer switch 87 of the delay control unit 81 operates by receiving the delay control signal DCNT including the H level period Δt and turns ON during the H level period Δt and turns off during the period other than the H level period Δt. Therefore, potential change of the input node n3 of the inverter 82 is as follows.

Since the transfer switch 87 turns ON in the period earlier than the timing t1, a potential of the input node n3 is pulled down to the L level from the precharge level (H level) following drop of the potential of the dummy bit line XDBL1. Since the transfer switch 87 turns OFF in the period until the timing t2 (H level period Δt), a potential of the input node n3 does not follow drop of the potential of the dummy bit line XDBL1 and is maintained in the potential in the timing t1. In the period after the timing t2, the transfer switch 87 turns ON and therefore a potential of the input node n3 changes again following drop of the potential of the dummy bit line XDBL1 and is pulled down to the L level from the potential in the timing t1.

The inverter 82 activates and outputs the self-timing signal SLF in the timing t3 where a potential of the input node n3 becomes smaller than the threshold value voltage. It is preferable that the threshold value voltage of the inverter 82 is set smaller than that of the inverters 84, 85.

Figure 10:
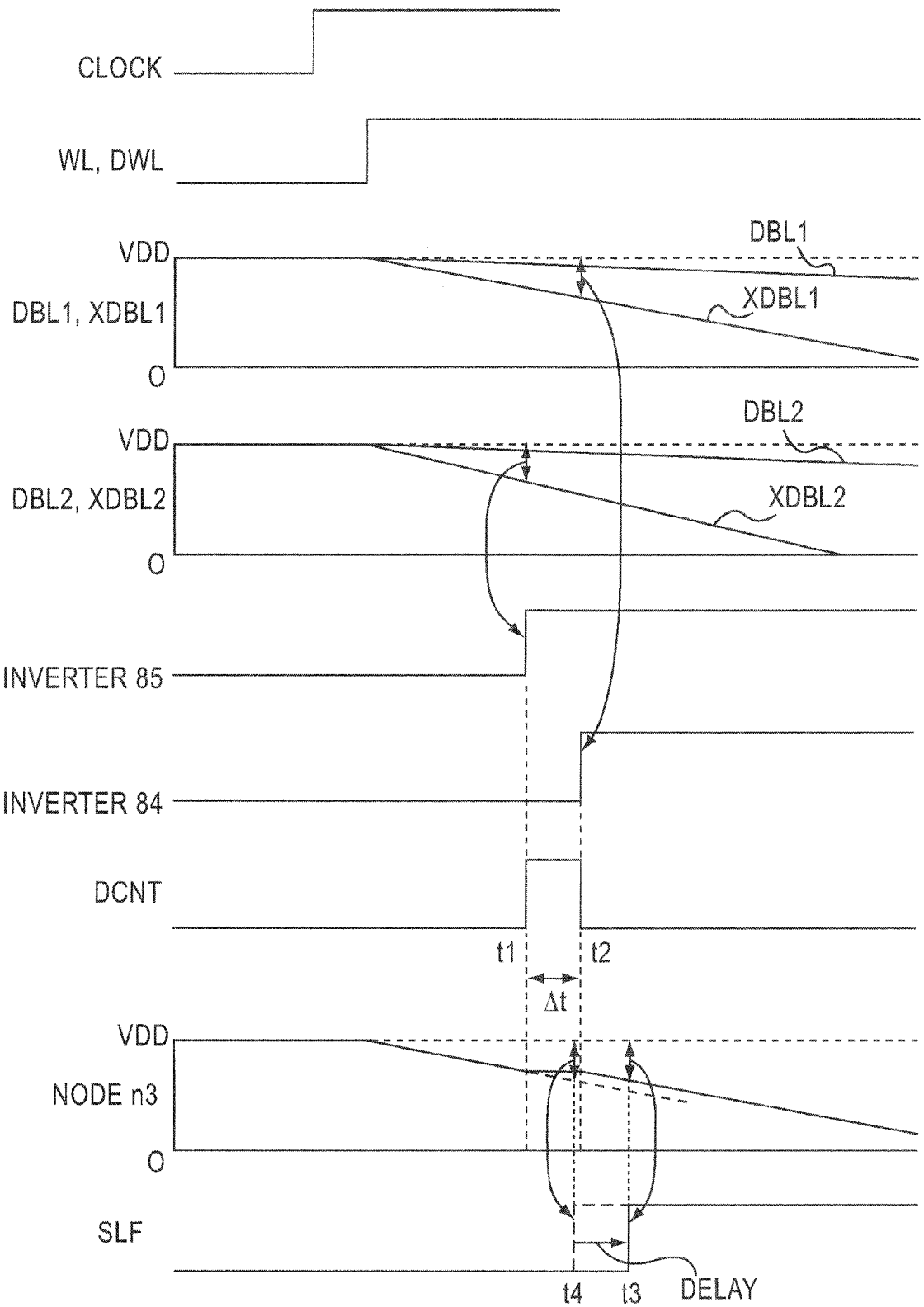
FIG. 10 is a diagram for explaining operations of the timing control circuit of the first embodiment.

As is understood from FIG. 10, the waveform indicating potential change at the input node n3 after the timing t2 is identical to the waveform obtained by deviating the waveform indicating potential change of the dummy bit line XDBL1 after the timing t1 as much as the H level period Δt. Therefore, activation timing of the self-timing signal SLF in the timing control circuit 62 is delayed as much as the H level period Δt from the existing activation timing t4 which has been determined indirect from the potential of the dummy bit line XDBL1.

Since the H level period Δt becomes longer as the amount of off leak current $I_{leak}$ increases as explained above, the self-timing circuit 61 is capable of delaying activation timing of the self-timing signal SLF as long as the period corresponding to the off leak current $I_{leak}$ of the dummy memory cell for load LDMC and is also increasing amount of delay of activation timing of the self-timing signal SLF as the amount of off leak current $I_{leak}$ increases.

Accordingly, in the first embodiment of the present invention, since activation timing of the sense amplifier drive signal SA can be delayed as long as the period corresponding to the amount of off leak current $I_{leak}$ even when the amount of off leak current $I_{leak}$ increases due to a certain reason such as change in the ambient temperature or the like as illustrated in FIG. 10, it can be prevented that activation timing of the sense amplifier drive signal SA becomes earlier than the timing in which the predetermined potential difference is generated in the bit line pair BL, XBL of the ordinary memory cell MC and erroneous read of stored data is generated.

Figure 11:
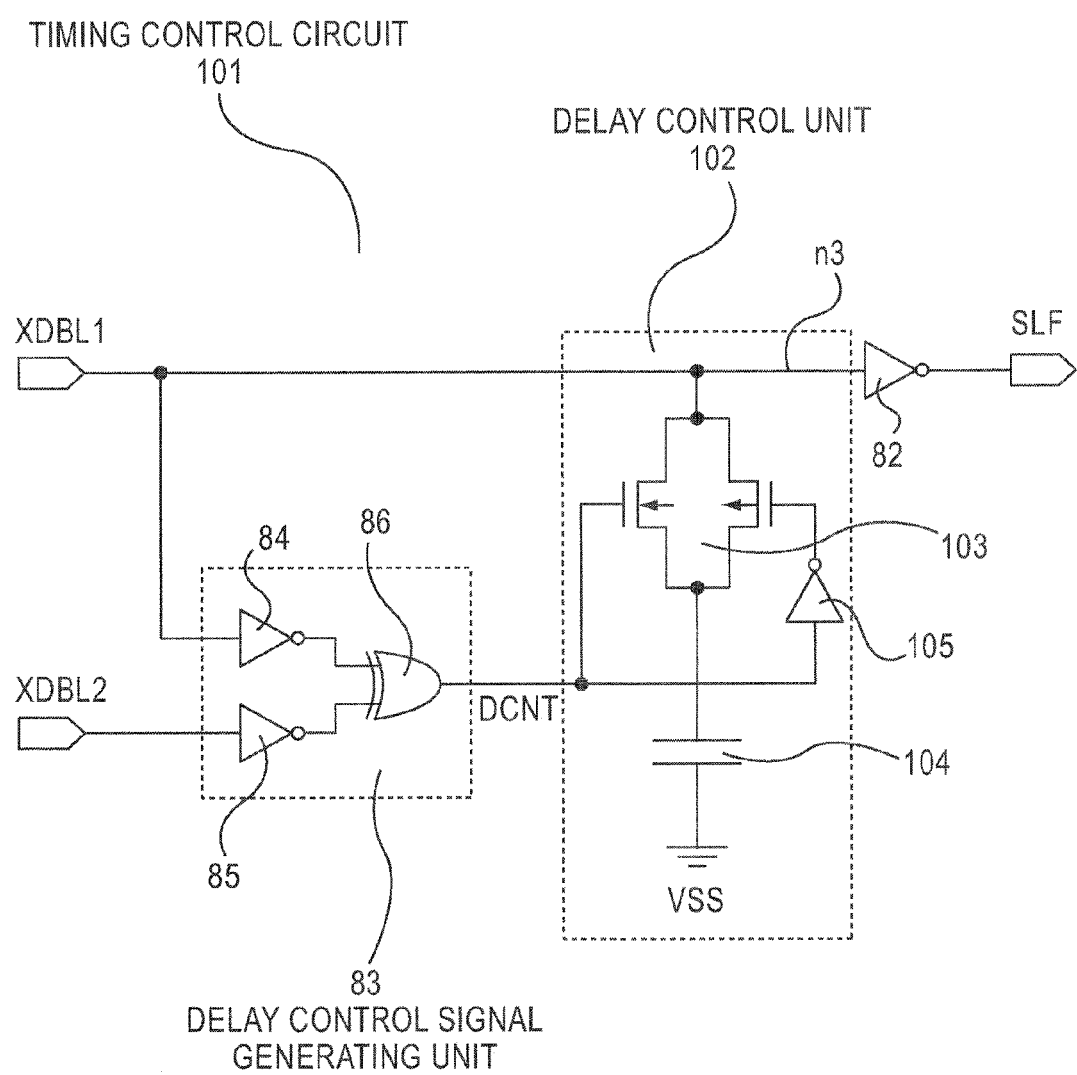
FIG. 11 is a diagram for explaining a second embodiment.

Next, a second embodiment of the present invention will be explained with reference to FIG. 11. A circuit configuration of the second embodiment of the present invention is different from the circuit configuration of the first embodiment illustrated in FIG. 7 in the point that the timing control circuit 62 is replaced with a timing control circuit 101. The other configuration is not explained because it is identical to that of the first embodiment. FIG. 11 illustrates the circuit configuration of the timing control circuit 101 in the second embodiment.

As illustrated in FIG. 11, the timing control circuit 101 has difference in configuration that the delay control unit 81 is replaced with a delay control unit 102 in the timing control circuit 62 of FIG. 9. The other configuration is not explained because it is identical to that explained above.

The delay control unit 102 includes a switch transistor 103, an additional capacitance 104, and an inverter 105. The switch transistor 103 and additional capacitance 104 are connected in series between the input node n3 of the inverter 82 and the ground VSS. The switch transistor 103 is formed of a PMOS transistor and an NMOS transistor which are connected with each other in the sources and drains. To the gate of PMOS transistor, the delay control signal DCNT is supplied via an inverter 105 from the delay control signal generating unit 83, while to the gate of NMOS transistor, the delay control signal DCNT is supplied in direct.

The delay control unit 102 inputs the dummy bit line XDBL1 and delay control signal DCNT and outputs a potential of the dummy bit line SDBL1 to the input node n3 of the inverter 82 after the potential is delayed for the predetermined period based on the delay control signal DCNT. Operations of the delay control unit 102 will be explained below.

The switch transistor 103 turns ON only during the H level period Δt in FIG. 10 responding to the delay control signal DCNT and connects the additional capacitance 104 to the input node n3. Therefore, capacitance of wire in the input node n3 becomes identical to that obtained by adding the additional capacitance 104 to the parasitic capacitance only during the H level period Δt (period up to the timing t2 from the timing t1) and this capacitance greatly increases in comparison with that during the periods before the timing t1 and after the timing t2. Corresponding to this event, a lowering rate of the potential of the input node n3 is greatly lowered in comparison with that before the timing t1 and after the timing t2, only during the period up to the timing t2 from the timing t1.

Therefore, fall of potential of the input node n3 from that in the timing t1 can be reduced during the period up to the timing t2 from the timing t1 and thereby the potential of the input node n3 can be maintained almost in the potential in the timing t1. Accordingly, potential change of the input node n3 in the timing control circuit 101 becomes identical to that in the timing control circuit 62 illustrated in FIG. 10.

Thus, in the second embodiment of the present invention, if the off leak current $I_{leak}$ increases as in the case of the first embodiment, activation timing of the sense amplifier drive signal SA can be delayed as long as the period corresponding to the amount of off leak current $I_{leak}$ and thereby erroneous read of the stored data of the ordinary memory cell MC can be prevented.

A capacitance value of the additional capacitance 104 is set to provide sufficiently small amount of fall of potential of the input node n3 from that in the timing t1 during the period up to the timing t2 from the timing t1 in accordance with driving capability for the dummy bit line XDBL1 and amount of parasitic capacitance of the input node n3.

Next, a third embodiment of the present invention will be explained with reference to FIG. 12. A circuit configuration of the third embodiment of the present invention is different from the circuit configuration of the first embodiment illustrated in FIG. 7 in the point that the timing control circuit 62 is replaced with a timing control circuit 111. The other configuration is not illustrated because it is similar to that in the first embodiment. A circuit configuration of the timing control circuit 111 in the third embodiment is illustrated in FIG. 12.

Figure 12:
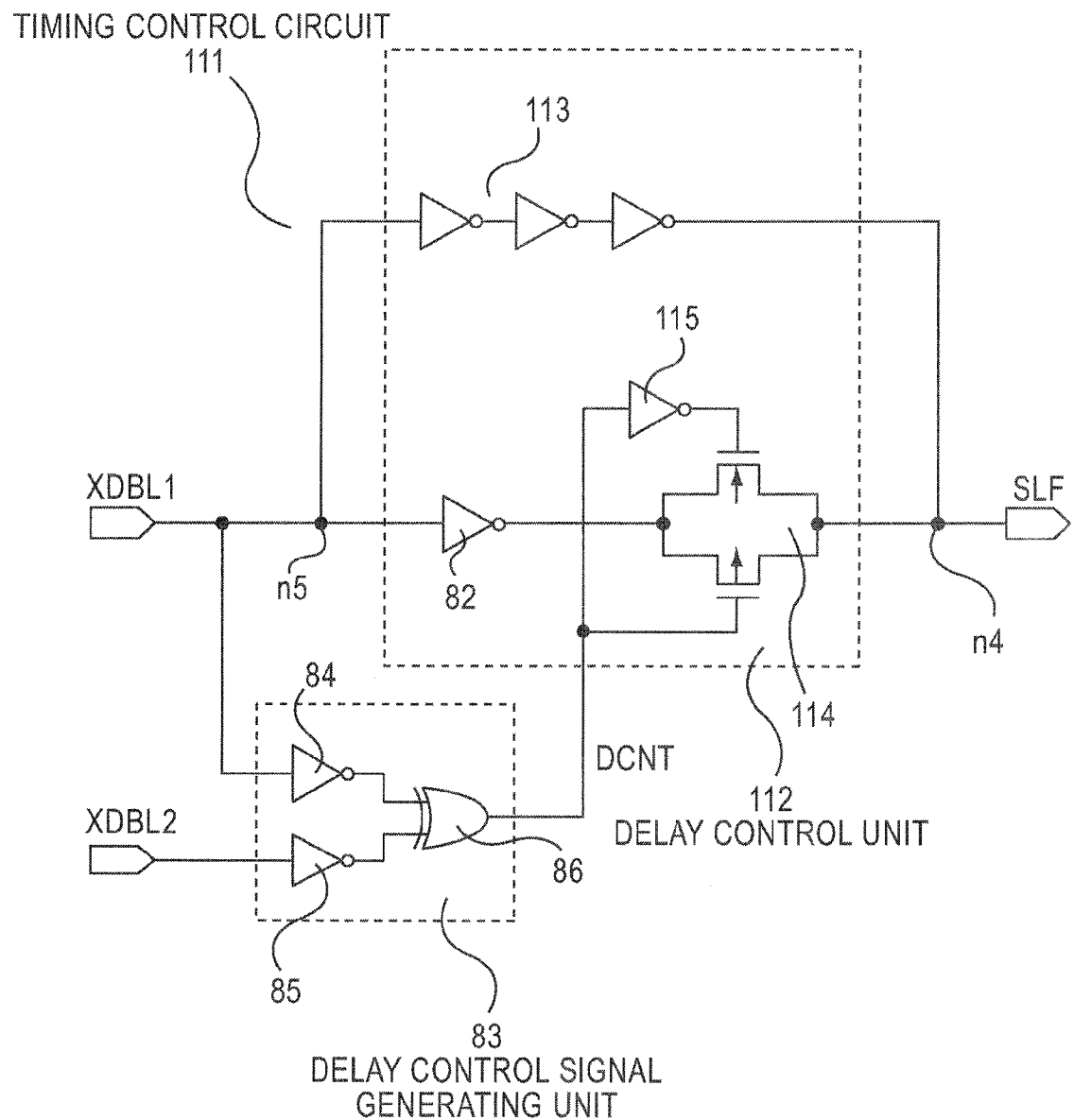
FIG. 12 is a diagram for explaining a third embodiment.

As illustrated in FIG. 12, the timing control circuit 111 is different in the point that the delay control unit 81 is replaced with a delay control unit 112 in the timing control circuit 62 of FIG. 9. Moreover, the inverter 82 of the timing control circuit 111 is included in the delay control unit 112, unlike the timing control circuit 62. The other configuration is similar and therefore it is not explained.

The delay control unit 112 includes the inverter 82, an inverter train 113, a transfer switch 114, and an inverter 115. The inverter train 113 is connected between the dummy bit line SDBL1 and an output node n4 of the self-timing signal SLF. In parallel to the inverter train 113, the inverter 82 and the transfer switch 114 are connected in series between the dummy bit line XDBL1 and the output node n4 of the self-timing signal SLF.

The transfer switch 114 is formed of a PMOS transistor and an NMOS transistor with the sources and drains connected with each other. To the gate of the PMOS transistor, the delay control signal DCNT is supplied in direct from the delay control signal generating unit 83, while to the gate of the NMOS transistor, the delay control signal DCNT is supplied via the inverter 115. The inverter train 113 is formed of a plurality of inverters connected in series and it is configured in general with an odd number of inverters. The threshold value voltage of the inverter 82 and each inverter forming the inverter train is preferably set smaller than the threshold value voltage of the inverters 84, 85.

The transfer switch 114 operates responding to the delay control signal DCNT and turns OFF only during the H level period Δt in FIG. 10. Therefore, only during the H level period Δt (period until the timing t2 from the timing t1) explained above, an output node of the inverter 82 and the output node n4 of the self-timing signal become non-conductive but become conductive during the periods before the timing t1 and after the timing t2.

Figure 13:
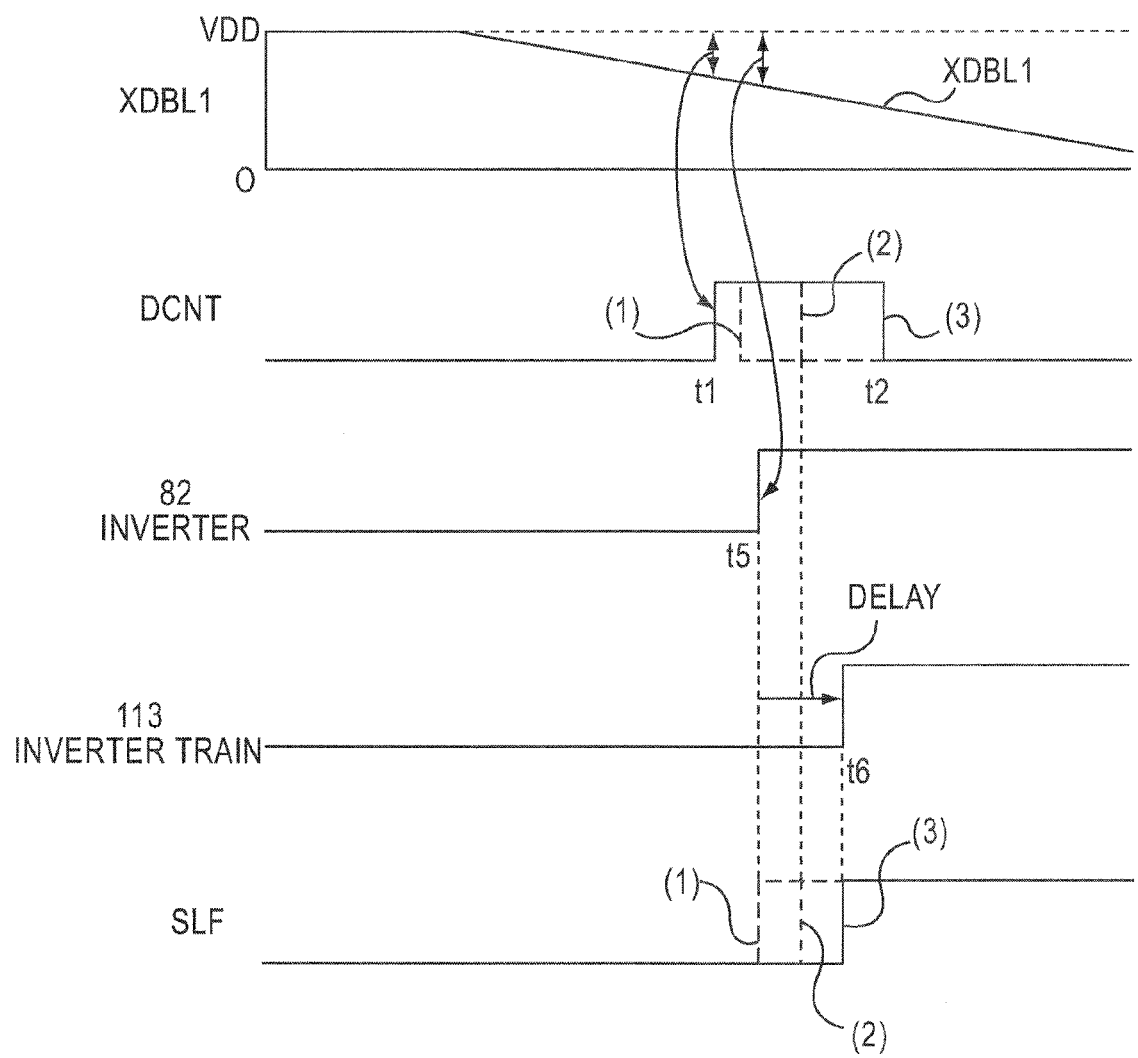
FIG. 13 is a diagram for explaining operations of a timing control circuit of the third embodiment.

The delay control unit 112 inputs the dummy bit line XDBL1 and the delay control signal DCNT and outputs the self-timing signal SLF after it is delayed only for the predetermined period on the basis of the dummy bit line XDBL1 and the delay control signal DCNT. Operations of the timing control circuit 111 will be explained below with reference to FIG. 13.

During the period earlier than the timing t1, a potential of the input node n5 of the inverter 82 and inverter train 113 is lowered to the L level from the precharge level (H level) following drop of the potential of the dummy bit line XDBL1. The inverter 82 shifts the output voltage to the H level from the L level in the timing t5 in which the potential of the input node n5 becomes smaller than the threshold value and outputs the output voltage to the transfer switch 114. The inverter train 113 shifts the output voltage to the H level from the L level in the timing t6 which is delayed from the timing t5 only during the period corresponding to the operating period of a plurality of inverters and then outputs the output voltage to the output node n4 of the self-timing signal. A delay time between the timing t5 and timing t6 can be adjusted by adjusting the number of inverters constituting the inverter train 113 and capability thereof.

Here, operations of the delay control unit 112 for outputting the self-timing signal SLF will be explained below in various cases in accordance with the positional relationships between the fall timing of the delay control signal DCNT and the timings t5 and t6 illustrated in FIG. 10.

(1) When the Timing t2 is Earlier than the Timing t5:

The transfer switch 114 once turns OFF at the timing t1 and then turns ON again at the timing t2 earlier than the timing t5 in which the inverter 82 outputs the H level. Namely, the transfer switch 114 is held in the conductive state at the timing t5.

Accordingly, the inverter 82 shifts the potential of the output node n4 of the self-timing signal to the H level from the L level at the timing t5. Thereby, the self-timing signal SLF is activated at the timing t5.

(2) When the Timing t2 is Delayed from the Timing t6:

The transfer switch 114 turns OFF at the timing T1 and thereafter turns ON again at the timing t2 delayed from the timing at which the inverter train 113 outputs the H level. Namely, the transfer switch 114 is held in non-conductive state in both timings of t5 and t6.

Therefore, the inverter 82 cannot output the H level to the output node n4 of the self-timing signal during the period until the timing t6 from the timing t5 and thereby the potential of the output node n4 of the self-timing signal is shifted to the H level from the L level with the inverter train 113 at the timing t6. Accordingly, the self-timing signal SLF is activated at the timing t6.

(3) When the Timing t2 is Delayed from the Timing t5 but is Earlier Than the Timing t6:

The transfer switch 114 turns OFF at the timing t1 and thereafter turns ON again at the timing t2 which is delayed from the timing t5 at which the inverter 82 outputs the H level but is earlier than the timing t6 at which the inverter train 113 outputs the H level. Namely, the transfer switch 114 is held in non-conductive state at the timing t5 and mean while it becomes conductive at the timing t2 between the timings t5 and t6 and is then held in the conductive state at the timing t6.

Therefore, the inverter 82 cannot output the H level to the output node n4 of the self-timing signal at the timing t5. However, the inverter 82 shifts the potential of the output node n4 of the self-timing signal to the H level from the L level at the timing t2 between the timings t5 and t6. Accordingly, the self-timing signal SLF is activated at the timing t2.

As explained above, the timing control circuit 111 changes the activation timing of the self-timing signal SLF between the timings t5 and t6 in accordance with the fall timing t2 of the delay control signal DCNT and also delays the activation timing of the self-timing signal SLF as the timing t2 is delayed.

The fall timing t2 of the delay control signal DCNT is delayed as the amount of off leak current $I_{leak}$ of dummy memory cell for load LDMC increases. Therefore, the self-timing circuit can delay the activation timing of the self-timing signal SLF only for the period corresponding to the amount of off leak current $I_{leak}$ and can increase amount of delay of the activation timing of the self-timing signal SLF in accordance with increase in amount of off leak current $I_{leak}$.

Accordingly, in the third embodiment of the present invention, erroneous read of the stored data of the ordinary memory cell MC can be prevented because the activation timing of the sense amplifier drive signal SA can be delayed only for the period corresponding to the amount of off leak current $I_{leak}$ even if the off leak current $I_{leak}$ increases.

In the third embodiment, a single inverter 82 and an inverter train 13 constituted by connecting in series three inverters are provided in parallel between the dummy bit line XDBL1 and the output node n4 of the self-timing signal SLF. The present invention is not limited to above configuration and it is enough when two inverter trains which are different in the number of inverters connected in series are provided in parallel. Moreover, in place of such configuration, it is also possible to provide in parallel two inverters, which are different in driving capability and can output the signals in different timings to the identical input signal.

Moreover, in above first to third embodiments, the transfer switch and switch transistor are constituted with the PMOS transistor and NMOS transistor with the sources and drains connected with each other. But, the present invention is not restricted thereto and it is also possible, for example, to form above circuits with single unit of the PMOS transistor or NMOS transistor.

Moreover, in above first to third embodiments, two pairs of dummy bit pair DBL, XDBL are provided and the delay control signal DCNT is generated from the dummy bit line XDBL of each pair. However, the present invention is not restricted thereto and it is also possible to provide three or more of pairs of dummy bit lines DBL, XDBL and the delay control signal DCNT is generated from the dummy bit line SDBL of each pair.

In this case, for example, a plurality of dummy bit line pairs are classified into two groups. Thereby, data is held in the setting pattern in the first group similar to that of the first dummy bit line pair DBL1, XDBL1, while data is held in the setting pattern in the second group similar to that of the second dummy bit line pair DBL2, XDBL2. In addition, delay control signal DCNT is shifted to the H level on the basis of the potential of the dummy bit line XDBL showing highest lowering rate of potential among the dummy bit lines belonging to the second-group and the delay control signal DCNT is shifted to the L level on the basis of the potential of the dummy bit line XDBL showing lowest lowering rate of potential among the dummy bit lines belonging to the first group.

Figure 14:
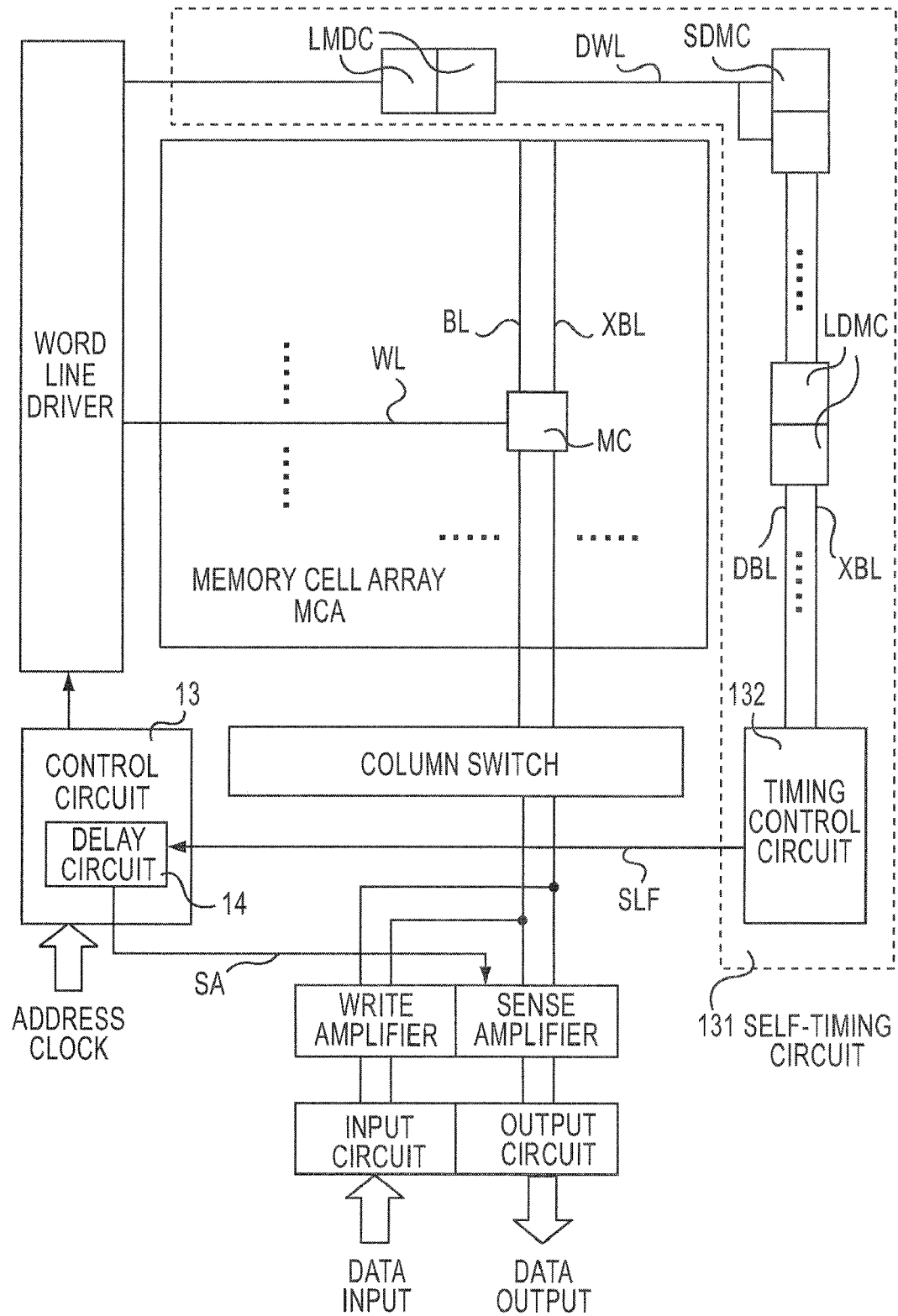
FIG. 14 is a schematic configuration diagram showing a fourth embodiment.

FIG. 14 is a schematic configuration diagram showing a fourth embodiment of the present invention. An SRAM illustrated in FIG. 14 includes a self-timing circuit as the circuit for generating the sense amplifier drive signal for driving a sense amplifier circuit. A circuit configuration of the SRAM illustrated in FIG. 14 is different from the circuit configuration of the related art in the point that the self-timing circuit 11 is replaced with a self-timing circuit 131. The other configuration is similar to that of FIG. 1.

Figure 1:
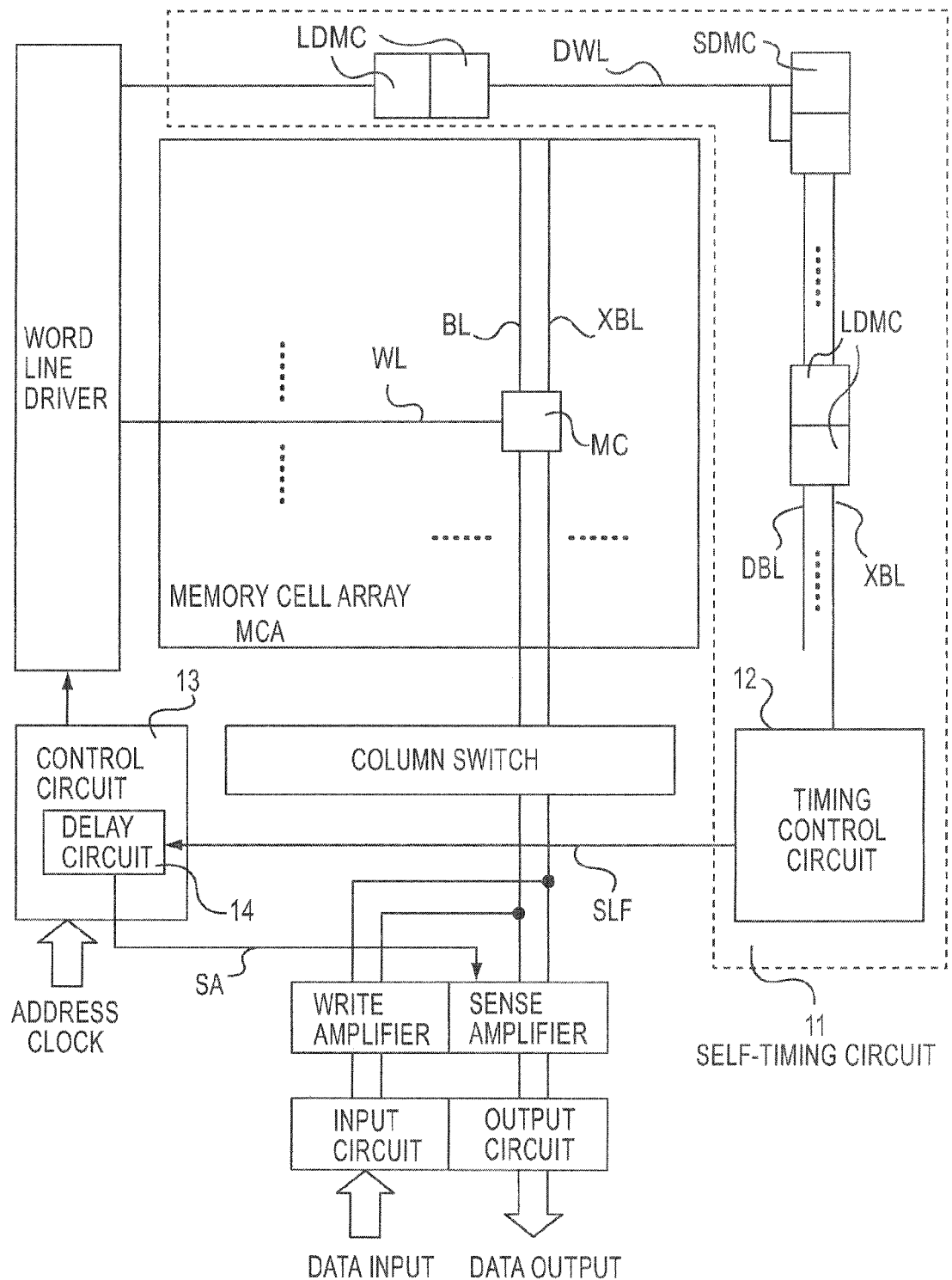
FIG. 1 is a schematic diagram of a circuit configuration of SRAM provided with the existing self-timing circuit.
Figure 2:
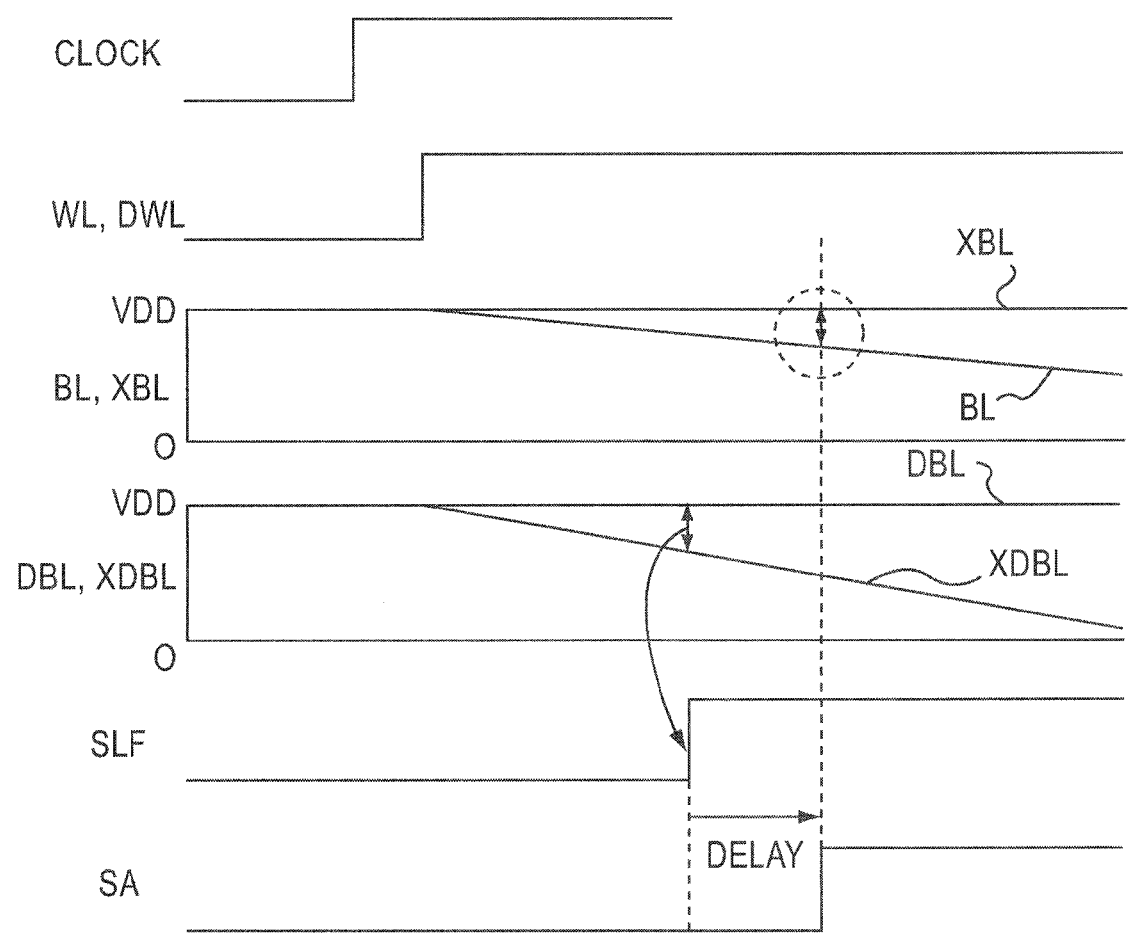
FIG. 2 is a diagram for explaining operations of the existing self-timing circuit.

The self-timing circuit 131 of FIG. 14 includes, like the self-timing circuit 11 of FIG. 1, dummy bit pair DBL, XDBL. The dummy bit line pair DBL, XDBL includes at least one dummy memory cell for self-timing SDMC and a plurality of dummy memory cells for load LDMC. As the dummy memory cell for self-timing SDMC, a plurality of memory cells, for example, are designated sequentially from the furthest position from the timing control circuit 132 on the dummy bit line. The dummy bit line pair DBL, XDBL are respectively connected to the timing control circuit 132.

The timing control circuit 132 inputs the dummy bit line pair DBL, XDBL and outputs the self-timing signal SLF on the basis of detection result of the potential of the dummy bit line pair DBL, XDBL. Each dummy memory cell for self-timing SDMC of the dummy bit line pair DBL, XDBL is connected to the common dummy word line DWL. With selection of he dummy word line DWL, all dummy memory cells for self-timing SDMC are selected simultaneously.

A setting pattern of the stored data of the dummy memory cell for self-timing SDMC and dummy memory cell for load LDMC is identical to the existing pattern illustrated in FIG. 3. Namely, in the setting patterns, potentials of the connecting nodes n1, n2 of the inverter pair INV1, INV2 are fixed inversely with each other between the dummy memory cell for self-timing SDMC and the dummy memory cell for load LDMC.

These setting patterns minimize influence of drive with the off leak current $I_{leak}$ of the dummy memory cell for load LDMC to the dummy bit line XDBL, drives the dummy bit line XDBL only with the dummy memory cell for self-timing SDMC, and drives the dummy bit line DBL with the off leak current $I_{leak}$ of all dummy memory cells for load LDMC.

Figure 15:
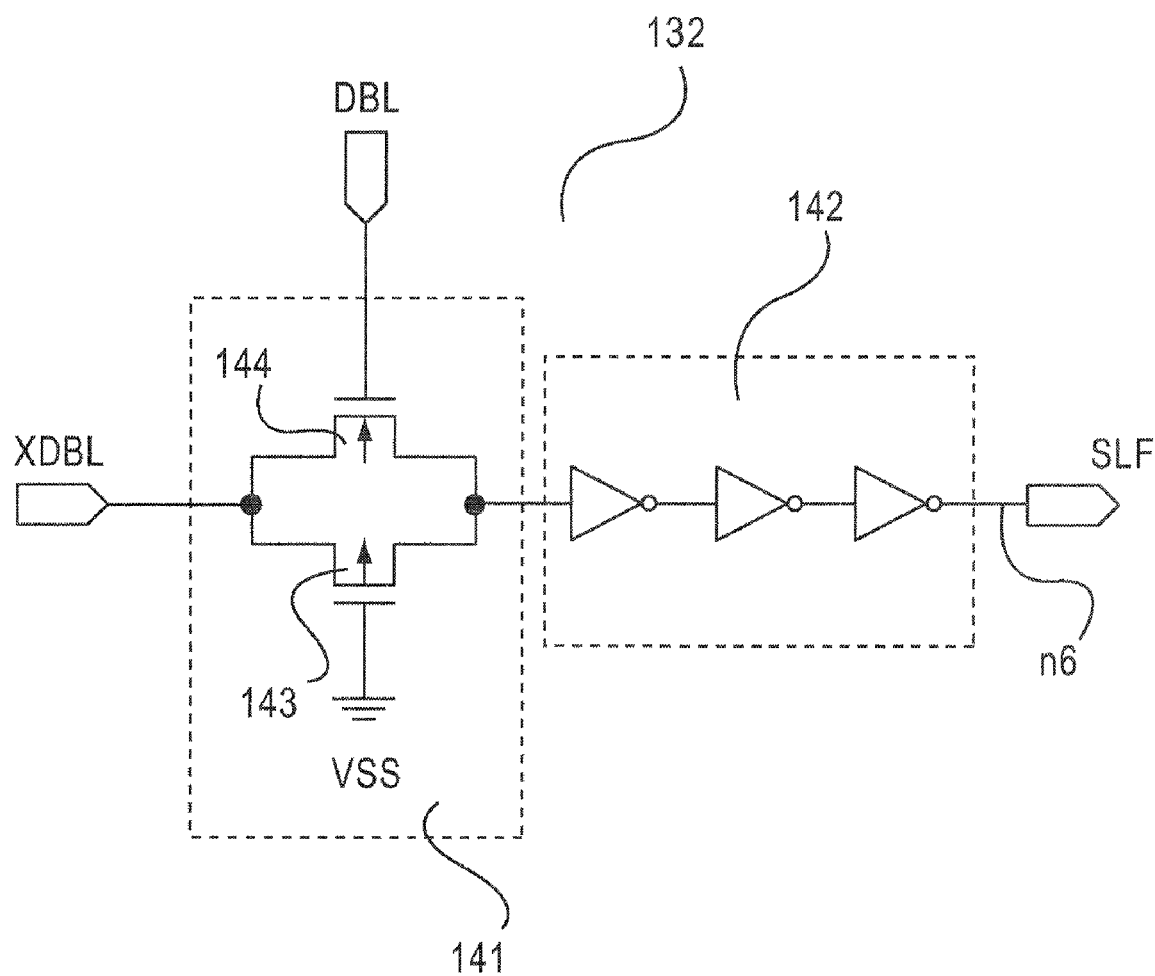
FIG. 15 is a schematic diagram showing a circuit configuration of the timing control circuit of the fourth embodiment.

FIG. 15 is a schematic diagram showing a circuit configuration of the timing control circuit 132. As illustrated in FIG. 15, the timing control circuit 132 is constituted to include a delay control unit 141 and an inverter train 142, in which the delay control unit 141 and the inverter train 142 are connected in series between the dummy bit line XDBL and an output node n6 of the self-timing signal SLF.

The delay control unit 141 includes a transfer gate constituted with a PMOS transistor 143 and an NMOS transistor 144 with the sources and drains connected with each other. The PMOS transistor 143 is connected to the ground VSS in the gate and is always turned ON. The NMOS transistor 144 is connected to the dummy bit line DBL in the gate. The delay control unit 141 inputs the dummy bit line pair BDL, XBDL and outputs the potential of the dummy bit line XDBL to the input node of the inverter train 142 after it is delayed as long as the predetermined period on the basis of the potential of the dummy bit line DBL.

The inverter train 142 is constituted through series connection of a plurality of inverters. The inverter train 142 inputs an output signal from the delay control unit 141 to activate the self-timing signal SLF responding to that a potential of the output signal becomes smaller than the predetermined value.

Operations of the timing control circuit 132 will be explained below with reference to FIG. 16. When the predetermined word line WL in the memory cell array MCA is selected and the dummy word line DWL is selected responding to above selection, the potential of the dummy bit line XDBL is driven with the dummy memory cell for self-timing SDMC and is then lowered to the L level from the precharge level (H level).

Simultaneously, the dummy bit line DBL is also driven with the off leak current $I_{leak}$ of all dummy memory cells for load LDMC and is then lowered to the L level from the precharge level (H level). Amount of fall of the potential from the precharge level of the dummy bit line DBL changes depending on amount of the off leak current $I_{leak}$ of the dummy memory cell for load LDMC. When amount of the off leak current $I_{leak}$ increases, amount of fall of the potential of the dummy bit line DBL also increases.

Here, a potential of the dummy bit line DBL is inputted to the gate of the NMOS transistor 144 forming the delay control unit 141 as explained above. Therefore, an ON resistance value of the NMOS transistor 144 changes depending on the potential of the dummy bit line DBL and increases as amount of fall of potential from the precharge level of the dummy bit line DBL increases.

Accordingly, an ON resistance value of the delay control unit 141 increases depending on increase in amount of fall of potential of the dummy bit line DBL. Amount of delay of the signal in the delay control unit 141 also increases depending on increase in amount of fall of potential of the dummy bit line DBL. Since amount of fall of potential of the dummy bit line DBL corresponds to amount of the off leak current $I_{leak}$, amount of delay of signal in the delay control unit 141 also changes depending on amount of the off leak current $I_{leak}$ of the dummy memory cell for load LDMC and increases depending on increase in the off leak current $I_{leak}$.

Accordingly, the delay control unit 141 delays a potential of the input dummy bit line XDBL for the period Δt corresponding to amount of the off leak current $I_{leak}$ and then outputs this potential to the inverter train 142. The inverter train 142 inputs the potential of the dummy bit line DBL delayed with the delay control unit 141 and activates the self-timing signal SLF responding to that the potential becomes smaller then the predetermined threshold value voltage.

Accordingly, the self-timing circuit 131 is capable of delaying activation timing of the self-timing signal SLF for the period Δt depending on amount of the off leak current $I_{leak}$ of the dummy memory cell for load LDMC and is increasing amount of delay of activation timing of the self-timing signal SLF in accordance with increase in the off leak current $I_{leak}$.

Therefore, since activation timing of the sense amplifier drive signal SA can be delayed for the period depending on amount of the off leak current $I_{leak}$ in the fourth embodiment of the present invention even when the off leak current $I_{leak}$ increases with a certain reason such as change in ambient temperature or the like, it can be prevented that activation timing of the sense amplifier drive signal SA becomes earlier than the timing at which the predetermined potential difference is generated in the bit line pair BL, XBL of the ordinary memory cell MC and erroneous read of the stored data occurs.

Next, a fifth embodiment of the present invention will be explained with reference to FIG. 17. A circuit configuration of the fifth embodiment of the present invention is different from the circuit configuration of the fifth embodiment of the present invention in the point that the timing control circuit 132 is replaced with a timing control circuit 161 or 162. The other configuration is similar to that of the fourth embodiment and therefore it is not explained. FIG. 17(a) illustrates a circuit configuration of the timing control circuit 161 in the fifth embodiment, while FIG. 17(b) illustrates a circuit configuration f the timing control circuit 162 of the fifth embodiment.

As illustrated in FIG. 17(a), the timing control circuit 161 has a configuration that an inverter train 164 formed of a plurality of inverters is provided between the dummy bit line XDBL and an output node n6 of the self-timing signal and moreover a delay control unit 163 is inserted among the inverters forming the inverter train 164.

The delay control unit 163 has a configuration wherein a transfer gate constituted with a PMOS transistor and an NMOS transistor with the sources and drains connected with each other is connected in series in a plural number. In each transfer gate, the gate of the PMOS transistor is connected to the ground VSS, while the gate of the NMOS transistor is connected to the dummy bit line DBL. Configuration of each transfer gate is similar to that of the transfer gate in the delay control unit 141 of FIG. 14.

As illustrated in FIG. 17(b), the timing control circuit 162 has a configuration that an inverter train 165 constituted with a plurality of inverters is provided between the dummy bit line XDBL and the output node n6 of the self-timing signal and moreover a transfer gate forming a delay control unit 166 is inserted among inverters forming the inverter train 165.

The delay control unit 166 includes a plurality of transfer gate s constituted with a PMOS transistor and an NMOS transistor with the sources and drains connected with each other. In each transfer gate, the gate of the PMOS transistor is connected to the ground VSS, while the gate of the NMOS transistor to the dummy bit line DBL. Configuration of each transfer gate is similar to that of the transfer gate in the delay control unit 141 of FIG. 15.

The inverter trains 164, 165 respectively input the dummy bit line SDBL to activate the self-timing signal SLF responding to that a potential of the dummy bit line SDBL becomes smaller than the predetermined value.

Here, as explained above, the transfer gates respectively forming the delay control units 163, 166 are inserted among the inverters of the inverter trains 164, 165. Therefore, activation timing of the self-timing signal SLF due to the inverter trains 165, 165 is delayed with the delay control units 163, 166 only for the predetermined period on the basis of the potential of the dummy bit line DBL.

The transfer gates of the delay control units 163, 166 delay the signal, like the delay control unit 141 in FIG. 15, only for the period corresponding to amount of the off leak current $I_{leak}$ of the dummy memory cell for load LDMC. Moreover, since the delay control units 163, 166 are constituted with a plurality of transfer gates, influence on amount of delay by amount of the off leak current $I_{leak}$ is emphasized. Therefore, amount of delay of the signal of the delay control units 163, 166 for the identical amount of the off leak current $I_{leak}$ becomes larger than that of the delay control circuit 141.

Accordingly, the timing control circuits 161, 162 can provide amount of delay for activation timing of the self-timing signal SLF which is larger than that of the timing control circuit 132 for the identical amount of the off leak current $I_{leak}$ of the dummy memory cell for load LDMC. Thereby, even when the off leak current $I_{leak}$ increases, a margin of activation timing of the self-timing signal SLF for the timing at which the predetermined potential difference is generated in the bit line pair BL, XBL of the ordinary memory cell MC can be increased.

Accordingly, since activation timing of the sense amplifier drive signal SA can be delayed only for the period corresponding to the amount of off leak current $I_{leak}$ and amount of delay of activation timing of the sense amplifier drive signal SA can be increased even when the off leak current $I_{leak}$ increases in the fifth embodiment of the present invention, erroneous read of data can be prevented more reliably by increasing the read margin of the stored data of the ordinary memory cell MC.

Next, a sixth embodiment of the present invention will be explained below with reference to FIG. 18. A circuit configuration of the sixth embodiment of the present invention is different from the circuit configuration of the fourth embodiment of FIG. 14 in the point that the timing control circuit 132 is replaced with a timing control circuit 171. The other configuration is identical to that of FIG. 14 and it is therefore not explained.

Figure 18:
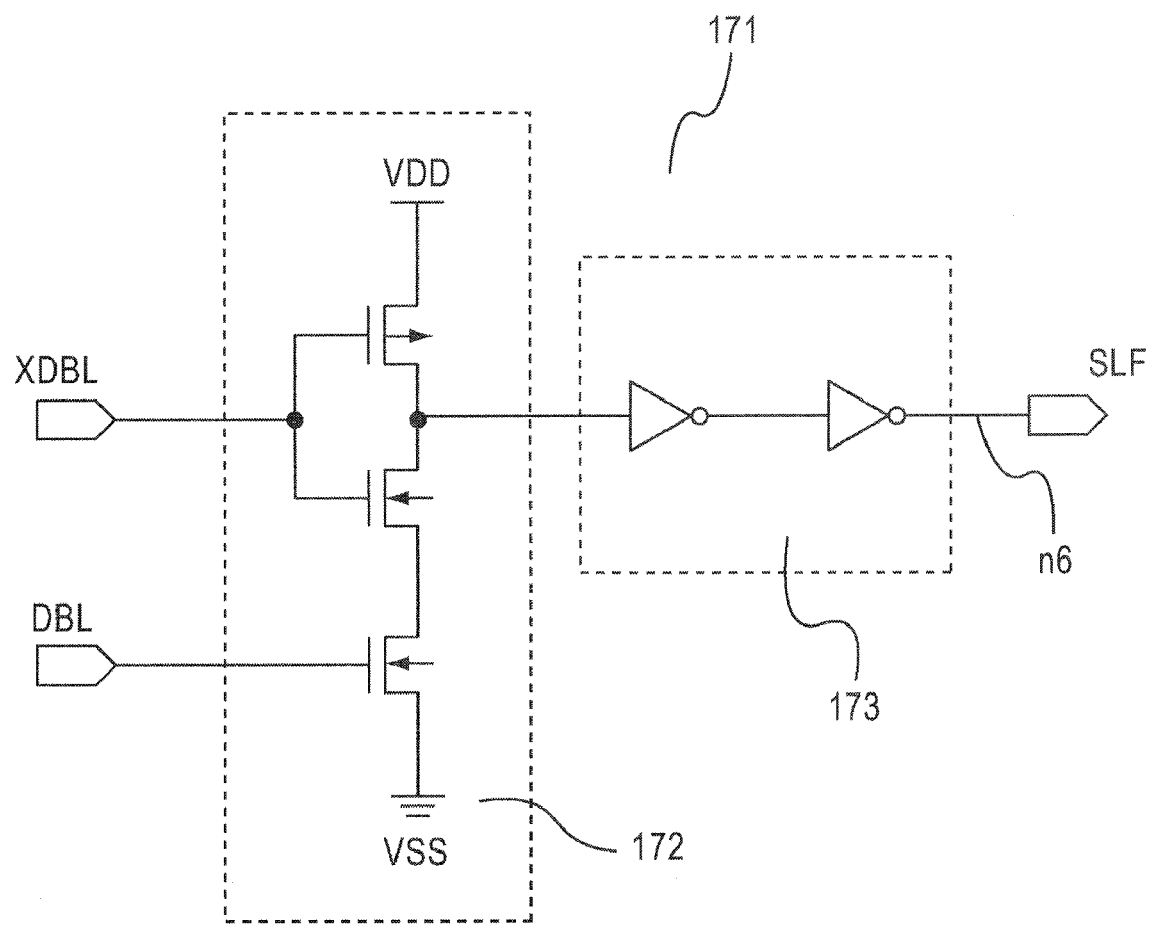
FIG. 18 is a diagram for explaining a sixth embodiment.

FIG. 18 illustrates a circuit configuration of the timing control circuit 171 in the sixth embodiment. The timing control circuit 171 has a configuration to include a delay control unit 172 and an inverter train 173 and to connect in series the delay control unit 172 and the inverter train 173 between the dummy bit line XDBL and the output node n6 of the self-timing signal SLF.

The delay control unit 172 has an inverter configuration where a PMOS transistor 174, an NMOS transistor 175, and NMOS transistor 176 are connected in series between the power supply voltage VDD and the ground VSS. The gates of PMOS transistor 174 and NMOS transistor 175 are connected to the dummy bit line XDBL. The gate of NMOS transistor 176 is connected to the dummy bit line DBL. The delay control unit 172 inputs the dummy bit lines BDL, XDBL and operates responding to that a potential of the dummy bit line XDBL becomes smaller than the predetermined value to activate the self-timing signal SLF with the delay of the predetermined period on the basis of the potential of the dummy bit line DBL.

The self-timing signal SLF is outputted to the input node of the inverter train 173. The inverter train 173 is formed by connecting a plurality of inverters in series This inverter train 173 outputs the self-timing signal SLF to the output node n6 of the self-timing signal by buffering an output from the delay control unit 172.

Operations of the timing control circuit 171 will be explained below. In the delay control unit 172, an inverter circuit for inputting the dummy bit line XDBL is constituted with the PMOS transistor 104 and NMOS transistor 175. Moreover, an NMOS transistor 176 to receive the dummy bit line DBL with the gate is provided between the NMOS transistor 175 and the ground VSS in the inverter circuit. Driving capability of the inverter circuit in the delay control unit 172 changes depending on an ON resistance value of the NMOS transistor 176 and becomes small as the ON resistance value of the NMOS transistor 176 increases.

The ON resistance value of the NMOS transistor 176 changes depending on a potential of the dummy bit line DBL and increases when amount of fall of potential from the precharge level of the dummy bit line DBL increases. Therefore, driving capability of the inverter circuit in the delay control unit 172 changes depending on the potential of the dummy bit line DBL and becomes small as amount of fall of potential from the precharge level of the dummy bit line DBL increases.

Corresponding to above event, amount of delay of signal in the delay control unit 172 increases as amount of fall of potential of the dummy bit line DBL increases. Since amount of fall of potential of the dummy bit line DBL corresponds to amount of the off leak current $I_{leak}$, amount of delay of signal in the delay control unit 172 changes depending on amount of the off leak current $I_{leak}$ of the dummy memory cell for load LDMC and increases as amount of the off leak current $I_{leak}$ increases. Accordingly, the delay control unit 172 activates the self-timing signal SLF and then outputs the same signal in the timing delayed for the period corresponding to amount of the off leak current $I_{leak}$ from the timing when the potential of the input dummy bit line XDBL becomes smaller than the predetermined threshold value voltage.

Therefore, the timing control circuit 171 is capable of delaying activation timing of the self-timing signal SLF for the period depending on amount of the off leak current $I_{leak}$ of the dummy memory cell for load LDMC and is increasing amount of delay of activation timing of the self-timing signal SLF as the amount of off leak current $I_{leak}$ increases.

Accordingly, since activation timing of the sense amplifier drive signal SA can be delayed for the period depending on amount of the off leak current $I_{leak}$ even when the off leas current $I_{leak}$ increases in the sixth embodiment of the present invention, it can be prevented that activation timing of the sense amplifier drive signal SA becomes earlier than the timing when the predetermined potential difference is generated in the bit-line pair BL, XBL of the ordinary memory cell MC and erroneous read of stored data occurs.

Figure 19A:
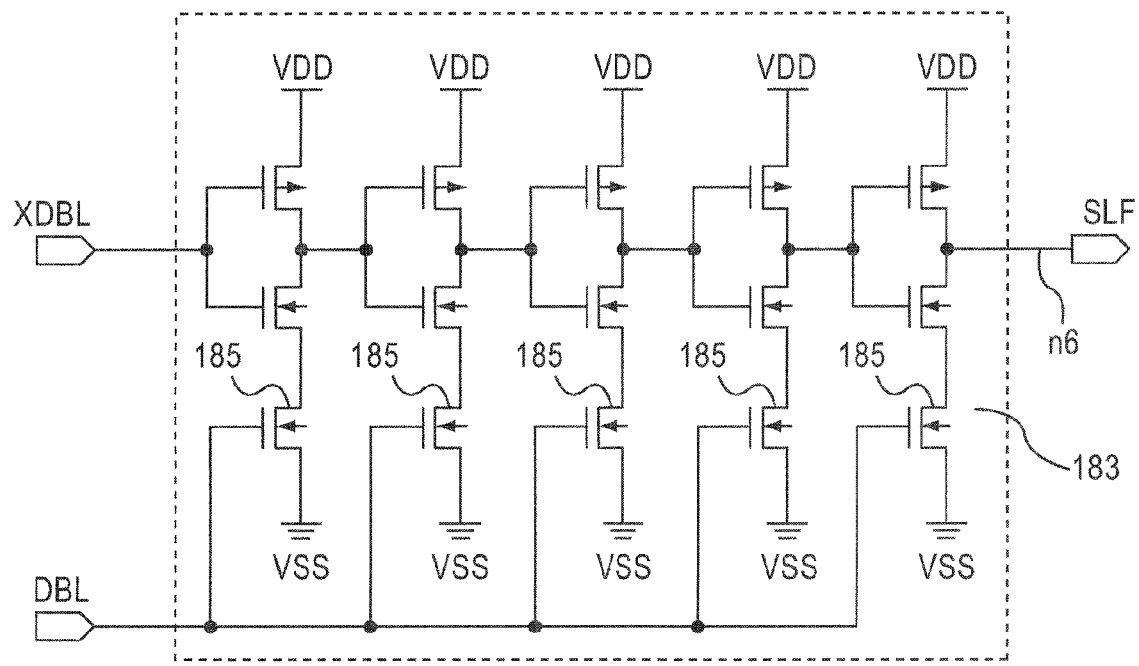
FIG. 19 is a diagram for explaining a seventh embodiment.
Figure 19B:
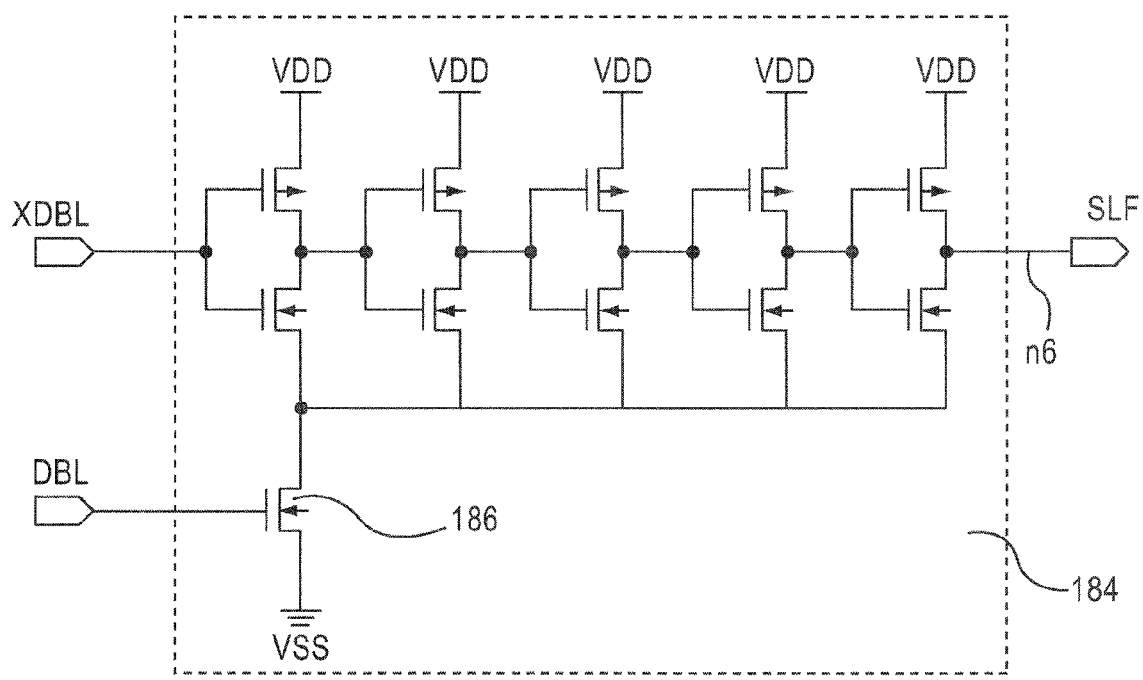

Next, a seventh embodiment of the present invention will be explained with reference to FIG. 19. A circuit configuration of the seventh embodiment of the present invention is different from the circuit configuration of the sixth embodiment of FIG. 18 in the point that the timing control circuit 171 is replaced with timing control circuits 181, 182. The other configuration is identical and is not explained here. FIG. 19(a) illustrates a circuit configuration of the timing control circuit 181 in the seventh embodiment. FIG. 19(b) illustrates a circuit configuration of the timing control circuit 182 in the seventh embodiment.

As illustrated in FIG. 19(a), the timing control circuit 181 includes a delay control unit 183. The delay control unit 183 has a configuration to connect in series a plurality of inverter circuits between the dummy bit line XDBL and the output node n6 of the self-timing signal. Each inverter circuit has a configuration identical to that of the delay control unit 172 of FIG. 18. In each inverter circuit, the gate of NMOS transistor 185 is connected with the dummy bit line DBL.

As illustrated in FIG. 19(b), the timing control circuit 182 includes a delay control unit 184. The delay control unit 184 has a configuration to connect in series a plurality of inverters between the dummy bit line XDBL and the output node n6 of the self-timing signal. Series connection of the inverter circuit has a configuration similar to that of the delay control unit 183 of FIG. 19(b) but it is different in the point that the NMOS transistor 186 connected to the ground VSS is provided in common for a plurality of inverter circuits.

The delay control units 183, 184 input the dummy bit lines BDL, XDBL to operate responding to that a potential of the dummy bit line XDBL becomes smaller than the predetermined value and to activate the self-timing signal SLF with delay for the predetermined period on the basis of the potential of the dummy bit line DBL. The self-timing signal SLF is outputted to the output node n6 of the self-timing signal.

Here, each inverter circuit of the delay control units 183, 184 includes the NMOS transistors 185, 186 for inputting the dummy bit line DBL at the gates thereof as explained above. Therefore, activation timing of the self-timing signal SLF with the delay control units 183, 184 is delayed for the predetermined period on the basis of the potential of the dummy bit line DBL.

The NMOS transistors 185, 186 of the delay control units 183, 184 respectively change, like the delay control unit 172 of FIG. 18, driving capability of the inverter circuit in accordance with the potential of the dummy bit line DBL and reduce such capability as amount of fall of potential from the precharge level of the dummy bit line DBL increases. Accordingly, the delay control units 183, 184 delay activation timing of the self-timing signal for the period depending on amount of the off leak current $I_{leak}$ of the dummy memory cell for load LDMC.

Moreover, since the NMOS transistors 185, 186 are provided for a plurality of inverter circuits connected in series in the delay control units 183, 184, influence on amount of delay in timing with amount of the off leak current $I_{leak}$ is emphasized. Accordingly, amount of delay in timing of the delay control units 183, 184 for the identical amount of the off leak current $I_{leak}$ becomes larger than that of the delay control circuit 172.

Therefore, the timing control circuits 181, 182 can increase amount of delay in the activation timing of the self-timing signal SLF more than that of the timing control circuit 171 for the identical amount of the off leak current $I_{leak}$ of the dummy memory cell for load LDMC. Thereby, even when the off leak current $I_{leak}$ increases, margin of the activation timing of the self-timing signal SLF for the timing to generate the predetermined potential difference in the bit line pair BL, XBL of the ordinary memory cell MC can be increased.

Accordingly, since activation timing of the sense amplifier drive signal SA can be delayed for the period depending on amount of the off leak current $I_{leak}$ and amount of delay in activation timing of the sense amplifier drive signal SA can be increased in the seventh embodiment of the present invention even when the off leak current $I_{leak}$ increases, erroneous read of the stored data can be prevented by increasing the read margin of the stored data of the ordinary memory cell MC.

Since the NMOS transistor inputting the dummy bit line DBL is provided in common for a plurality of inverter circuits in the timing control circuit 182 of FIG. 19(b) scale of the circuit can be reduced in comparison with that of the timing control circuit 181 of FIG. 19(a).

Figure 20A:
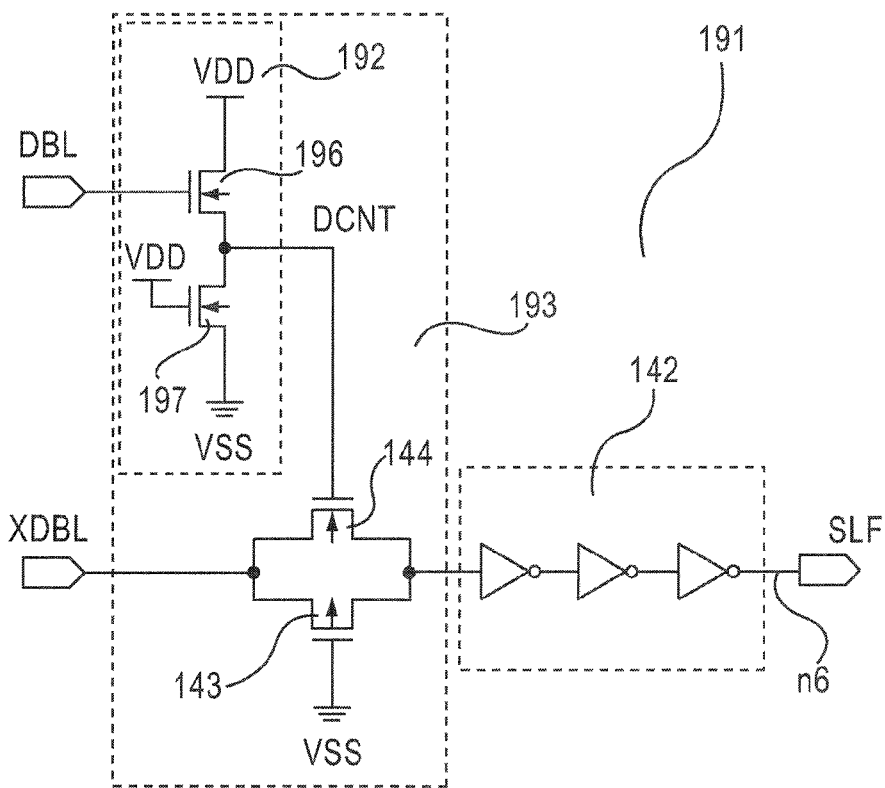
FIG. 20 is a diagram for explaining an eighth embodiment.
Figure 20B:
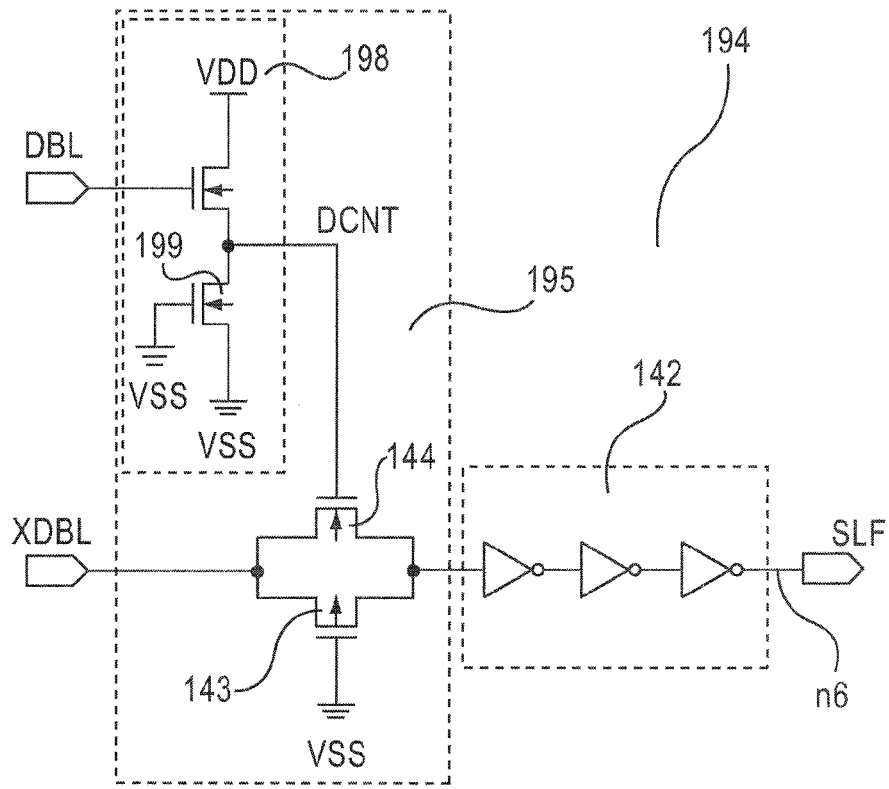

Next, an eighth embodiment of the present invention will be explained with reference to FIG. 20. A circuit configuration of the eighth embodiment of the present invention is different from the circuit configuration of the fourth embodiment of FIG. 15 in the point that the timing control circuit 132 is replaced with a timing control circuit 191 or 194. The other configuration is identical and it is not explained here. FIG. 20(a) illustrates a circuit configuration of the timing control circuit 191 in the eighth embodiment. FIG. 20(b) illustrates a circuit configuration of the timing control circuit 194 in the eighth embodiment.

As illustrated in FIG. 20(a), the timing control circuit 191 is different from the circuit configuration of the timing control circuit 132 of FIG. 15 in the point that the delay control unit 141 is replaced with a delay control unit 193. The other configuration is identical and it is therefore not explained.

The delay control unit 193 includes a transfer gate constituted with a PMOS transistor 143 and an NMOS transistor 144 with the sources and drains connected with each other. The PMOS transistor 143 is connected to the ground VSS at the gate thereof and is turned ON. The gate of the NMOS transistor 144 inputs the delay control signal DCNT outputted from a delay control signal generating unit 192.

The delay control signal generating unit 192 has a configuration where an NMOS transistor 196 and an NMOS transistor 197 are connected in series between the power supply voltage VDD and the ground VSS. The gate of NMOS transistor 196 is connected to the dummy bit line DBL. The NMOS transistor 197 is connected to the power supply voltage VDD at the gate thereof and is always turned ON. The delay control signal generating unit 192 outputs the delay control signal DCNT from a connecting node of the NMOS transistor 196 and the NMOS transistor 197. The delay control unit 193 inputs the dummy bit lines DBL, XDBL to output a potential of the dummy bit line XDBL to the input node of the inverter train 142 with delay of the predetermined period on the basis of the potential of the dummy bit line DBL.

As illustrated in FIG. 20(b), the timing control circuit 194 is different from the circuit configuration of the timing control circuit 191 of FIG. 20(a) in the point that the delay control signal generating unit 192 in the delay control unit 193 is replaced with a delay control signal generating unit 198 in a delay control unit 195. The other configuration is identical and therefore it is not explained. A delay control signal generating unit 205 has a configuration where an NMOS transistor 197 is replaced with a PMOS transistor 199 for the circuit configuration of the delay control signal generating unit 192. The PMOS transistor 206 is connected to the ground VSS and is always turned ON.

Operations of the timing control circuits 192, 194 will be explained below. In the delay control signal generating units 192, 198, the dummy bit line DBL is connected to the gate of the NMOS transistor 196. Therefore, an ON resistance value of the NMOS transistor 196 changes depending on a potential of the dummy bit line DBL and becomes larger as amount of fall of the potential from the precharge level (H level) of the dummy bit line DBL increases.

Therefore, a potential of the connecting node of the NMOS transistor 196 and NMOS transistor 197 in the delay control signal generating unit 192 and a potential of the connecting node of the NMOS transistor 196 and PMOS transistor 199 in the delay control signal generating unit 198 become lower as amount of fall of potential from the precharge level of the dummy bit line DBL increases. Namely, a level of the delay control signal DNT is lowered as amount of fall of potential from the precharge level of the dummy bit line DBL increases. Amount of fall of potential of the dummy bit line DBL corresponds to amount of the off leak current $I_{leak}$ and therefore level of the delay control signal DCNT becomes lower as amount of the off leak current $I_{leak}$ increases.

Here, the delay control signal DCNT is inputted to the gate of the NMOS transistors 144 of the delay control units 193, 195. Therefore, the ON resistance value of the NMOS transistor 144 increases as amount of the off leak current $I_{leak}$ increases. Corresponding to above event, amount of delay in the signal of the delay control units 193, 195 changes depending on amount of the off leak current $I_{leak}$ of the dummy memory cell for load LDMC and increases in accordance with increase in the off leak current $I_{leak}$.

Accordingly, the timing control circuits 191, 194 are capable of delaying, like the self-timing circuit 132 of FIG. 15, activation timing of the self-timing signal SLF for the period depending on amount of the off leak current $I_{leak}$ of the dummy memory cell for load LDMC and also increasing amount of delay of activation timing of the self-timing signal SLF as amount of the off leak current $I_{leak}$ increases.

Therefore, since activation timing of the sense amplifier drive signal SA can be delayed for the period corresponding to amount of the off leak current $I_{leak}$ even when the off leak current $I_{leak}$ increases in the eighth embodiment of the present invention, erroneous read of the stored data of the ordinary memory cell MC can be prevented.

Moreover, in the timing control circuits 191, 194, the dummy bit line DBL is not inputted in direct, unlike the timing control circuit 132 of FIG. 15, to the gate of the NMOS transistor 144. However, the delay control signal DCNT is generated with the delay control signal generating units 192, 198 on the basis of a potential of the dummy bit line DBL and is then inputted to the gate of the NMOS transistor 144. Therefore, amount of fall of potential of the dummy bit line DBL can be increased in the delay control signal generating units 192, 198 and the amplified result can be inputted to the gate of the NMOS transistor 144 as the delay control signal DCNT.

Accordingly, the timing control circuits 191, 194 can provide amount of delay of activation timing of the self-timing signal SLF which is larger than that of the timing control circuit 132 for the identical amount of the off leak current $I_{leak}$ of the dummy memory cell for load LDMC. Therefore, margin of activation timing of the self-timing signal SLF for the timing to generate the predetermined potential difference in the bit line pair BL, XBL of the ordinary memory cell MC can be increased in the eighth embodiment of the present invention even when the off leak current $I_{leak}$ increases. Thereby, erroneous read can be prevented more reliably by increasing the read margin of the stored data.

Figure 21A:
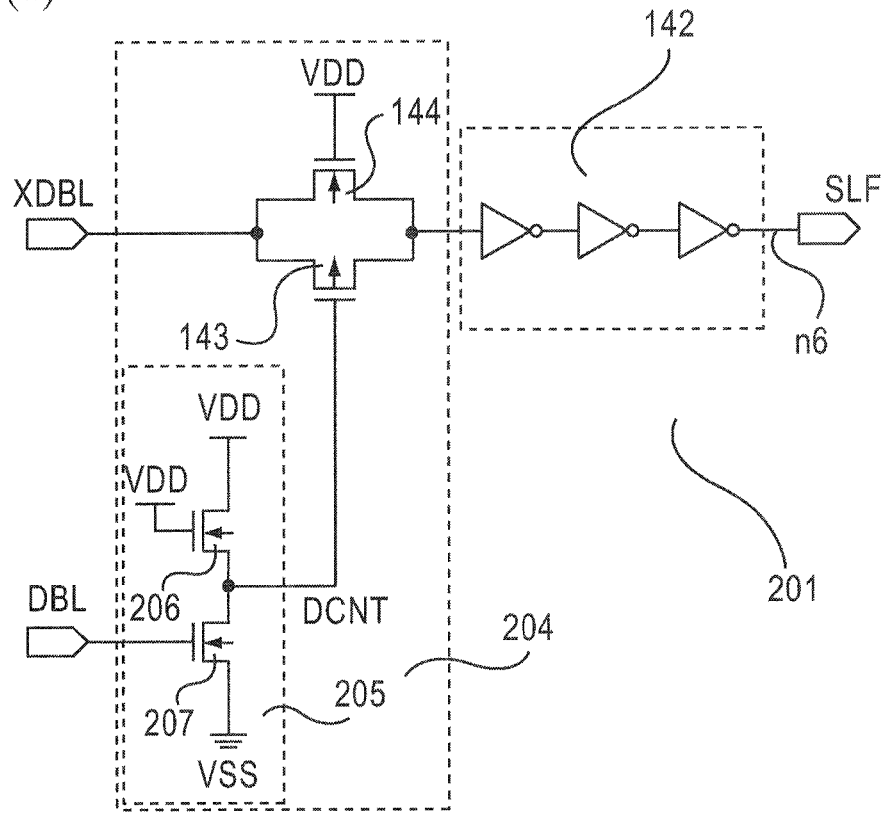
FIG. 21 is a diagram for explaining a ninth embodiment.
Figure 21B:
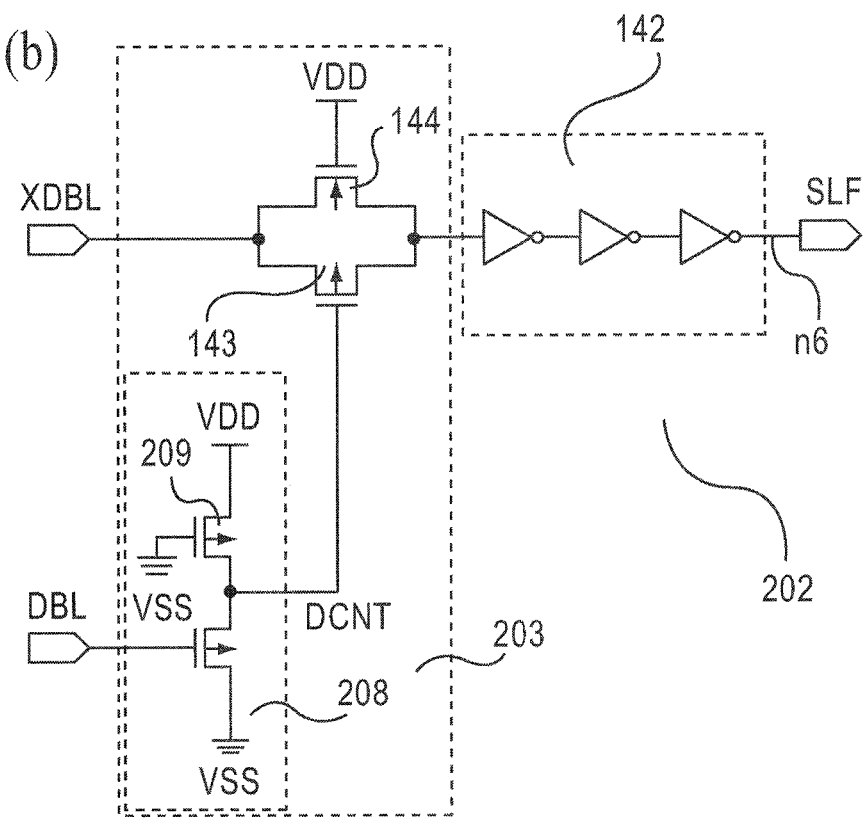
Figure 22:
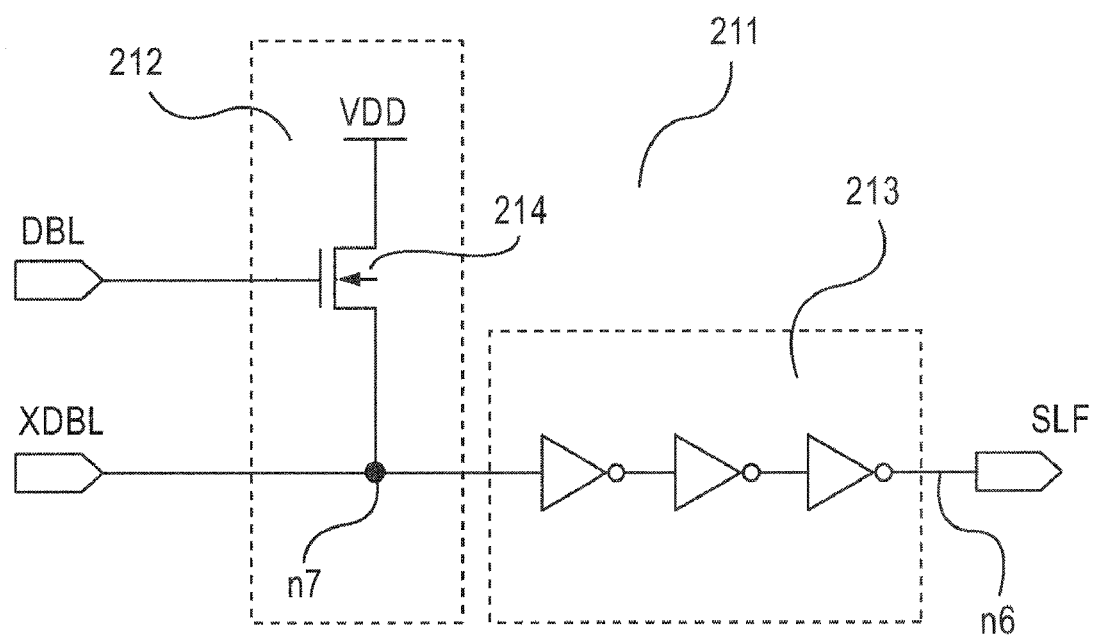
FIG. 22 is a diagram for explaining a tenth embodiment.

Next, a ninth embodiment of the present invention will be explained below with reference to FIG. 21. A circuit configuration of the ninth embodiment of the present invention is different from the circuit configuration of the fourth embodiment of FIG. 15 in the point that the timing control circuit 132 is replaced with a timing control circuit 201 or 202. The other configuration is identical and it is not explained here. FIG. 21(a) illustrates a circuit configuration of the timing control circuit 201 in the ninth embodiment. FIG. 21(b) illustrates a circuit configuration of the timing control circuit 202 in the ninth embodiment.

As illustrated in FIG. 21(a), the timing control circuit 201 is different from the circuit configuration of the timing control circuit 132 of, FIG. 15 in the point that the delay control unit 141 is replaced with a delay control unit 204. The other configuration is identical and it is not explained here.

The delay control unit 204 includes a transfer gate formed of a PMOS transistor 143 and an NMOS transistor 144 with the sources and drains connected with each other. The NMOS transistor 144 is connected to the ground VSS at the gate thereof and is always turned ON. The delay control signal DCNT outputted from the delay control signal generating unit 205 is inputted to the gate of the PMOS transistor 143.

The delay control signal generating unit 205 has a configuration that the NMOS transistor 205 and the NMOS transistor 207 are connected in series between the power supply voltage VDD and the ground VSS. The gate of NMOS transistor 207 is connected to the dummy bit line DBL and the gate of the NMOS transistor 206 is connected to the power supply voltage VDD and is always turned ON. The delay control signal generating unit 205 outputs the delay control signal DCNT from a connecting node of the NMOS transistor 206 and NMOS transistor 207. The delay control unit 204 inputs the dummy bit lines DBL, XDBL and outputs the potential of the dummy bit line XDBL to the input node of the inverter train 142 by delaying the potential only for the predetermined period on the basis of the potential of the dummy bit line DBL.

As illustrated in FIG. 21(b), the timing control circuit 202 is different from the circuit configuration of the timing control circuit 201 of FIG. 21(a) in the point that the delay control signal generating unit 205 in the delay control unit 204 is replaced with a delay control signal generating unit 208 in the delay control unit 203. The other configuration is identical and it is not explained here. The delay control signal generating unit 208 has a configuration that the NMOS transistor 206 is replaced with a PMOS transistor 209 for the circuit configuration of the delay control signal generating unit 205. The PMOS transistor 209 is connected to the ground VSS at the gate thereof and is always turned ON.

Operations of the timing control circuits 201, 202 will be explained below. In the delay control signal generating units 205, 208, the dummy bit line DBL is connected to the gate of the NMOS transistor 207. Therefore, an ON resistance value of the NMOS transistor 207 changes depending on a potential of the dummy bit line DBL and increases as amount of fall of potential from the precharge level (H level) of the dummy bit line DBL increases.

Accordingly, potential of the connecting node of the NMOS transistor 206 and NMOS transistor 207 in the delay control signal generating unit 205 and the connecting node of the PMOS transistor 209 and NMOS transistor 207 in the delay control signal generating unit 208 become high as amount of fall of potential from the precharge level of the dummy bit line DBL increases. Namely, level of the delay control signal DNT rises as amount of fall of potential from the precharge level of the dummy bit line DBL increases. Since amount of fall of potential of the dummy bit line DBL corresponds to amount of the off leak current $I_{leak}$, level of the delay control signal DCNT rises as amount of the off leak current $I_{leak}$ increases.

Here, the delay control signal DCNT is inputted to the gate of the PMOS transistor 143 of the delay control units 203, 204. Therefore, an On resistance value of the PMOS transistor 144 increases as amount of the off leak current $I_{leak}$ increases. Corresponding to above event, amount of delay of signal in the delay control units 203, 204 changes depending on amount of the off leak current $I_{leak}$ of the dummy memory cell for load LDMC and also increases as amount of the off leak current $I_{leak}$ increases.

Accordingly, like the timing control circuit 132 of FIG. 15, the timing control circuits 201, 202 are capable of delaying activation timing of the self-timing signal SLF for the period depending on amount of the off leak current $I_{leak}$ of the dummy memory cell for load LDMC and is also increasing amount of delay in activation timing of the self-timing signal as amount of the off leak current $I_{leak}$ increases.

Therefore, in the ninth embodiment of the present invention, since activation timing of the sense amplifier drive signal SA can be delayed only for the period depending on amount of the off leak current $I_{leak}$ even when the off leak current $I_{leak}$ increases, erroneous read of stored data of the ordinary memory cell MC can be prevented.

Moreover, the timing control circuits 201, 202 generate the delay control signal DCNT with the delay control signal generating units 192, 198 on the basis of the potential of the dummy bit line DBL and also input the delay control signal DCNT to the gate of the PMOS transistor 143. Therefore, amount of fall of potential of the dummy bit line DBL can be amplified in the delay control signal generating units 205, 208 and the amplified result can be inputted as the delay control signal DCNT to the gate of the PMOS transistor 143.

Accordingly, the timing control circuits 201, 202 can provide larger amount of delay of activation timing of the self-timing signal SLF than that of the timing control circuit 132 for the identical amount of the off leak current $I_{leak}$ of the dummy memory cell for load LDMC. Therefore, in the ninth embodiment of the present invention, margin of activation timing of the self-timing signal SLF for the timing to generate the predetermined potential difference in the bit line pair BL, XBL of the ordinary memory cell MC can be increased even when the off leak current $I_{leak}$ increases, and thereby erroneous read of the stored data can surely be prevented by increasing the read margin of the stored data.

Next, a tenth embodiment of the present invention will be explained below. A circuit configuration of the tenth embodiment of the present invention is different from the circuit configuration of the fourth embodiment of FIG. 15 in the point that the timing control circuit 132 is replaced with a timing control circuit 211. The other configuration is identical and it is not explained here.

The timing control circuit 211 has a configuration to include a delay control unit 212 and an inverter train 213 and to connect in series the delay control unit 212 and the inverter train 213 between the dummy bit line XDBL and the output node n6 of the self-timing signal SLF.

The delay control unit 212 inputs the dummy bit lines BDL, XDBL and outputs a potential of the dummy bit line XDBL with delay of only the predetermined period on the basis of the potential of the dummy bit line DBL. The inverter train 213 is formed of a plurality of inverters connected in series and inputs an output signal from the delay control unit 212 to activate the self-timing signal SLF responding to that a potential of the output signal becomes smaller than the predetermined value.

The delay control unit 212 includes a PMOS transistor 214 provided between an input node n7 of the inverter train 213 and the power supply voltage VDD. The dummy bit line XDBL is connected to the gate of the PMOS transistor 214 and an ON resistance value thereof is reduced as amount of fall of potential from the precharge level (H level) of the dummy bit line DBL increases. Therefore, amount of current flowing into the input node n7 of the inverter train via the PMOS transistor 214 increases as amount of fall of potential of the dummy bit line DBL increases.

Since amount of fall of potential of the dummy bit line DBL corresponds to amount of the off leak current $I_{leak}$, amount of current flowing into the input node n7 of the PMOS transistor 214 increases as amount of the off leak current $I_{leak}$ increases. Thereby, a potential of the input node n7 is pulled up, with the PMOS transistor 214, to the H level in the intensity depending on amount of the off leak current $I_{leak}$ and it is pulled up more intensely depending on increase in amount of the off leak current $I_{leak}$.

After selection of the dummy word line DWL, a potential of the input node n7 is pulled down to the L level responding to fall of the dummy bit line XDBL to the L level. Simultaneously, the potential of the input node n7 is pulled up to the H level in the intensity depending on amount of the off leak current $I_{leak}$ of the dummy memory cell for load LDMC with the PMOS transistor 214 as explained above. As a result, lowering rate of the potential of the input node n7 becomes slow depending on amount of the off leak current $I_{leak}$. Corresponding to above event, activation timing of the self-timing signal SLF with the inverter train 213 delayed only for the period depending on amount of the off leak current $I_{leak}$.

Therefore, the timing control circuit 211 is capable of delaying activation timing of the self-timing signal SLF only for the period depending on amount of the off leak current $I_{leak}$ and also increasing amount of delay of activation timing of the self-timing signal SLF depending on increase in the off leak current $I_{leak}$. Accordingly, since activation timing of the sense amplifier drive signal SA can be delayed only for the period depending on amount of the off leak current $I_{leak}$ even when the off leak current $I_{leak}$ increases in the tenth embodiment of the present invention, erroneous read of stored data of the ordinary memory cell MC can be prevented.

Moreover, since the delay control unit can be formed only with one PMOS transistor and scale of circuit can also be reduced in the tenth embodiment, the scale of circuit of the timing control circuit can be reduced in comparison with that of the fourth to tenth embodiments explained above.

In the fourth to tenth embodiments explained above, amount of delay of activation timing of the self-timing signal SLF has been controlled using only a dummy bit line pair DBL, XDBL. However, the present invention is never restricted to such configuration. It is also possible to employ the configuration that the dummy bit line driven only with the dummy memory cell for self-timing and the dummy bit line driven only with the off leak current $I_{leak}$ of the dummy memory cell for load LDMC are provided independently and amount of delay of activation timing of the self-timing signal SLF is controlled using these two dummy bit lines.

Figure 23:
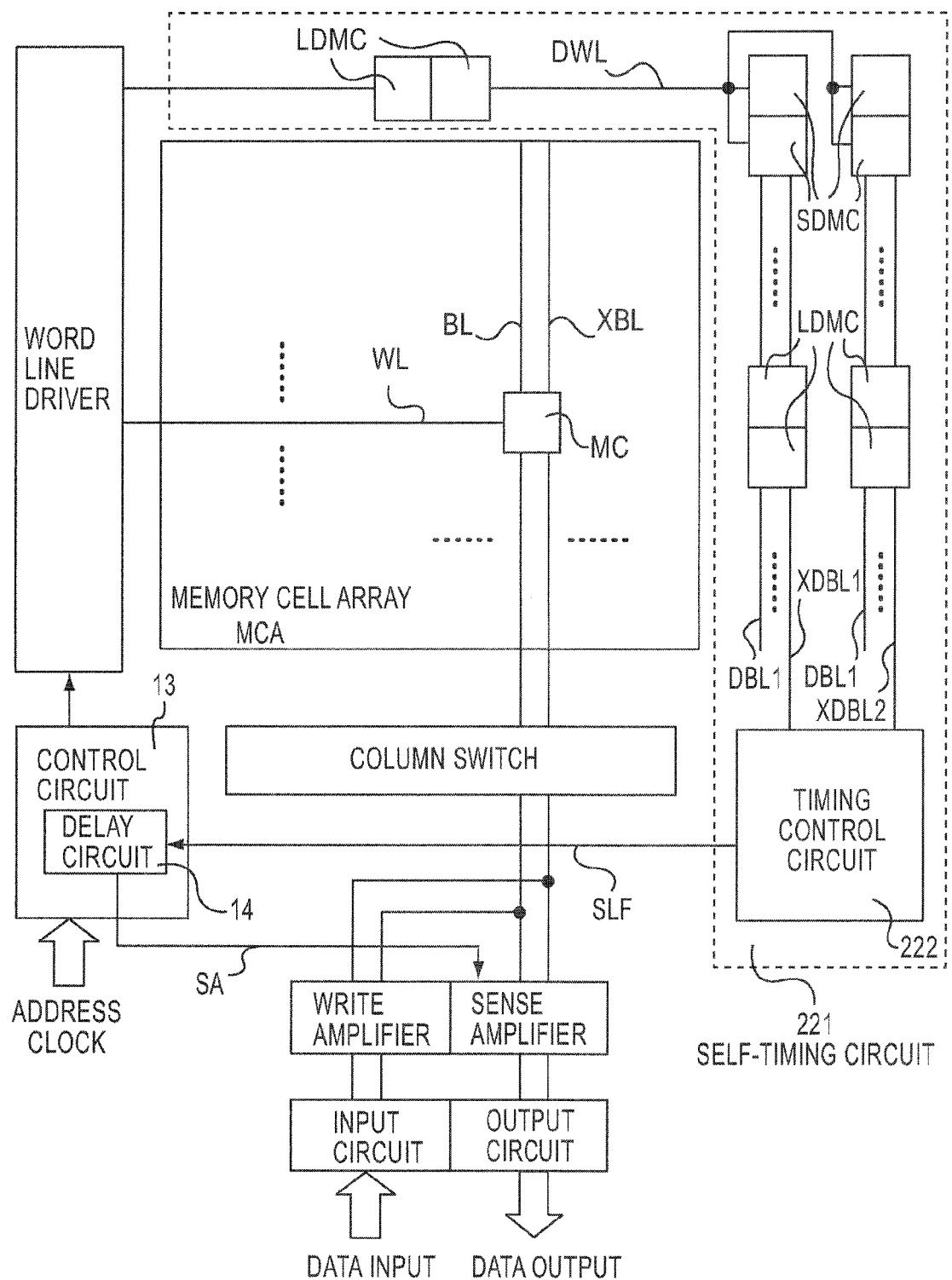
FIG. 23 is a schematic configuration diagram showing an eleventh diagram.

FIG. 23 is a schematic configuration diagram showing an eleventh embodiment. An SRAM illustrated in FIG. 23 is includes a self-timing circuit as the circuit for generating the sense amplifier drive signal for driving a sense amplifier circuit. A circuit configuration of SRAM shown in FIG. 23 is different from the existing circuit configuration of FIG. 1 in the point that the self-timing circuit 11 is replaced with a self-timing circuit 221. The other configuration is identical and it is not explained here.

The self-timing circuit 221 of FIG. 23 includes two pairs of dummy bit line pair DBL1, XDBL1 and DBL2, XDBL2. Each dummy bit line pair includes, like the self-timing circuit 11 of FIG. 1, at least one dummy memory cell for self-timing SDMC and a plurality of dummy memory cells for load LDMC.

The stored data of the dummy memory cell for self-timing SDMC connected to each dummy bit line pair is set, like the existing setting pattern illustrated in FIG. 3, to set the connecting node n1 of the inverter pair in the dummy memory cell to the H level, while the connecting node n2 to the L level. In each dummy bit line pair, as the dummy memory cell for self-timing SDMC, for example, a plurality of dummy memory cells are sequentially designated from the furthest position of the timing control circuit 222 on the dummy bit line.

The dummy bit line XDBL1 of the first dummy bit line pair DBL1, XDBL1 is connected to the timing control circuit 222 as the dummy bit line of detection object. The dummy bit line XDBL2 of the second dummy bit line pair DBL2, XDBL2 is connected to the timing control circuit 222 as the dummy bit line of detection object. The timing control circuit 222 inputs the dummy bit lines XDBL1, XDBL2 and outputs the self-timing signal SLF on the basis of the detection result of the dummy bit lines XDBL1, XDBL2.

Each dummy memory cell for self-timing SDMC of the dummy bit line pairs DBL1, XDBL1 and DBL2, XDBL2 is connected to the common dummy word line DWL. With selection of the dummy word line DWL, all dummy memory cells for self-timing SDMC are simultaneously selected to drive the dummy bit line pairs DBL1, XDBL1 and DBL2, XDBL2, simultaneously. Accordingly, each dummy bit line pair driven generates the predetermined potential difference.

Figure 24:
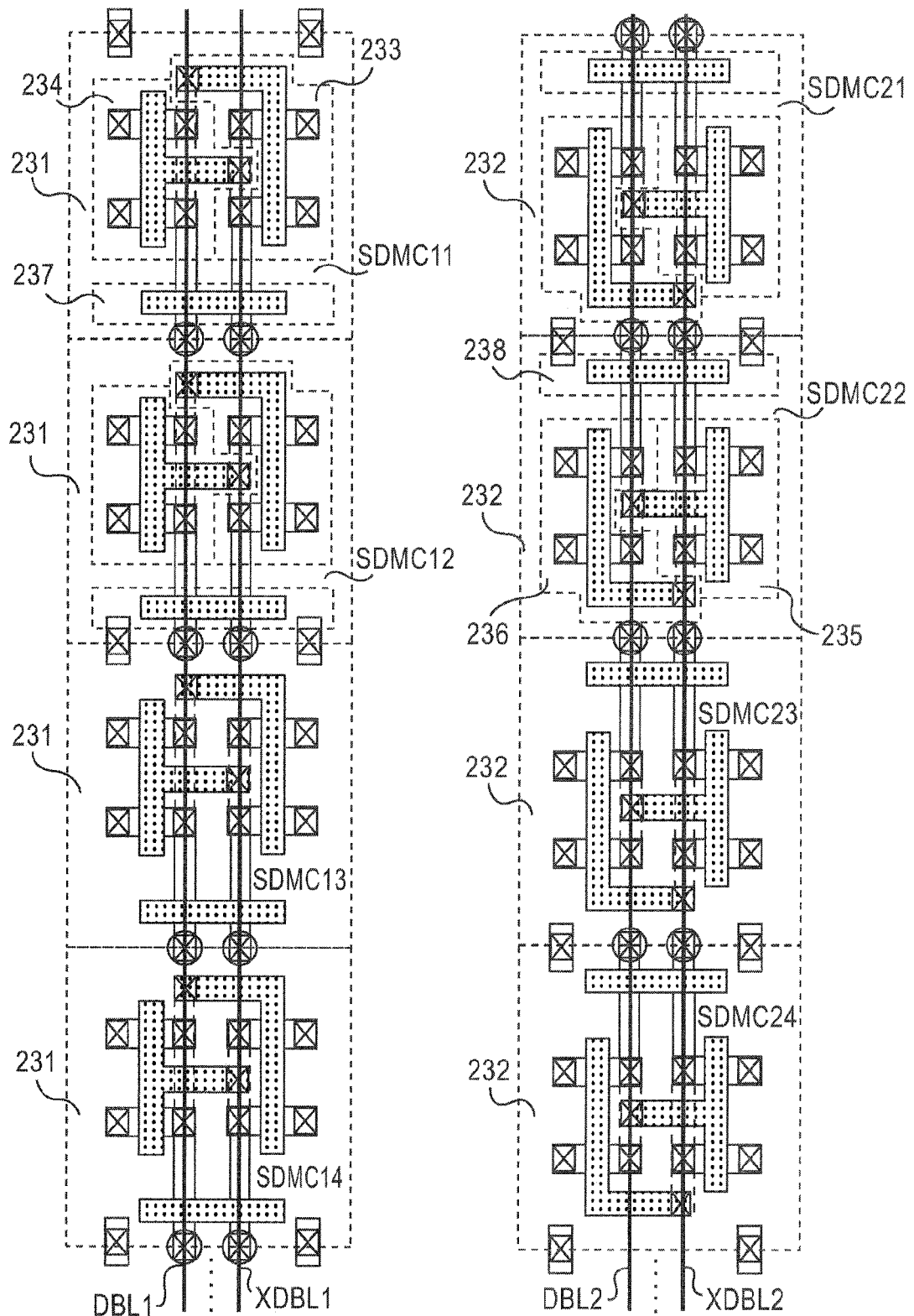
FIG. 24 is a diagram showing a layout example of dummy memory cell in each dummy bit line pair of the self-timing circuit of the eleventh embodiment.

FIG. 24 illustrates a layout example of the dummy memory cells SDMC, LDMC in the dummy bit line pairs DBL1, XDBL1 and DBL2, XDBL2 of the self-timing circuit 221. Each dummy memory cell SDMC, LDMC is provided in a layout that a part formed of the inverter pair and transfer transistor pair is defined as one unit.

The dummy memory cell for self-timing SDMC in the first dummy bit line pair DBL1, XDBL1 is provided in a layout that at least one ordinary layout unit 231 formed of the inverters 233, 234 and transfer transistor pair 237 is arranged along the dummy bit line pair DBL1, XDBL1.

Meanwhile, the dummy memory cell for self-timing SDMC in the second dummy bit line pair DBL2, XDBL2 is provided in the layout that at least one symmetrical layout unit 232 formed of the inverters 235, 236 and transfer transistor pair 238, which is point symmetrical or line symmetrical to the ordinary layout unit 231, is arranged along the dummy bit line pair DBL2, XDBL2.

The dummy memory cell for load LDMC (not illustrated) in each dummy bit line pair is given the layout by the ordinary layout unit or symmetrical layout unit and the desired layout can be selected freely. For example, in each dummy bit line pair, the dummy memory cell for load LDMC has a layout, like the dummy memory cell of the related art illustrated in FIG. 5, that the ordinary layout unit 231 and the symmetrical layout unit 232 are alternately arranged along the dummy bit line pair. Otherwise, it is also possible that all dummy memory cells for load LDMC are given the layout with any one of the ordinary layout unit 231 and symmetrical layout unit 232 in each dummy bit line pair.

In the figure, the gates of transfer transistor pair 237, 238 of dummy memory cell for self-timing SDMC 11 to 14, 21 to 24 are connected to the common dummy word line DWL not illustrated. The gate of transfer transistor pair of dummy-memory cell for load LDMC (not illustrated) in each dummy bit line pair is connected to the ground VSS.

Moreover, in the figure, the white region shows an impurity diffusing layer on a semiconductor wafer, while the hatched region shows a gate polysilicon layer formed on the semiconductor wafer. A broken line shows a local wire within a memory cell, while thick lines show the bit lines DBL, XDBL, and a circular mark shows a contact with the dummy bit line. Moreover, as is understood from FIG. 23, in each of the ordinary layout unit 231 and symmetrical layout unit 232, layouts of two inverters forming an inverter pair are not line symmetrical with each other.

Figure 25:
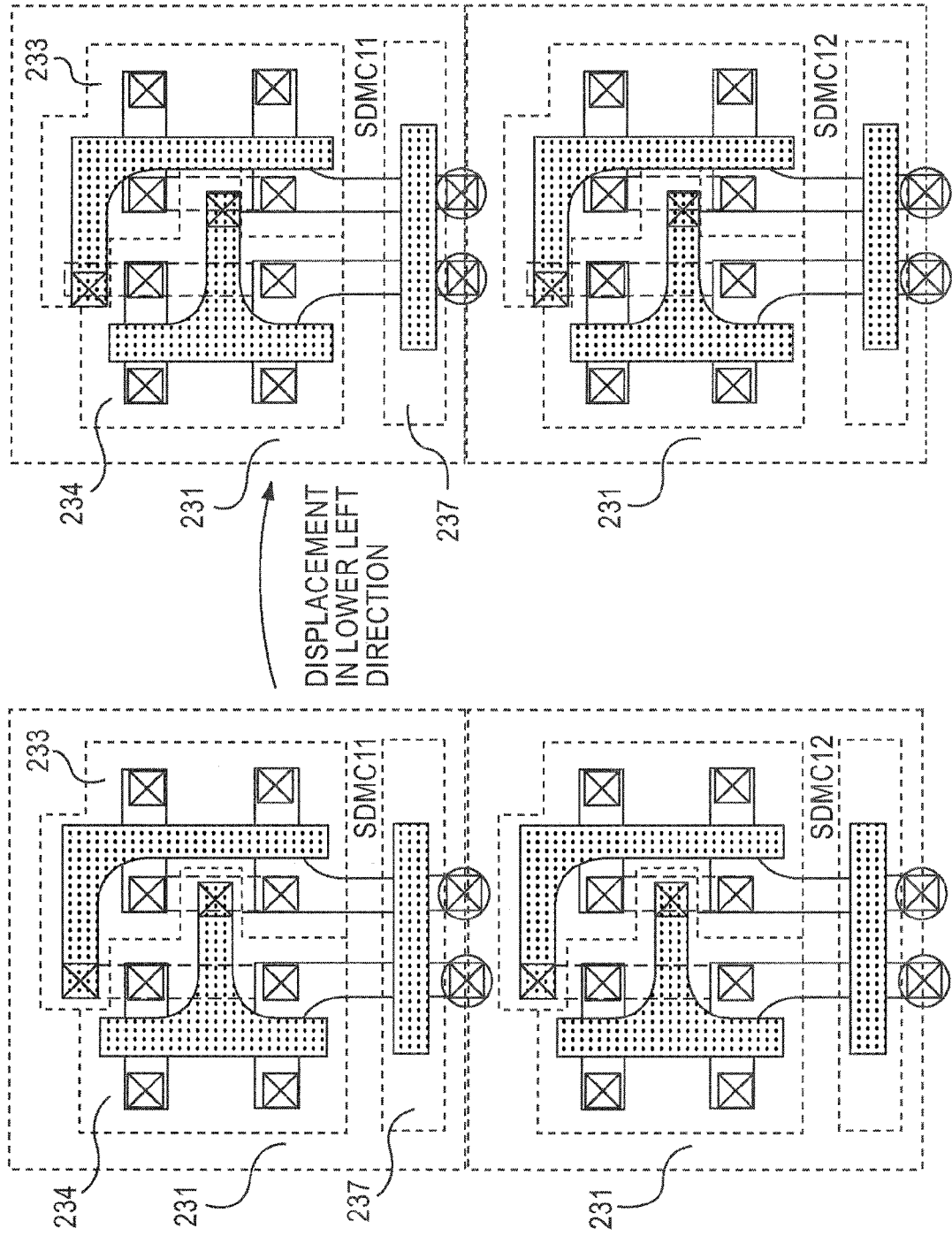
FIG. 25 is a diagram showing a layout when the gate polysilicon layer is deviated as a whole in the lower left direction for the impurity diffusing layer in the layout example of the eleventh embodiment.
Figure 26:
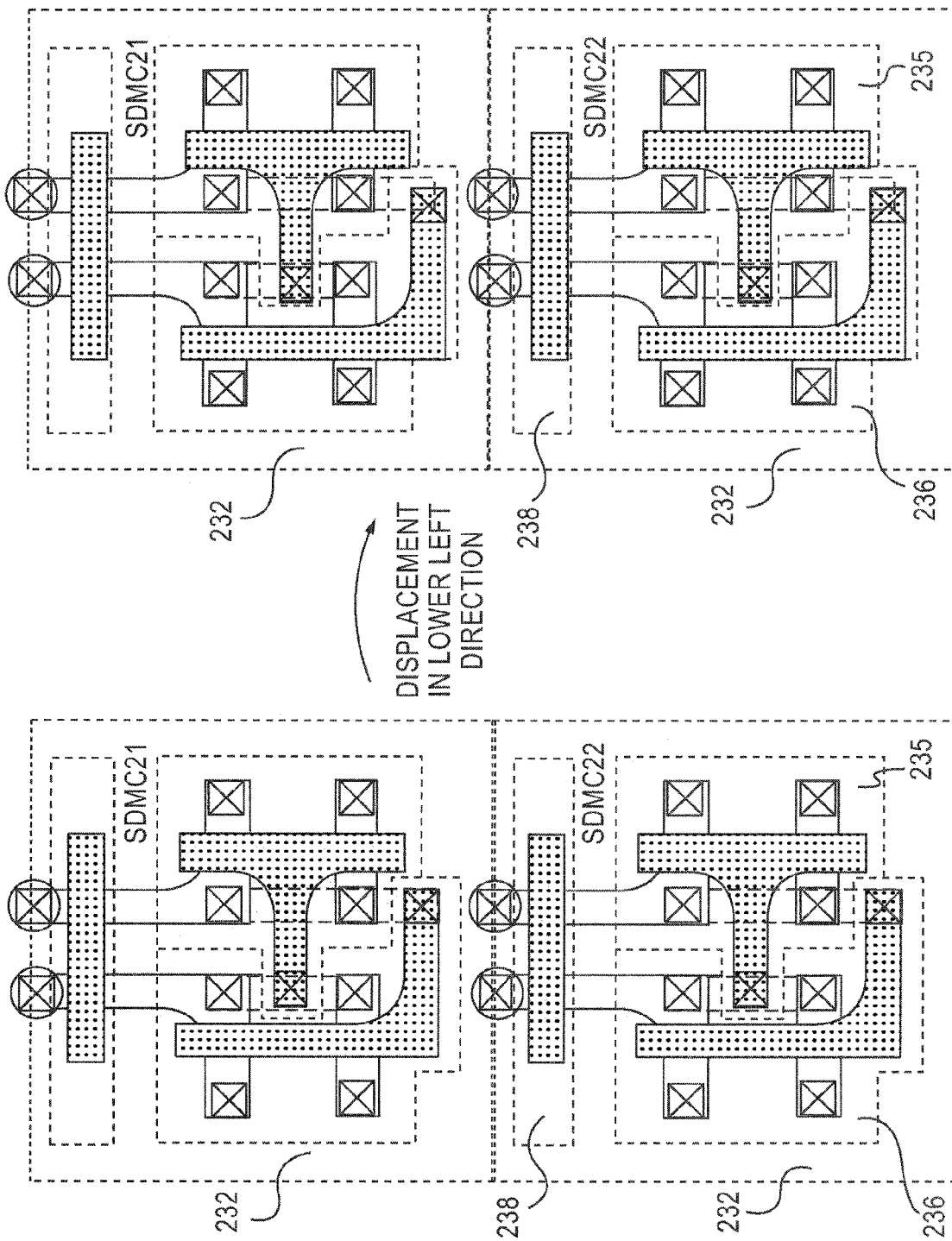
FIG. 26 is a diagram showing a layout when the gate polysilicon layer is deviated as a whole in the lower left direction for the impurity diffusing layer in the layout example of the eleventh embodiment.

Here, it is considered here that displacement occurs between impurity diffusing layer and gate polysilicon layer during the photoetching process of the manufacturing process in the layout example of the dummy memory cells SDMC, LDMC in FIG. 23. FIG. 25 and FIG. 26 illustrate the layouts wherein the gate polysilicon layer as a whole is displaced in the lower left direction in the figure for the impurity diffusing layer.

As illustrated in FIG. 25 and FIG. 26, actual finished shape is rounded at the corner area of the impurity diffusing layer and gate polysilicon layer. Therefore, when the displacement in the lower left direction of the figure is generated as explained above, difference is generated in driving capability among the inverters forming the inverter pair in the dummy memory cells SDMC 11 to 14 having the ordinary layout unit 231 in the first dummy bit line pair DBL1, XDBL1 and in the dummy memory cells SDMC 21 to 24 having the symmetrical layout unit 232 in the second dummy bit line pair DBL2, XDBL2.

In more detail, in the dummy memory cells SDMC 11 to 14 having the ordinary layout unit 231, characteristics of the inverters 233, 234 change as follows, like the dummy memory cell SDMC1 of FIG. 5, resulting from displacement in the lower left direction as illustrated in FIG. 25. Namely, in the left side inverter 234, channel length becomes short in the upper side transistor, while channel length becomes long and channel width becomes narrow in the lower side transistor. Meanwhile, in the right side inverter 233, channel length becomes long in the upper side transistor, while channel width becomes wide in the lower side transistor.

On the other hand, in the dummy memory cells SDMC 21 to 24 having the symmetrical layout unit 232 as illustrated in FIG. 26, characteristics of the inverters change as follows, like the dummy memory cell SDMC2, resulting from displacement in the lower left direction. Namely, in the left side inverter 236, channel width becomes narrow in the upper transistor and channel length becomes short in the lower transistor. Moreover, in the right side inverter 236, channel length becomes short in the upper side transistor and channel width becomes wide, while channel length becomes long in the lower side transistor.

As explained above, because of displacement, difference is generated in driving capability among the four inverters 233 to 236 forming the inverter pair of the dummy memory cells SDMC 11 to 14 having the ordinary layout unit 231 and the dummy memory cells SDMC 21 to 24 having the symmetrical layout unit 232. As a result, difference is generated in driving capability, in accordance with displacement, among the dummy memory cells SDMC 11 to 14 having the ordinary layout unit 231 and the dummy memory cells SDMC 21 to 24 having the symmetrical layout unit 232. Corresponding to above event, difference is also generated in accordance with displacement in driving capability for the dummy bit lines XDBL1 and XDBL2.

Figure 27:
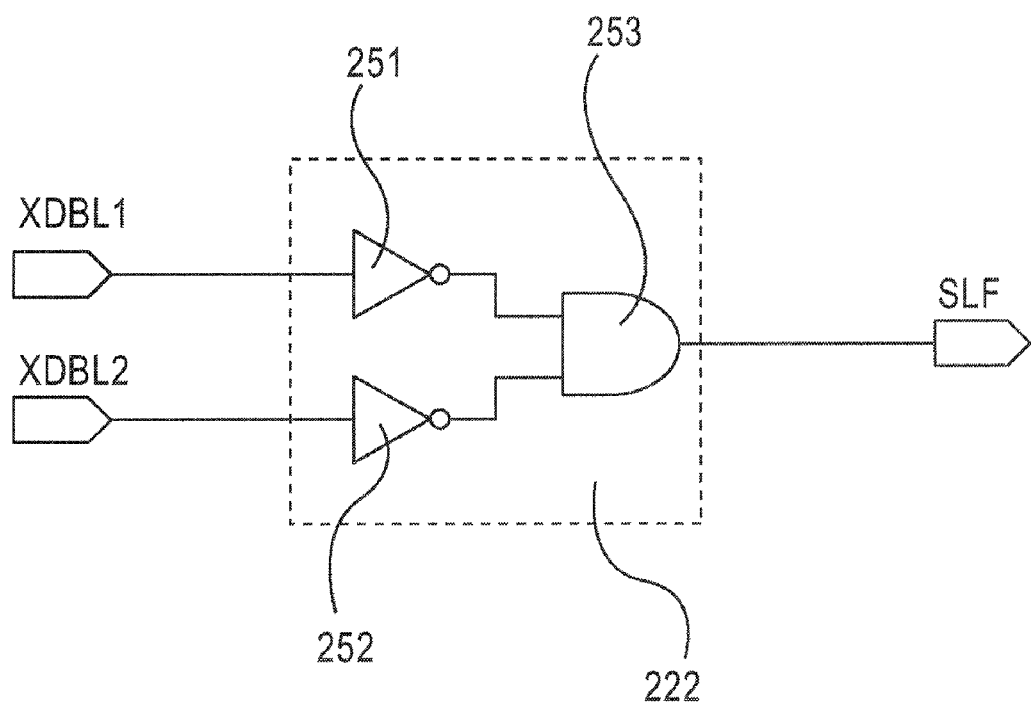
FIG. 27 is a schematic diagram of a circuit configuration of the timing control circuit of the eleventh embodiment.

FIG. 27 is a schematic diagram of a circuit configuration of the timing control circuit 222 of FIG. 23. As illustrated in FIG. 27, the timing control circuit 222 includes the inverters 251, 252, and an AND circuit 253. The inverters 251, 252 have, for example, identical threshold value voltage.

The inverter 251 inputs the dummy bit line XDBL1 and outputs the H level signal to the AND circuit 253 responding to that a potential of the dummy bit line XDBL1 becomes lower than the predetermined threshold value voltage. The inverter 252 inputs the dummy bit line XDBL2 and outputs the H level signal to the AND circuit 253 responding to that a potential of the dummy bit line XDBL2 becomes lower than the predetermined threshold value voltage. The AND circuit 253 inputs output signals of the inverters 251, 252 and activates and outputs the self-timing signal SLF by obtaining AND of two output signals.

Operations of the timing control circuit 222 will be explained below with reference to FIG. 28. When the predetermined word line WL in the memory cell array MCA is selected and the dummy word line DWL is also selected thereby, potentials of the dummy bit lines XDBL1, XDBL2 are lowered to the L level from the precharge level (H level) with the dummy memory cells SDMC11 to 14, SDMC21 to 24.

Here, difference depending on displacement between impurity diffusing layer and gate polysilicon layer lies, as explained above, among driving capability for the dummy bit line SDBL1 of the dummy memory cells SDMC11 to 14 including the ordinary layout unit 231 and that for the dummy bit line SDBL2 of the dummy memory cells SDMC21 to 24 including the symmetrical layout unit 232 and thereby difference is generated in the displacement between lowering rate of potentials of the dummy bit lines XDGL1, XDGL2.

Figure 28:
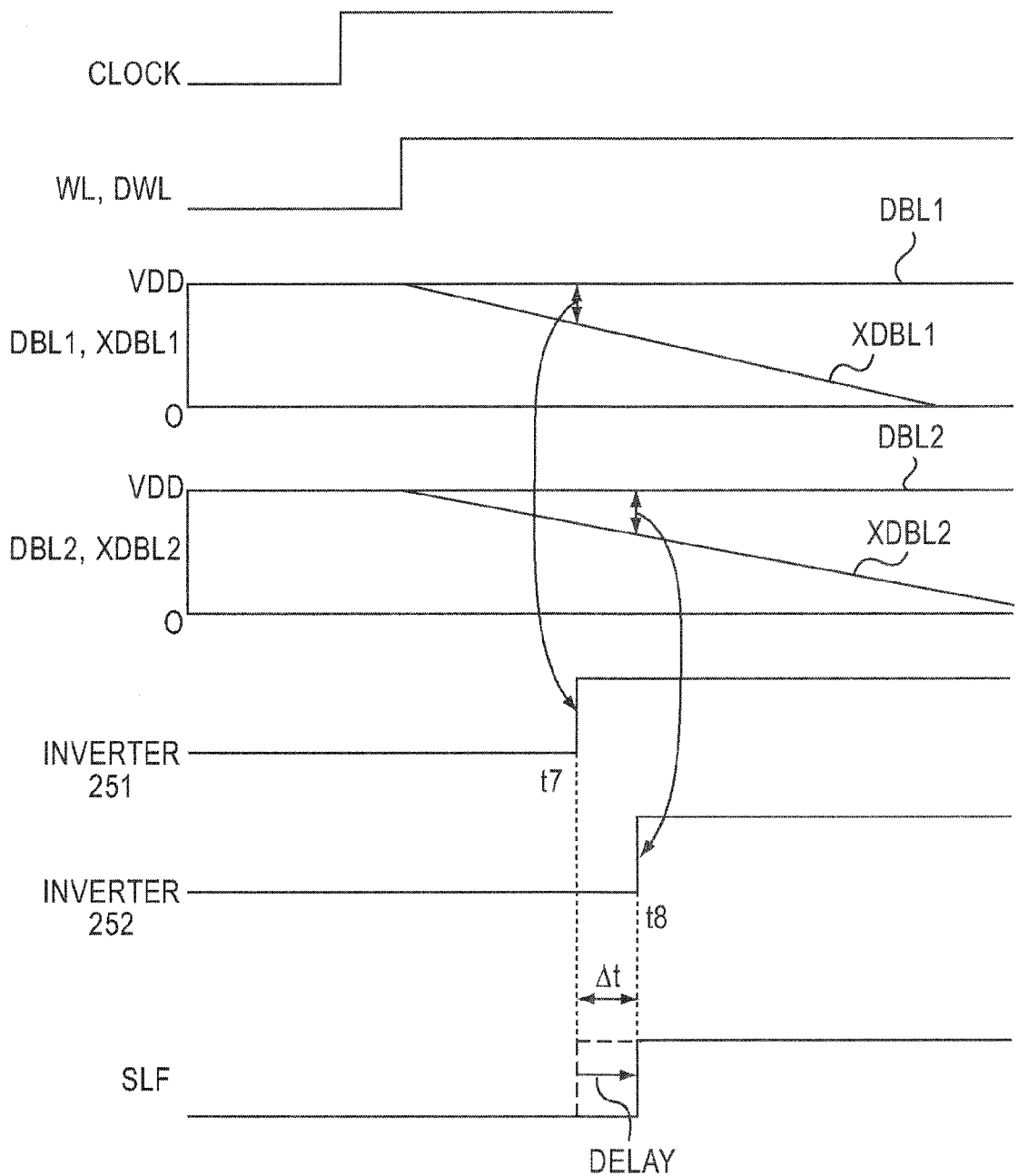
FIG. 28 is a diagram for explaining operations of the timing control circuit of the eleventh embodiment.

FIG. 28 illustrates an example where the driving capability of the dummy memory cells SDMC11 to 14 including the ordinary layout unit 231 becomes larger than that of the dummy memory cells SDMC21 to 24 including the symmetrical layout unit 232 and a lowering rate of potential of the dummy bit line XDBL1 becomes higher than that of the dummy bit line XDBL2. Therefore, the timing t7 to set an output signal of the inverter 251 to the H level becomes earlier only for the period Δt depending on displacement than the timing t8 to set an output signal of the inverter 252 to the H level.

The AND circuit 253 obtains AND of the output signals of the inverters 251, 252 and outputs the self-timing signal SLF. Therefore, activation timing of the self-timing signal SLF is determined with the timing after the timings t7 and t8. In FIG. 28, the self-timing signal SLF is activated and outputted at the timing t8.

Accordingly, activation timing of the self-timing signal SLF is determined, in the timing control circuit 222, on the basis of potential of the dummy bit line driven with the dummy memory cells having the driving capability lowered depending on the displacement among the dummy memory cells SDMC11 to 14 including the ordinary layout unit 231 and the dummy memory cells SDMC21 to 24 including the symmetrical layout unit 232. In the timing control circuit 222, activation timing of the self-timing signal SLF is adjusted in accordance with driving capability of the memory cell including the layout unit having the driving capability lowered depending on displacement between impurity diffusing layer and gate polysilicon layer.

Figure 5:
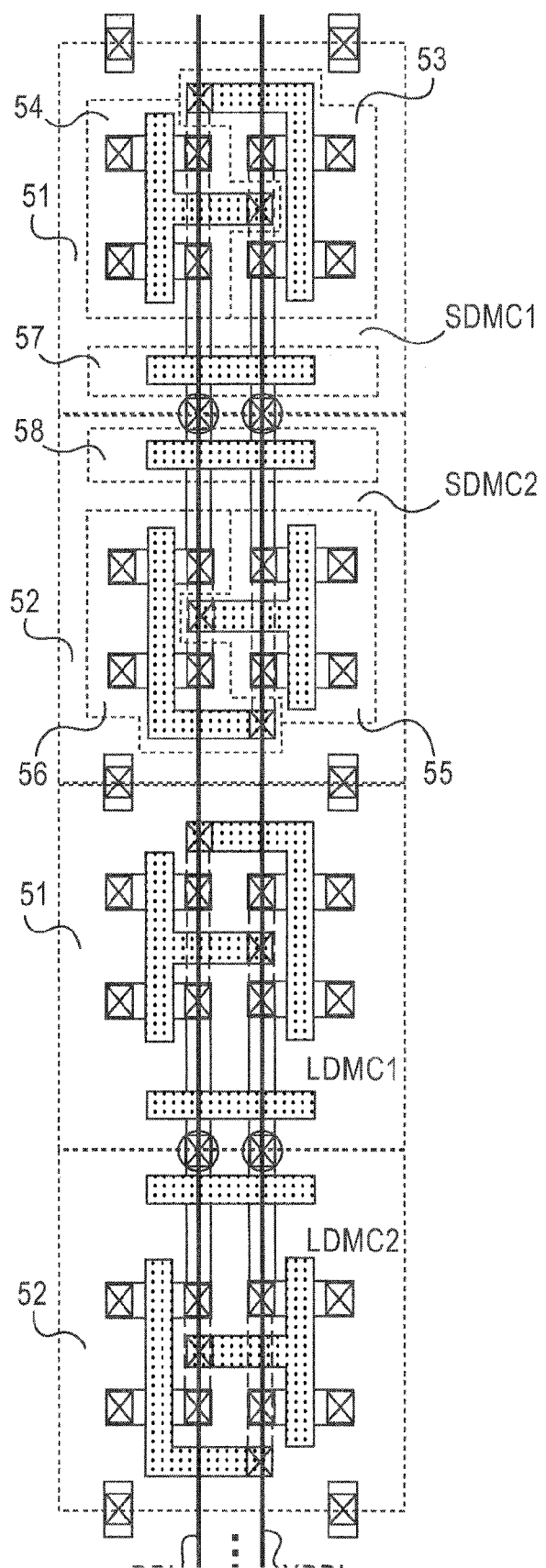
FIG. 5 is a diagram showing a layout example of dummy memory cells in the existing self-timing circuit.

Meanwhile, the memory cells MC in the memory cell array MCA have the layout that the ordinary layout unit 231 and the symmetrical layout unit 232 are alternately arranged along the bit line pair BL, XBL as in the case of the layout of the dummy memory cells SDMC, LDMC of FIG. 5. Therefore, when positional displacement occurs, the memory cells including the layout unit having smaller driving capability and the memory cells including the layout unit having larger driving capability among the ordinary layout unit 231 and symmetrical layout unit 232 coexist in the memory cells MC.

When the memory cell MC selected at the time of read operation includes the layout unit having smaller driving capability, the timing to generate the predetermined potential difference in the bit line pair BL, XBL is delayed more than the timing when the selected memory cell MC includes the layout unit having larger driving capability. The timing to generate the predetermined potential difference in the bit line pair BL, XBL changes depending on that the memory cell MC selected at the time of read operation includes the layout unit having smaller driving capability or the layout unit having larger driving capability.

Here, as explained above, the timing control circuit 222 adjusts activation timing of the self-timing signal SLF in accordance with driving capability of the memory cell including the layout unit having smaller driving capability depending on the displacement between the impurity diffusing layer and gate polysilicon layer.

Therefore, even when positional displacement occurs between the impurity diffusing layer and gate polysilicon layer occurs and the memory cells MC selected at the time of read operation include the layout unit having smaller driving capability, activation timing of the self-timing signal is adjusted adequately in accordance with the displacement. Accordingly, activation timing of the self-timing signal can surely be delayed from the timing to generate the predetermined potential difference in the bit line pair BL, XBL of the selected memory cells.

Thus, since activation timing of the sense amplifier drive signal SA can be property adjusted in accordance with positional displacement even when such displacement occurs between impurity diffusing layer and gate polysilicon layer due to a reason such as fluctuation in the manufacturing process in the eleventh embodiment of the present invention, it can be prevented that activation timing of the sense amplifier drive signal SA becomes earlier than the timing to generate the predetermined potential difference in the bit line pair BL, XBL of the ordinary memory cell MC and erroneous read of the stored data occurs.

As explained above, two pairs of dummy bit line pair DBL, XDBL are provided and the dummy bit line XDBL of each pair generates the self-timing signal SLF in the eleventh embodiment. However, the present invention is not restricted thereto and it is also possible to provide three pairs of more of the dummy bit line pair DBL, XDBL and to generate the self-timing signal SLF from the dummy bit line XDBL of each pair.

In this case, for example, a plurality of dummy bit line pairs are grouped into two groups. In the first group, the dummy memory cells are provided in the layout pattern similar to that of the fist dummy bit line pair DBL1, XDBL1. In the second group, the dummy memory cells are provided in the layout pattern similar to that of the second dummy bit line pair DBL2, XDBL2. Thereafter, the timing control circuit is formed to shift the self-timing signal SLF to the H level on the basis of the potential of the dummy bit line XDBL having the smallest lowering rate among the potentials of the dummy bit lines belonging to the first and second groups.

Next, a twelfth embodiment of the present invention will be explained with reference to FIG. 29. A circuit configuration of the twelfth embodiment of the present invention is different from the circuit configuration of the eleventh embodiment of FIG. 23 in the point that the self-timing circuit 221 is replaced with a self-timing circuit 271. The other configuration is similar and therefore it is not explained here.

Figure 29:
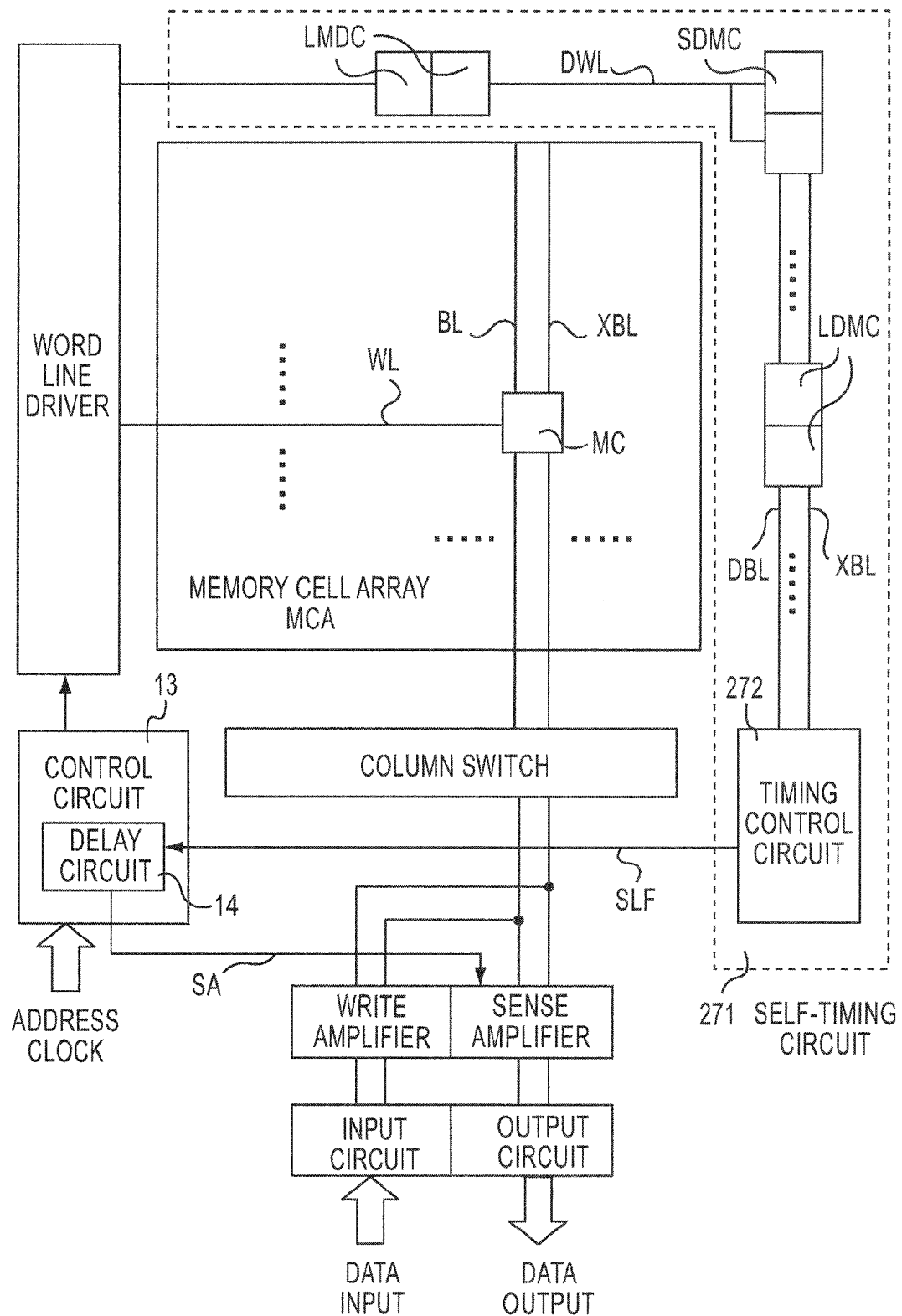
FIG. 29 is a diagram for explaining a twelfth embodiment.

The self-timing circuit 271 of FIG. 29 includes the dummy bit line pair DBL, XDBL connected with at least one dummy memory cell for self-timing SDMC and a plurality of dummy memory cells for load LDMC. As the dummy memory cell for self-timing SDMC, a plurality of dummy memory cells, for example, are designated sequentially from the furthest position of the timing control circuit 272 on the dummy bit line. The dummy bit line pair DBL, XDBL are connected to the timing control circuit-272 as the dummy bit lines of detection object.

The timing control circuit 272 inputs the dummy bit lines DBL, XDBL and outputs the self-timing signal on the basis of detection result of the potentials of the dummy bit lines DBL, XDBL. The circuit configuration of the timing control circuit 272 is similar to that of the timing control circuit 222 of FIG. 27, except for the point that the inverters 251, 252 input the dummy bit lines DBL, XDBL in place of the dummy bit lines XDBL1, XDBL2. Therefore, the circuit configuration of the timing control circuit 272 is not explained here.

Figure 30:
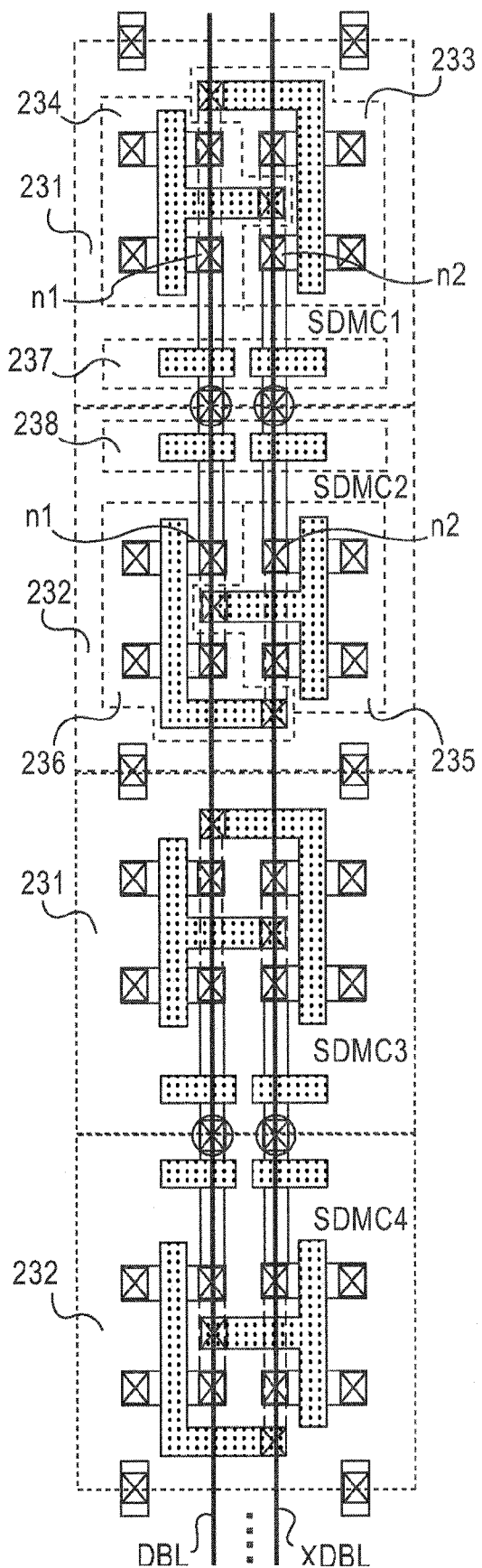
FIG. 30 is a diagram showing a layout example of the dummy memory cell of dummy bit line pair in the self-timing circuit of the twelfth embodiment.

FIG. 30 illustrates an example of layout of the dummy memory cells SDMC, LDMC in the dummy bit line pair DBL, XDBL of the self-timing circuit 271. As illustrated in FIG. 30, each dummy memory cell SDMC, LDMC is provided in the layout wherein a part formed of the inverter pair and the transfer transistor pair is defined as one unit.

Like the layout example of the dummy memory cell of FIG. 5, the dummy memory cell of FIG. 30 has the layout wherein the ordinary layout unit 231 formed of the inverters 233, 234 and transfer transistor pair 237 and the symmetrical layout unit 232 formed of the inverters 235, 236 and transfer transistor pair 238 are alternately arranged along the dummy bit line pair DBL, XDBL.

In each dummy memory cell for self-timing SDMC1 to 4, the gate electrodes of two transistors forming the transfer transistor pair 237, 238 are electrically separated, unlike the layout example of the dummy memory cell of FIG. 5.

In the transfer transistor pair 237 of the dummy memory cells for self-timing SDMC1, 3, a gate of the transfer transistor connected to the output node of the inverter 234 in the side of dummy bit line DBL is connected to the common dummy word line DWL not illustrated and a gate of the transfer transistor connected to the output node n2 of the inverter 233 in the side of dummy bit line XDBL is connected to the ground VSS.

The data stored in the dummy memory cells for self-timing SCMC1, 3 are set to set the connecting node n1 of the inverter pair to the L level and to set the connecting node n2 to the H level. Therefore, in the dummy memory cells for self-timing SDMC1, 3, the dummy bit line DBL is lowered to the L level from the precharge level (H level) with the inverter 234 in the side of dummy bit line DBL when the dummy word line DWL is selected.

In the transfer transistor pair 284 of the dummy memory cells for self-timing SDMC2, 4, a gate of transfer transistor connected to the output node n1 of the inverter 236 in the side of dummy bit line DBL is connected to the ground VSS, while a gate of the transfer transistor connected to the output node n2 of the inverter 235 in the side of dummy bit line XDBL is connected to the common dummy word line DWL not illustrated.

The data stored in the dummy memory cells for self-timing SDMC2, 4 is set to set the connecting node n1 of the inverter pair to the H level, while the connecting node n2 to the L level. Accordingly, in the dummy memory cells for self-timing SDMC2, 4, the dummy bit line XDBL is lowered to the L level from the precharge level (H level) with the inverter 235 in the side of the dummy bit line XDBL when the dummy word line DWL is selected.

As explained above, connecting patterns for connecting the separated gate electrodes of the transfer transistor pair 237, 238 to the common dummy word line DWL or to the ground VSS are set to be opposed with each other in the dummy memory cells for self-timing SDMC provided adjacent to the dummy bit line. Namely, the connecting patterns are set to be opposed with each other in the dummy memory cell for self-timing SDMC including the ordinary layout unit 231 and the dummy memory cell for self-timing SDMC including the symmetrical layout unit 232.

Thereby, the dummy bit line DBL is driven only with the dummy memory cells for self-timing SDMC1, 3 including the ordinary layout unit, while the dummy bit line XDBL only with the dummy memory cells for self-timing SDMC2, 4 including the symmetrical layout unit 232.

Figure 31:
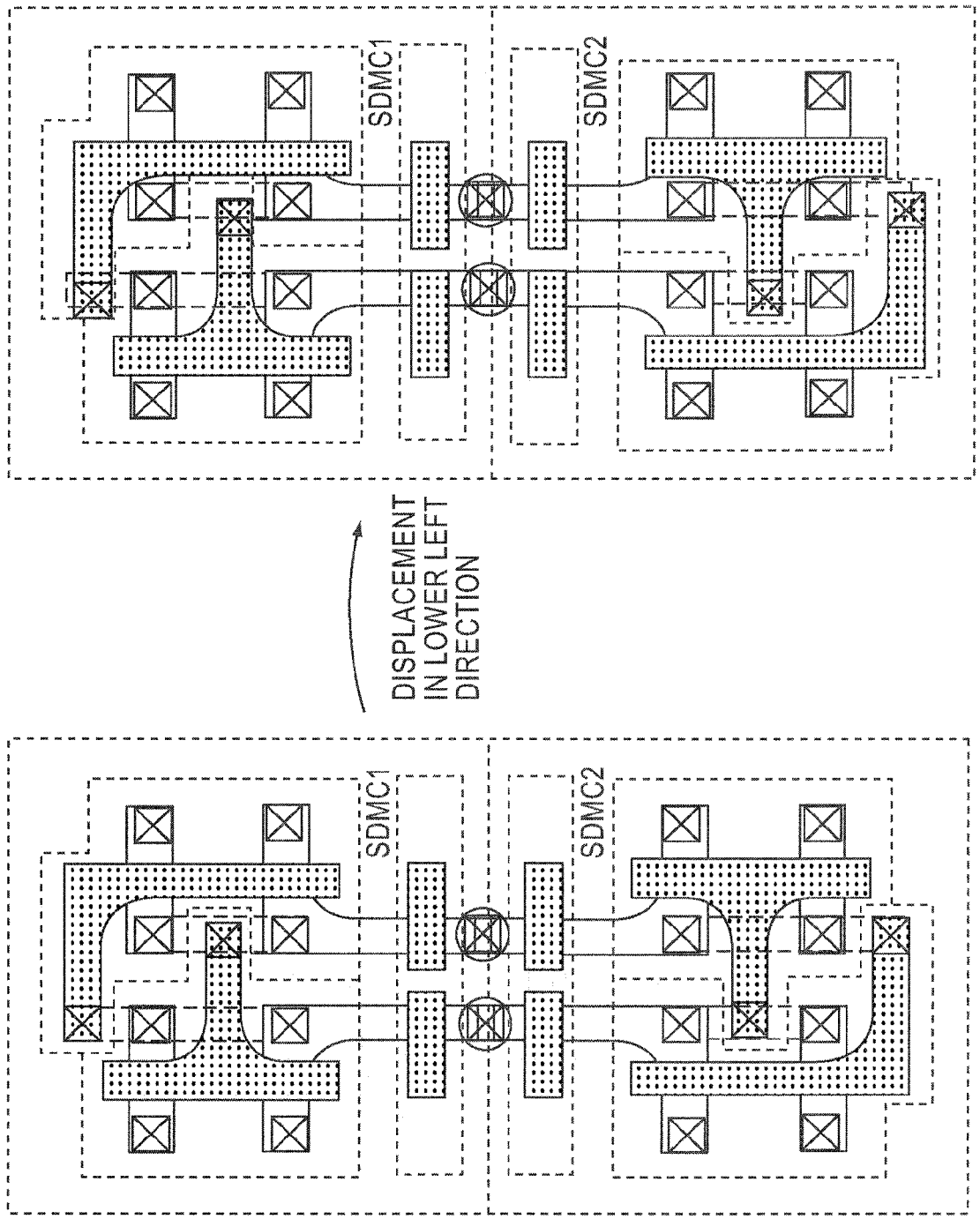
FIG. 31 is a diagram showing a layout when the gate polysilicon layer is deviated as a whole in the lower left direction for the impurity diffusing layer in the layout example of the twelfth embodiment.

Here, if positional displacement occurs between impurity diffusing layer and gate polysilicon layer as explained above (refer to FIG. 31), difference is generated in accordance with displacement between driving capability of the dummy memory cell SDMC including the ordinary layout unit 231 and driving capability of the dummy memory cell SDMC including the symmetrical layout unit 232.

Therefore, difference depending on displacement is also generated between driving capabilities for the dummy bit line DBL and dummy bit line XDBL. Accordingly, difference depending on displacement is also generated, like the dummy bit lines XDBL1, XDBL2 of FIG. 28, between lowering rates of potential of the dummy bit lines DBL, XDBL.

Accordingly, like the timing control circuit 222 of FIG. 27, activation timing of the self-timing signal SLF is determined, in the timing control circuit 272, on the basis of a potential of the dummy bit line driven with the dummy memory cell having the driving capability which is lowered in accordance with displacement among the dummy memory cells. SDMC1, 3 including the ordinary layout unit 231 and the dummy memory cells SDMC2, 4 including the symmetrical layout unit 232.

Thereby, the timing control circuit 272 can adjust activation timing of the self-timing signal SLF in accordance with the driving capability of memory cell including the layout unit having the driving capability lowered in accordance with displacement between impurity diffusing layer and gate polysilicon layer.

Therefore, since activation timing of the self-timing signal can be adjusted property in accordance with positional displacement even when such displacement occurs between impurity diffusing layer and gate polysilicon layer and the memory cell MC selected at the time of read operation has the layout unit having smaller driving capability, activation timing of the sense amplifier drive signal SA can surely be delayed from the timing to generate the predetermined potential difference in the bit line pair BL, XBL of the selected memory cell.

Accordingly, even when displacement occurs between impurity diffusing layer and gate polysilicon layer in the twelfth embodiment of the present invention, it can be prevented that activation timing of the sense amplifier drive signal SA becomes earlier than the timing to generate the predetermined potential difference in the bit line pair BL, XBL of the ordinary memory cell MC and erroneous read of stored data occurs.

The self-timing signal SLF is generated from a dummy bit line pair DBL, XDBL in the twelfth embodiment explained above. However, the present invention is not restricted to this configuration and it is also possible to provide a configuration to provide a plurality of dummy bit line pairs DBL, XDBL and to generate the self-timing signal SLF on the basis of the potential of the dummy bit line having smallest lowering rate of potential among all dummy bit lines DBL, XDBL.

Moreover, in the eleventh and twelfth embodiments explained above, setting pattern of the data stored in a plurality of dummy memory cells for load LDMC connected to each dummy bit line can be determined freely. For example, setting pattern of the data stored in a plurality of dummy memory cells for load LDMC can be determined to be opposed to the setting pattern of the dummy memory cell for self-timing SDMC like the setting pattern f FIG. 3. Otherwise, the data stored in each dummy memory cell for load LDMC may be set uncertainly by maintaining the connecting nodes n1, n2 of the inverter pair of each dummy memory cell for load LDMC in the floating state.

Moreover, the layout example of the ordinary layout unit and symmetrical layout unit of the memory cell is not restricted to that illustrated in FIG. 24 in the eleventh and twelfth embodiments explained above, and it is enough to adequately use the desired layout having the point symmetrical or line symmetrical relationship.

Furthermore, each embodiment explained above explains an example wherein the self-timing signal is generated with the timing control circuit including the dummy memory cell and the sense amplifier drive signal is generated with the self-timing signal. However, the present invention is not restricted thereto and the other timing signals, for example, the bit line equalizing signal, equalizing signal of the sense amplifier and output enable signal of the output signal can also be generated.

In above embodiment, the SRAM has been explained but the present invention is not restricted thereto and it is of course possible to apply the present invention to the other semiconductor memory such as DRAM and FeRAM, or the like.

INDUSTRIAL APPLICABILITY OF UTILIZATION

As explained above, the present invention can be effectively applied to a semiconductor memory including a self-timing circuit as the circuit for generating the sense amplifier drive signal to drive a sense amplifier circuit. Particularly, the present invention can be applied suitably to a semiconductor memory which is required to surely prevent erroneous read of data stored in the ordinary memory cell MC and to provide sufficient read margin without relation to various factors for varying device characteristics such as temperature change and fluctuation in manufacturing process.

What is claimed is:

1. A semiconductor memory comprising:
   a plurality of word lines;
   a plurality of bit lines;
   memory cell array including a plurality of memory cells allocated at the intersecting positions of a plurality of said word lines and a plurality of said bit lines; and
   a self-timing circuit allocated at the area near said memory cell array to generate the self-timing signal to determine operation timing of an internal circuit when data is read from said memory cell,
   wherein said self-timing circuit further comprising,
   dummy word lines selected responding to selection of said word lines,
   a first dummy memory cell for self-timing connected to said dummy word lines to set the stored data to a first state and a first dummy bit line including dummy memory cell for load set to the non-selected state to set the stored data to a second state opposing to the first state, a second dummy memory cell for self-timing connected to said dummy word lines to set the stored data to a third state and a second dummy bit line including a second dummy memory cell for load set to the non-selected state to set the stored data to a fourth state identical to said third state, and
   a timing control circuit for inputting said first dummy bit lines and said second dummy bit lines and outputting said self-timing signal with delay only for the period corresponding to a changing rate of potentials of said first and second dummy bit lines.

2. The semiconductor memory according to claim 1, wherein each of said memory cells and dummy memory cells include an inverter pair cross-connected to the other input node at one output node thereof and a transfer transistor pair for connecting a first connecting node of said inverter pair to said dummy bit line and connecting a second connecting node of said inverter pair to the complementary dummy bit lines for said dummy bit lines.

3. The semiconductor memory according to claim 2, wherein said first dummy memory cell for self-timing is fixed at said first connecting node thereof to a first voltage level and also fixed at said second connecting node thereof to a second voltage level higher than said first voltage level,
   said first dummy memory cell for load is fixed at said first connecting node thereof to said second voltage level and also fixed at said second connecting node thereof to said first voltage level, and
   said second dummy memory cell for self-timing and said second dummy memory cell for load are fixed at said first connecting node thereof to said first voltage level and also fixed at said second connecting node thereof to said second voltage level.

4. The semiconductor memory according to claim 1, wherein said timing control circuit includes
   a delay control signal generating unit for inputting said first dummy bit lines and said second dummy bit lines to output the delay control signal including activation period corresponding to difference in changing rate of potential between said first and second dummy bit lines, a delay control unit for inputting said first dummy bit lines and said delay control signal to output potential of said first dummy bit line with delay only for the period corresponding to said activation period of said delay control signal, and a self-timing signal generating unit for inputting an output signal of said delay control unit to generate said self-timing signal on the basis of potential change in an output signal of said delay control unit.

5. The semiconductor memory according to claim 4, wherein said delay control unit includes a transfer switch circuit to separate said first dummy bit lines from an input node of said self-timing signal generating unit only for the period corresponding to said activation period of said delay control signal.

6. The semiconductor memory according to claim 4, wherein said delay control unit includes an additional capacitance connected to the input node of said self-timing signal generating unit only for the period corresponding to said activation period of said delay control signal.

7. The semiconductor memory according to claim 1, wherein said delay control unit comprising:

a delay control signal generating unit for inputting said first dummy bit lines and said second dummy bit lines and outputting the delay control signal including activation period corresponding to difference in changing rate of potential between said first and second dummy bit lines;

a first self-timing signal generating unit for inputting said first dummy bit lines to generate said self-timing signal on the basis of potential change of said first dummy bit lines;

a transfer switch circuit for inputting an output signal of said first self-timing signal generating unit and said delay control signal to separate an output node of said first self-timing signal generating unit from an output node of said self-timing circuit only for the period corresponding to said activation period of said delay control signal and connect the output node of said first self-timing signal generating unit to the output node of said self-timing circuit for the period other than said activation period; and a second self-timing signal generating unit for inputting said first dummy bit line to generate said self-timing signal on the basis of potential change of said first dummy bit lines and to output said generated self-timing signal to the output node of said self-timing circuit.

8. The semiconductor memory according to claim 1, wherein said first dummy bit lines are driven only with said first dummy memory cell for self-timing when said dummy word lines are selected, and said second dummy bit lines are driven with said second dummy memory cell for self-timing when said dummy word lines are selected and with the off leak current of said second dummy memory cell for load.

9. The semiconductor memory according to claim 1, wherein the period for delaying said self-timing signal with said timing control circuit changes corresponding to amount of the off leak current of said memory cell.

10. The semiconductor memory according to claim 1, wherein a sense amplifier circuit detects potential outputted to said bit lines when said memory cell is read and activation timing of the sense amplifier drive signal for driving said sense amplifier circuit is determined on the basis of said self-timing signal.

11. A semiconductor memory comprising:
a plurality of word lines;
a plurality of bit line pairs;
a memory cell array including a plurality of memory cells allocated at the intersecting positions of a plurality of said word lines and a plurality of said bit lines; and a self-timing circuit allocated at the area near said memory cell array to generate the self-timing signal for determining operation timing of an internal circuit when said memory cell is read, wherein said self-timing circuit is comprising, dummy word lines selected responding to selection of said word lines, dummy bit line pair including a first dummy memory cell for self-timing to set the stored data connected to said dummy word lines to a first state and a dummy memory cell for load to set the stored data in the non-selected state to a second state opposed to the first state, and a timing control circuit for inputting said dummy bit line pair and outputting said self-timing signal on the basis of potential change of the other dummy bit line of said dummy bit line pair with delay only for the period corresponding to a potential of one dummy bit line of said dummy bit line pair.

12. The semiconductor memory according to claim 11, wherein said one dummy bit line is driven only with the off leak current of said dummy memory cell for load and said the other dummy bit line is driven with said dummy memory cell for self-timing.

13. The semiconductor memory according to claim 11, wherein each of said memory cells and dummy memory cells includes a pair of inverters cross-connected with the other input node at one output node and a pair of transfer transistor connected with said the other dummy bit line at a first connecting node of said inverter pair and a pair of transfer transistor connected with said one dummy bit line at a second connecting node of said inverter pair.

14. The semiconductor memory according to claim 13, wherein said dummy memory cell for self-timing is fixed to a first voltage level at said first connecting node and to a second voltage higher than said first volt-age level at said second connecting node and said dummy memory cell for load is fixed to said second voltage level at said first connecting node and to said first voltage level at said second connecting node.

15. The semiconductor memory according to claim 11, wherein said timing control circuit comprising:

a delay control unit for inputting said dummy bit line pair and outputting a potential of said the other dummy bit line only for the period corresponding to the potential of said one dummy bit line; and a self-timing signal generating unit for generating said self-timing signal on the basis of potential change of output signal of said delay control unit.

16. The semiconductor memory according to claim 15, wherein said delay control unit comprises at least one transfer gate including a transistor inputting a potential of said one dummy bit line at the gate thereof and amount of delay is controlled on the basis of an ON resistance value of said transistor.

17. The semiconductor memory according to claim 11, wherein said timing control circuit comprising at least one inverter including a transistor inputting a potential of said dummy bit line at the gate thereof and amount of delay is controlled by controlling driving capability of said inverter on the basis of ON resistance value of said transistor.

18. The semiconductor memory according to claim 11, wherein said timing control circuit comprising:

a delay control signal generating unit for inputting said one dummy bit line and outputting the delay control signal having the level corresponding to a potential of said one dummy bit line by amplifying potential change of said one dummy bit line;

a delay control unit for inputting said the other dummy bit line and said delay control signal and outputting the potential of said the other dummy bit line with delay only for the period corresponding to said level of said delay control signal; and a self-timing signal generating unit for inputting an output signal of said delay control unit to generate said self-timing signal on the basis of potential change of the output signal of said delay control unit.

19. The semiconductor memory according to claim 18, characterized in that said delay control unit includes at leas one transistor gate including a transistor inputting said delay control signal at the gate thereof and amount of delay is controlled on the basis of ON resistance value of said transistor.

20. The semiconductor memory according to claim 18, wherein said delay control signal generating unit includes a transistor inputting a potential of said one dummy bit line at the gate thereof and outputs said delay control signal from the source or drain of said transistor.

21. The semiconductor memory according to claim 15, wherein said delay control unit includes at least one transistor connecting between the input node of said self-timing signal generating means and the power supply voltage and inputting a potential of said one dummy bit line to the gate thereof and amount of delay is controlled on the basis of ON resistance value of said transistor.

22. The semiconductor memory according to claim 11, wherein period for delaying said self-timing signal with said timing control circuit changes depending on amount of the off leak current of said memory cell.

23. The semiconductor memory according to claim 11, wherein a sense amplifier circuit detects the potential outputted to said bit line when said memory cell is read and activation timing of the sense amplifier drive signal for driving said sense amplifier circuit is determined on the basis of said self-timing signal.

24. A semiconductor memory comprising;
a plurality of word lines:
a plurality of bit lines:
a memory cell array including a plurality of memory cells allocated at the intersecting positions of a plurality of said word lines and a plurality of said bit lines; and
a self-timing circuit allocated at the area near said memory cellar ray to generate the self-timing signal to determine operation timing of an internal circuit when said memory cell is read,
wherein said self-timing circuit further comprising,
a dummy word line selected responding to selection of said word lines,
a first dummy bit line including a dummy memory cell for self-timing connected to said dummy word lines to be driven with said dummy memory cell for self-timing when said dummy word line is selected,
a second dummy bit line including dummy memory cell for load in the non- selected state to be driven only with said dummy memory cell for load when said dummy word line is selected, and
a timing control circuit for inputting said first and second dummy bit lines and outputting said self-timing signal on the basis of potential change of said first dummy bit line with delay only for the period corresponding to a potential of said second dummy bit line.

25. A semiconductor memory comprising;
a plurality of word lines:
a plurality of bit lines:
a memory cell array including a plurality of memory cells allocated at the intersecting positions of a plurality of said word lines and a plurality of said bit lines: and a self-timing circuit allocated at the area near said memory cell array to generate the self-timing signal to determine operation timing of an internal circuit when said memory cell is read,
wherein said self-timing circuit includes
a dummy word line selected responding to selection of said word lines,
a first dummy bit line connected to said dummy word line to continuously allocate a plurality of first dummy memory cells for self-timing formed of an ordinary layout unit,
a second dummy bit line connected to said dummy word line to continuously allocate a plurality of second dummy memory cells for self-timing formed of a symmetrical layout unit which is point symmetrical or line symmetrical to said ordinary layout unit, and
a timing control circuit for inputting said first and second dummy bit lines and outputting said self-timing signal on the basis of potential change of the dummy bit line of lower changing rate of potential among said first and second dummy bit lines.

26. The semiconductor memory according to claim 25, wherein said memory cells in said memory cell array have the layout that said ordinary layout unit and said symmetrical layout unit are alternately allocated along said bit lines.

27. The semiconductor memory according to claim 24, wherein a sense amplifier circuit detects potential outputted to said bit lines when said memory cell is read and activation timing of the sense amplifier drive signal to drive said sense amplifier circuit is determined on the basis of said self-timing signal.

28. A semiconductor memory comprising:
a plurality of word lines;
a plurality of bit lines;
a memory cell array including a plurality of memory cells allocated at the intersecting positions of a plurality of said word lines and a plurality of said bit lines; and
a self-timing circuit allocated at the area near said memory cell array to generate the self-timing signal to determine operation timing of an internal circuit when said memory cell is read,
wherein said self-timing circuit further comprises
a dummy word line selected responding to selection of said word lines,
a dummy bit line pair including a first dummy memory cell for self-timing formed of an ordinary layout unit and a second dummy memory cell for self-timing formed of a symmetrical layout unit having the point symmetrical or line symmetrical relationship with said ordinary layout unit, and
a timing control circuit for inputting said dummy bit line pair and outputting said self-timing signal on the basis of potential change of the dummy bit line of lower changing rate of potential among said dummy bit line pair, and moreover
each of said first and second dummy memory cells for self-timing is provided with
a pair of inverters cross-connected with the other input node at one output node, and
a pair of transfer transistors connected with one dummy bit line of said dummy bit line pair at the first connecting node of said inverter pair and connected with the other dummy bit line at the second connecting node of said inverter pair,
wherein the gates of said transfer transistor pair are electrically separated with each other.

29. The semiconductor memory according to claim 28, wherein the gate in the side of said one dummy bit line among the separated gates of said transfer transistor pair of said first dummy memory cell for self-timing is connected to said dummy word line, and the gate in the side of said the other dummy bit line among the separated gates of said transfer transistor pair of said second dummy memory cell for self-timing is connected to said dummy word line.

30. The semiconductor memory according to claim 29, wherein said first connecting node in said first dummy memory cell for self-timing is fixed to a first voltage level and said second connecting node is fixed to a second voltage level higher than said first voltage level, and said first connecting node in said second dummy memory cell for self-timing is fixed to said second voltage level and said second connecting node is fixed to said first voltage level.

31. The semiconductor memory according to claim 28, wherein said memory cells in said memory cell array have a layout that said ordinary layout unit and said symmetrical layout unit are alternately allocated along said bit lines.

32. The semiconductor memory according to claim 28, wherein a sense amplifier circuit detects potential outputted to said bit lines when said memory cell is read and that activation timing of the sense amplifier drive signal to drive said sense amplifier circuit is determined on the basis of said self-timing signal.

* * * * *